(12) United States Patent
Yamashita

(10) Patent No.: US 8,092,978 B2
(45) Date of Patent: Jan. 10, 2012

(54) POSITIVE RESIST COMPOSITION FOR ELECTRON BEAM, X-RAY OR EUV AND PATTERN FORMING METHOD USING THE SAME

(75) Inventor: Katsuhiro Yamashita, Haibara-gun (JP)

(73) Assignee: Fujifilm Corporation, Tokyo (JP)

( * ) Notice: Subject to any disclaimer, the term of this patent is extended or adjusted under 35 U.S.C. 154(b) by 199 days.

(21) Appl. No.: 12/410,881

(22) Filed: Mar. 25, 2009

(65) Prior Publication Data
US 2009/0246685 A1 Oct. 1, 2009

(30) Foreign Application Priority Data

Mar. 26, 2008 (JP) ................. 2008-082235

(51) Int. Cl.
G03F 7/00 (2006.01)
G03F 7/004 (2006.01)
G03F 7/029 (2006.01)
(52) U.S. Cl. ............... 430/270.1; 430/913; 430/914; 430/945
(58) Field of Classification Search ......... 430/270.1, 430/913, 945
See application file for complete search history.

(56) References Cited

U.S. PATENT DOCUMENTS

| | | | | |
|---|---|---|---|---|
| 7,449,573 B2 * | 11/2008 | Kodama et al. | .............. | 540/482 |
| 7,592,126 B2 * | 9/2009 | Nishiyama | .............. | 430/270.1 |
| 7,625,690 B2 * | 12/2009 | Mizutani et al. | .............. | 430/270.1 |
| 2009/0111047 A1 * | 4/2009 | Yamashita | .............. | 430/270.1 |

FOREIGN PATENT DOCUMENTS

| | | | |
|---|---|---|---|
| EP | 1703322 A2 * | 9/2006 | |
| EP | 1835342 A2 * | 9/2007 | |
| JP | 2006-078760 A | 3/2006 | |
| JP | 2007-264051 A | 10/2007 | |

* cited by examiner

*Primary Examiner* — Amanda C. Walke
(74) *Attorney, Agent, or Firm* — Sughrue Mion, PLLC

(57) ABSTRACT

Provided is a positive resist composition for an electron beam, an X-ray or EUV, including: (A) a resin capable of decomposing by the action of an acid to increase the dissolution rate in an aqueous alkali solution; (B) a compound capable of generating an acid upon irradiation with an actinic ray or radiation, represented by the following formula (ZI) or (ZII); (C) a basic compound; and (D) an organic solvent, wherein a concentration of all solid contents in said composition is from 1.0 to 4.5 mass %, and a total amount of the compound represented by formula (ZI) or (ZII) is 12 mass % or more based on all solid contents in said composition:

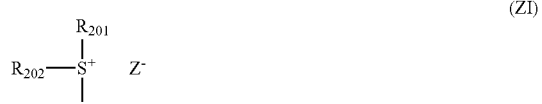

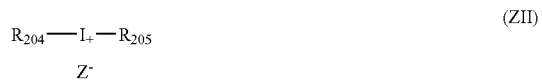

wherein symbols in the formulae are defined in the specification.

7 Claims, No Drawings

POSITIVE RESIST COMPOSITION FOR ELECTRON BEAM, X-RAY OR EUV AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes. More specifically, the present invention relates to a positive photoresist capable of forming a high-resolution pattern by using an electron beam, EUV or the like, that is, a positive resist composition suitably usable for microprocessing of a semiconductor device, where an electron beam or EUV light is used, and a pattern forming method using the composition.

2. Description of the Related Art

In the process of producing a semiconductor device such as IC and LSI, microprocessing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using an electron beam, an X ray or EUV light is proceeding.

The lithography using an electron beam or EUV light is positioned as a next-generation or next-next-generation pattern formation technique and a high-sensitivity positive resist is being demanded.

Particularly, in order to shorten the wafer processing time, the elevation of sensitivity is very important. A chemical amplification positive resist generally comprises a resin alkali-insolubilized by protecting an alkali-soluble group with an acid-decomposable group, a photo-acid generator and a basic compound. The photo-acid generator is decomposed upon exposure to generate an acid, the acid decomposes the acid-decomposable group while diffusing in the resist film, and the resin is thereby alkali-solubilized. Accordingly, as the acid generated is a stronger acid, the deprotection reaction is accelerated and higher sensitivity is brought about. However, as the acid generated is a stronger acid, the effect with aging by the acid generated is larger and the storage stability tends to be worsened. Accordingly, it is a very important problem to satisfy both high sensitivity and storage stability. Also, suppression of fluctuation of the pattern line width due to variation in the exposure amount, that is, wide exposure latitude (EL), is demanded.

JP-A-2006-78760 (the term "JP-A" as used herein means an "unexamined published Japanese patent application") discloses a resist composition having good sensitivity in a lithography process using EUV or an electron beam, where the resist composition comprises an onium salt containing an anion having a structure of N—(—SO$_2$—)$_2$, and JP-A-2007-264051 discloses a positive radiation-sensitive resin composition capable of stably forming a high-precision micropattern, where the positive radiation-sensitive resin composition comprises an onium salt containing an anion having a structure of N—(—SO$_2$—)$_2$ or C—(—SO$_2$—)$_3$.

SUMMARY OF THE INVENTION

An object of the present invention is to solve the technical problem of enhancing performance when microprocessing a semiconductor device by using an actinic ray or radiation, particularly, an electron beam, an X-ray or EUV light, and provide an effective positive resist composition satisfying both the sensitivity and the exposure latitude (EL) which are in a trade-off relationship, and ensuring high aging stability, and a pattern forming method using the composition.

(1) A positive resist composition for an electron beam, an X-ray or EUV, comprising:

(A) a resin capable of decomposing by the action of an acid to increase the dissolution rate in an aqueous alkali solution;

(B) a compound capable of generating an acid upon irradiation with an actinic ray or radiation, represented by the following formula (ZI) or (ZII);

(C) a basic compound; and (D) an organic solvent, wherein a concentration of all solid contents in said composition is from 1.0 to 4.5 mass %, and a total amount of the compound represented by formula (ZI) or (ZII) is 12 mass % or more based on all solid contents in said composition:

(ZI)

(ZII)

wherein each of $R_{201}$, $R_{202}$ and $R_{203}$ independently represents an organic group, any two members out of $R_{201}$ to $R_{203}$ may combine together to form a ring which may contain an oxygen atom, a sulfur atom, an ester bond, an amide bond, a carbonyl group or a —SO$_2$— structure, each of $R_{204}$ and $R_{205}$ independently represents an aryl group, an alkyl group or a cycloalkyl group, and $Z^-$ represents an anion represented by the following formula (Za) or (Zb):

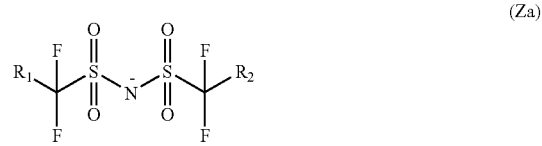

(Za)

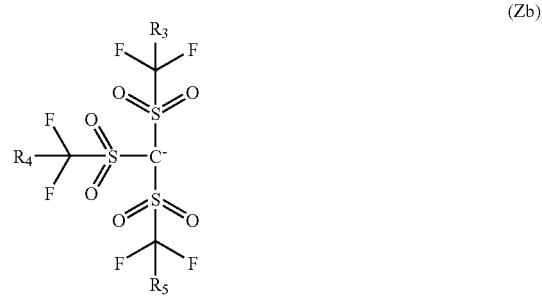

(Zb)

wherein each of $R_1$ and $R_2$ independently represents a fluorine atom or an alkyl group, and $R_1$ and $R_2$ may combine together to form a ring; and each of $R_3$ to $R_5$ independently represents a fluorine atom or an alkyl group, and any two members out of $R_3$ to $R_5$ may combine together to form a ring.

(2) The positive resist composition for an electron beam, an X-ray or EUV as described in (1), wherein the basic compound (C) has a molecular weight of from 200 to 1,000, and a content of the (C) basic compound is from 0.1 to 0.5 times molar based on a molar number of a total amount of the compound capable of generating an acid upon irradiation with an actinic ray or radiation.

(3) The positive resist composition for an electron beam, an X-ray or EUV as described in (1) or (2), wherein the resin (A) has a weight average molecular weight of from 1,500 to 5,000.

(4) The positive resist composition for an electron beam, an X-ray or EUV as described in any one of (1) to (3), wherein the resin (A) has at least one repeating unit represented by formula (V):

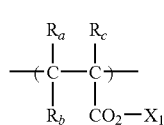

wherein each of $R_a$ to $R_c$ independently represents a hydrogen atom, a fluorine atom, a chlorine atom, a cyano group or an alkyl group, and $X_1$ represents a hydrogen atom or an organic group.

(5) A pattern forming method comprising:

forming a resist film with the positive resist composition described in any one of (1) to (4); and exposing and developing the resist film.

DETAILED DESCRIPTION OF THE INVENTION

The present invention is described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin Capable of Decomposing by the Action of an Acid to Increase the Dissolution Rate in an Alkali Developer The resin capable of decomposing by the action of an acid to increase the dissolution rate in an alkali developer (hereinafter, sometimes referred to as an "acid-decomposable resin"), used in the positive resist composition of the present invention, is a resin having a group capable of decomposing by the action of an acid (acid-decomposable group) to produce an alkali-soluble group, in the main or side chain or both the main and side chains of the resin. Of these, a resin having an acid-decomposable group in the side chain is preferred.

The acid-decomposable group is preferably a group where the hydrogen atom of an alkali-soluble group such as —COOH group and —OH group is substituted by a group capable of leaving by the action of an acid.

In the present invention, the acid-decomposable group is preferably a tertiary alkoxy group, a tertiary alkyl ester group, a tertiary cycloalkyl ester group or an acetal group.

In the case where such a group capable of decomposing by the action of an acid is bonded as a side chain, the matrix resin is an alkali-soluble resin having a —OH or —COOH group in the side chain. Examples thereof include an alkali-soluble resin described below.

The alkali dissolution rate of the alkali-soluble resin when formed into a resist film is preferably 50 Å/sec or more, more preferably 100 Å/sec or more, as measured (at 23° C.) in 0.261N tetramethylammonium hydroxide (TMAH).

The acid-decomposable resin preferably contains a repeating unit having an aromatic group and in particular, an acid-decomposable resin containing a hydroxystyrene repeating unit is preferred (hereinafter sometimes referred to as a "resin (A1)"). The acid-decomposable resin is more preferably a copolymer of hydroxystyrene/hydroxystyrene protected by an acid-decomposable group, or a copolymer of hydroxystyrene/tertiary alkyl(meth)acrylate.

Specific examples of the resin (A1) are set forth below, but the present invention is not limited thereto.

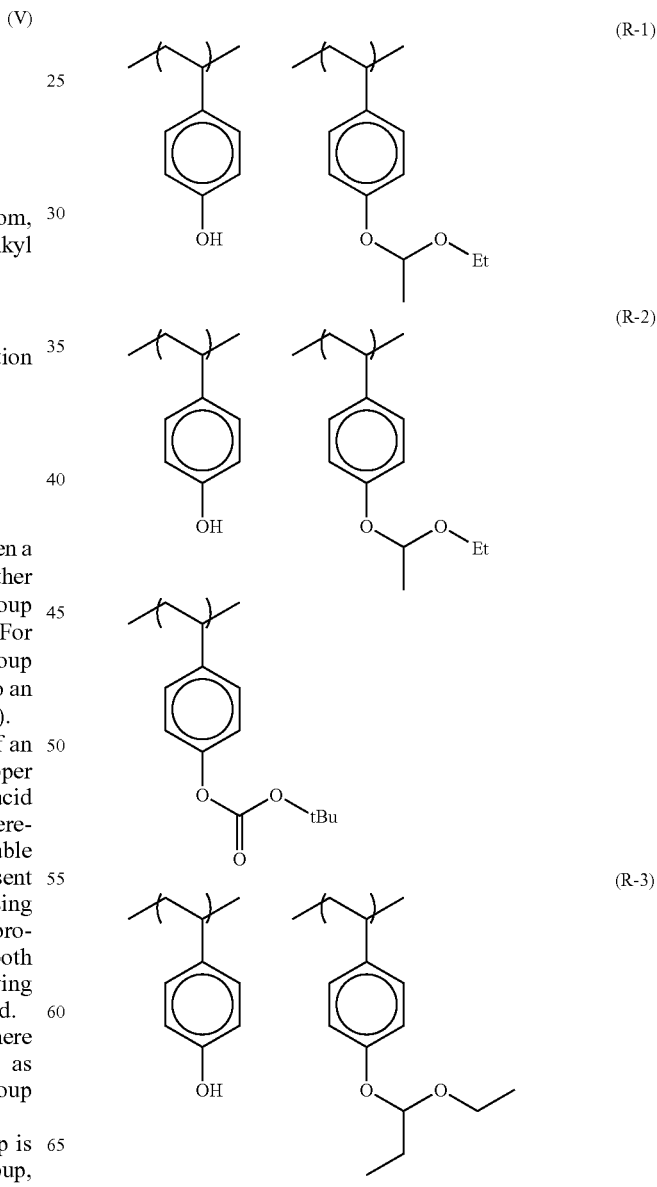

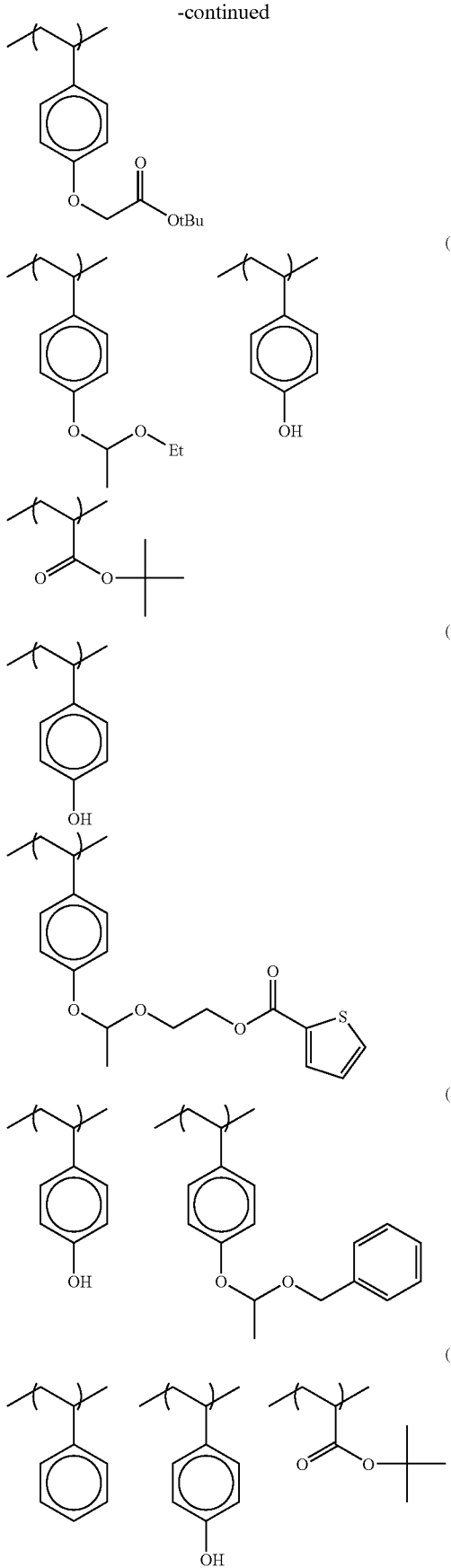
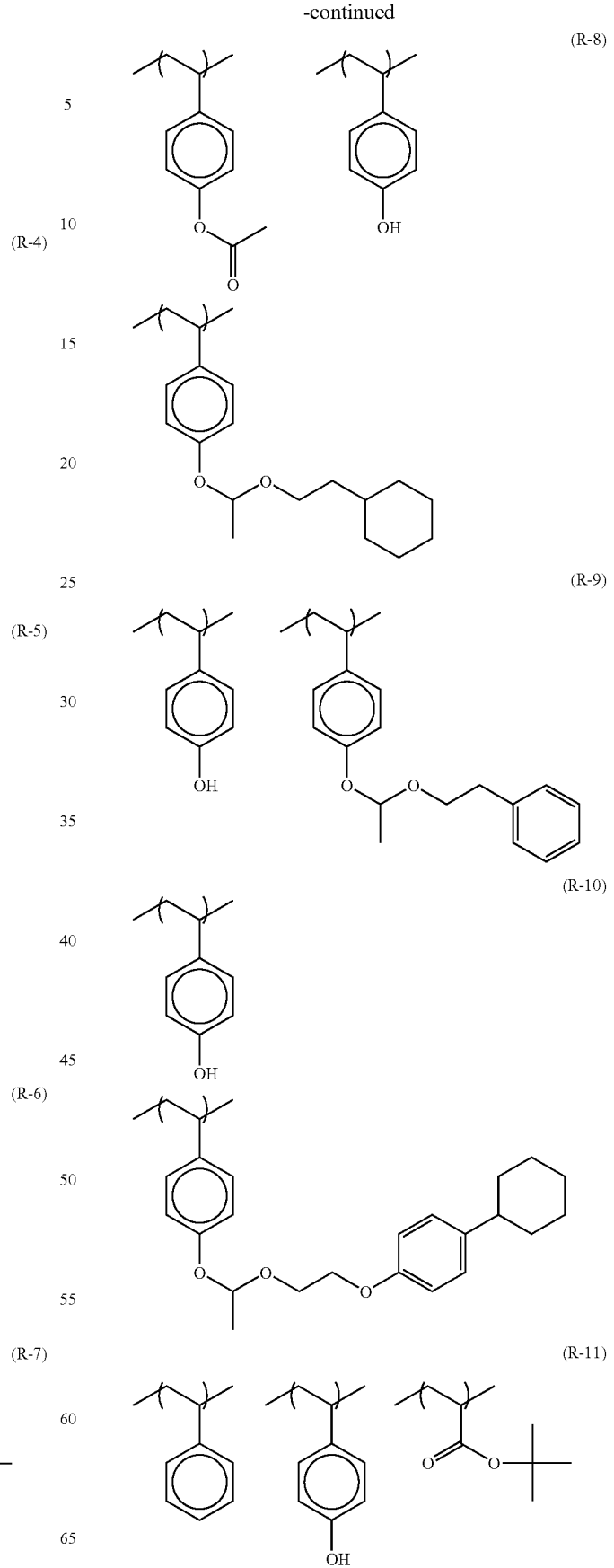

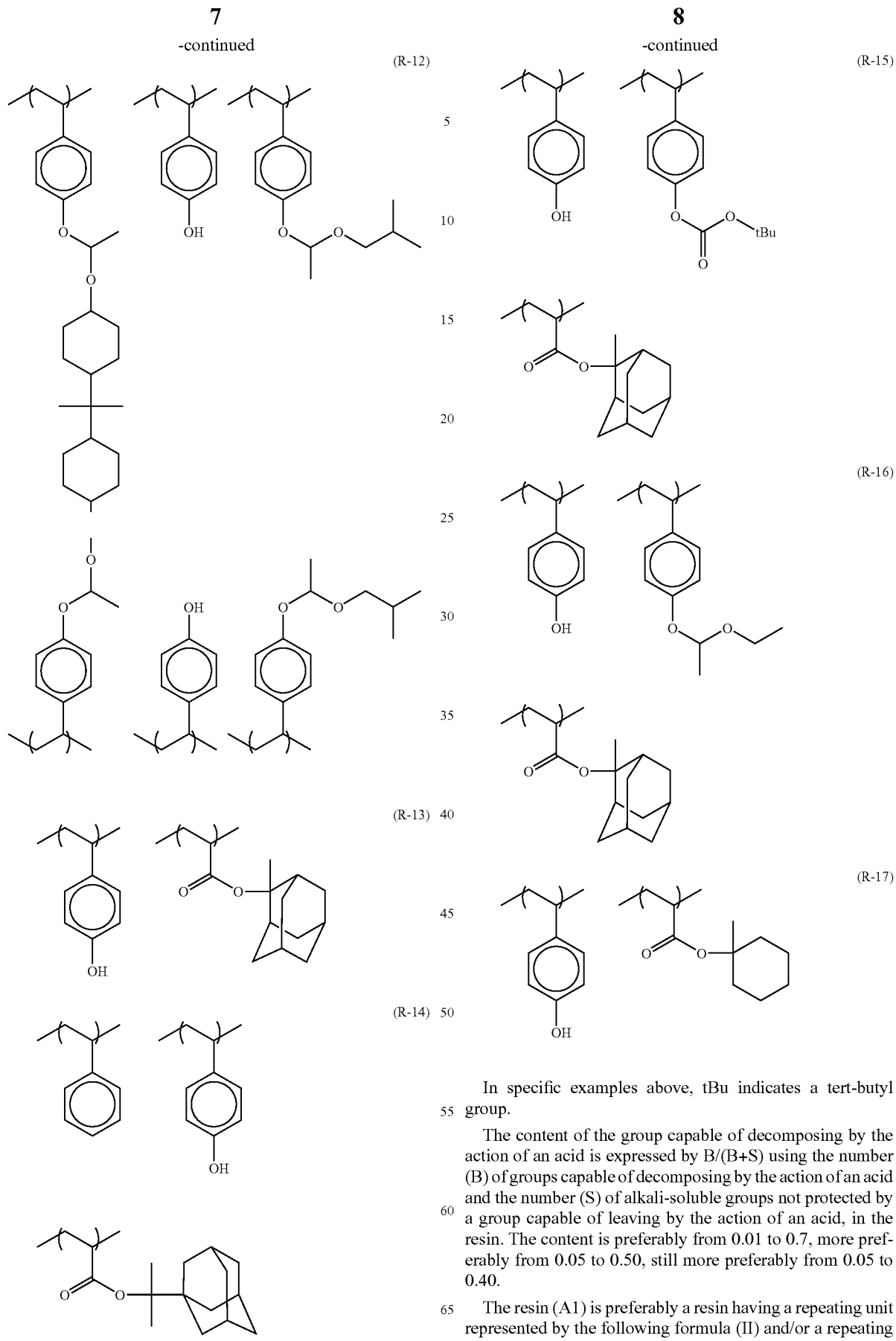

In specific examples above, tBu indicates a tert-butyl group.

The content of the group capable of decomposing by the action of an acid is expressed by B/(B+S) using the number (B) of groups capable of decomposing by the action of an acid and the number (S) of alkali-soluble groups not protected by a group capable of leaving by the action of an acid, in the resin. The content is preferably from 0.01 to 0.7, more preferably from 0.05 to 0.50, still more preferably from 0.05 to 0.40.

The resin (A1) is preferably a resin having a repeating unit represented by the following formula (II) and/or a repeating unit represented by formula (III).

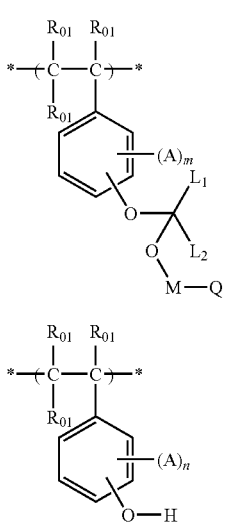

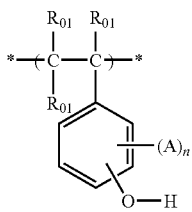

In formulae (II) and (III), each $R_{01}$ independently represents a hydrogen atom, an alkyl group, a cycloalkyl group, a halogen atom, a cyano group or an alkoxycarbonyl group.

Each of $L_1$ and $L_2$, which may be the same or different, represents a hydrogen atom, an alkyl group, a cycloalkyl group or an aralkyl group.

M represents a single bond or a divalent linking group.

Q represents an alkyl group, a cycloalkyl group, an aryloxy group or an alicyclic or aromatic ring group which may contain a heteroatom.

At least two members out of Q, M and $L_1$ may combine to form a 5- or 6-membered ring.

A represents, when a plurality of A's are present, each independently represents, a halogen atom, a cyano group, an acyl group, an alkyl group, an alkoxy group, an acyloxy group or an alkoxycarbonyl group.

Each of m and n independently represents an integer of 0 to 4, provided that m and n are preferably not 0 at the same time.

The resin (A1) may be a resin having a repeating unit represented by formula (II), a repeating unit represented by formula (III) and a repeating unit represented by formula (IV). In this case, m and n may be m=n=0.

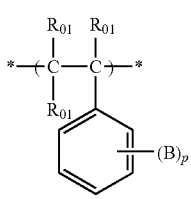

In formula (IV), each $R_{01}$ independently represents a hydrogen atom, an alkyl group, a cycloalkyl group, a halogen atom, a cyano group or an alkoxyearbonyl group.

B represents a halogen atom, a cyano group, an acyl group, an alkyl group, an alkoxy group, an acyloxy group or an alkoxycarbonyl group.

p represents an integer of 0 to 5.

The substituent on the benzene ring in the repeating unit represented by formula (II) is a group (acid-decomposable group) capable of decomposing by the action of an acid to produce a hydroxyl group (alkali-soluble group) and decomposes by the action of an acid to produce a hydroxystyrene unit and convert the resin into a resin of which solubility in an alkali developer is increased.

In formulae (II) to (IV), each $R_{01}$ independently represents a hydrogen atom, an alkyl group, a cycloalkyl group, a halogen atom, a cyano group or an alkoxycarbonyl group and preferably has a carbon number of 20 or less.

The alkyl group and cycloalkyl group in $R_{01}$ preferably have a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 8 or less. A $CF_3$ group, an alkoxycarbonylmethyl group, an alkylcarbonyloxymethyl group, a hydroxymethyl group, an alkoxymethyl group and the like are more preferred.

The halogen atom in $R_{01}$ includes a fluorine atom, a chlorine atom, a bromine atom and an iodine atom and is preferably a fluorine atom.

As for the alkyl group contained in the alkoxycarbonyl group of $R_{01}$, the same as those described above for the alkyl group of $R_{01}$ are preferred.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred example thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

Either one of $L_1$ and $L_2$ is preferably a hydrogen atom.

The divalent linking group as M is, for example, an alkylene group, a cycloalkylene group, an alkenylene group, an arylene group, —OCO—, —COO—, —CON($R_0$)— or a linking group containing a plurality of these members. $R_0$ is a hydrogen atom or an alkyl group.

The alkyl group and cycloalkyl group of Q are the same as respective groups of $L_1$ and $L_2$.

The aryloxy group of Q includes, for example, a phenoxy group, a naphthoxy group and a terphenyloxy group.

The alicyclic or aromatic ring group of Q, which may contain a heteroatom, includes, for example, the cycloalkyl group and aryl group of $L_1$ and $L_2$ and preferably has a carbon number of 3 to 15.

Examples of the heteroatom-containing alicyclic or aromatic ring group include thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heteroatom-containing alicyclic or aromatic ring group is not limited thereto as long as the ring is a structure generally called a heterocyclic ring (a ring formed by carbon and heteroatom or a ring formed by heteroatom).

As for the 5- or 6-membered ring which may be formed by combining at least two members out of Q, M and $L_1$, there is included a case where at least two members out of Q, M and $L_1$ combine to form, for example, a propylene group or a butylene group, thereby forming a 5- or 6-membered ring containing an oxygen atom.

The group represented by -M-Q preferably has a carbon number of 1 to 30, more preferably from 5 to 20, and examples of the group represented by —OC($L_1$)($L_2$)O-M-Q include, but are not limited to, the followings.

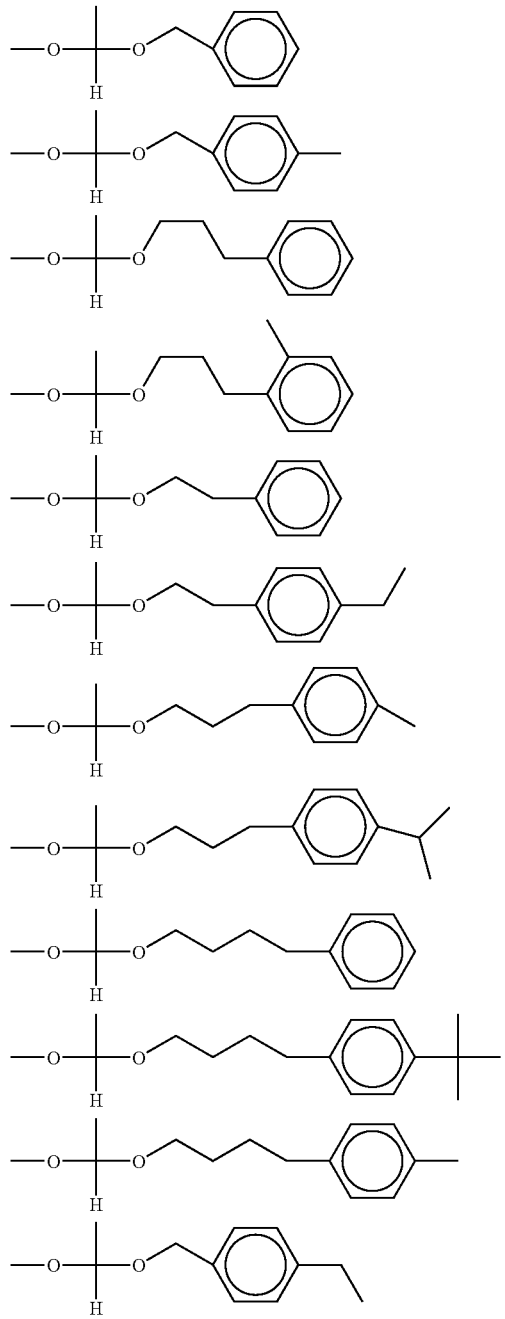

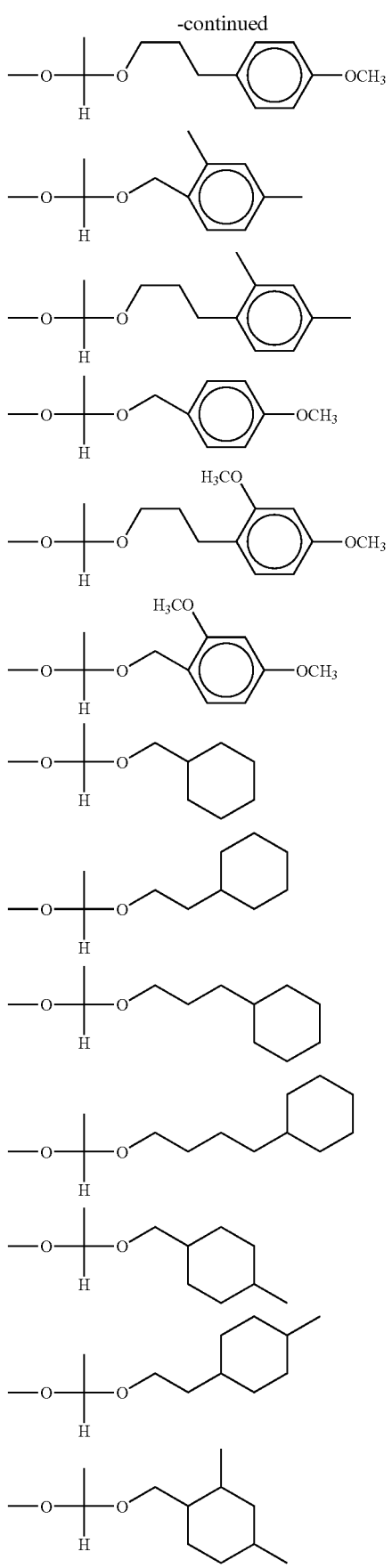

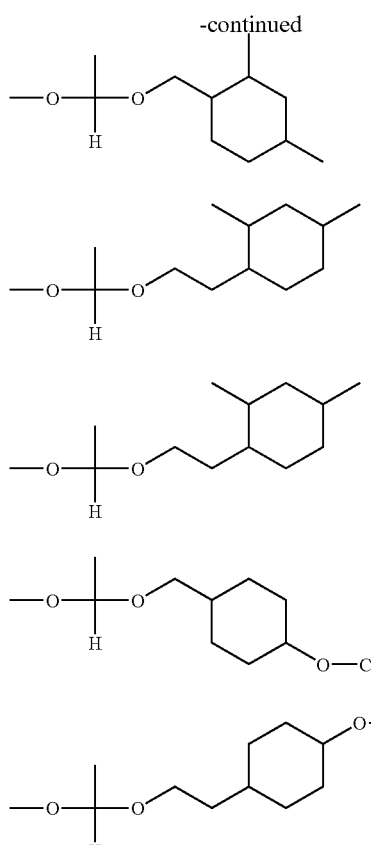

The acyl group as A is, for example, an acyl group having a carbon number of 2 to 8, and specific preferred examples thereof include a formyl group, an acetyl group, a propanoyl group, a butanoyl group, a pivaloyl group and a benzoyl group.

The alkyl group as A is, for example, an alkyl group having a carbon number of 1 to 8, and specific preferred examples thereof include a methyl group, an ethyl group, a propyl group, an n-butyl group, a sec-butyl group, a hexyl group and an octyl group.

The alkoxy group as A is, for example, the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyloxy group or alkoxycarbonyl group as A includes groups corresponding to the above-described acyl group or alkoxy group.

These groups each may have a substituent, and preferred examples of the substituent include a hydroxyl group, a carboxyl group, a cyano group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

Each of m and n independently represents an integer of 0 to 4. Each of m and n is preferably an integer of 0 to 2, more preferably 1.

Specific examples of the repeating unit represented by formula (II) are set forth below, but the present invention is not limited thereto.

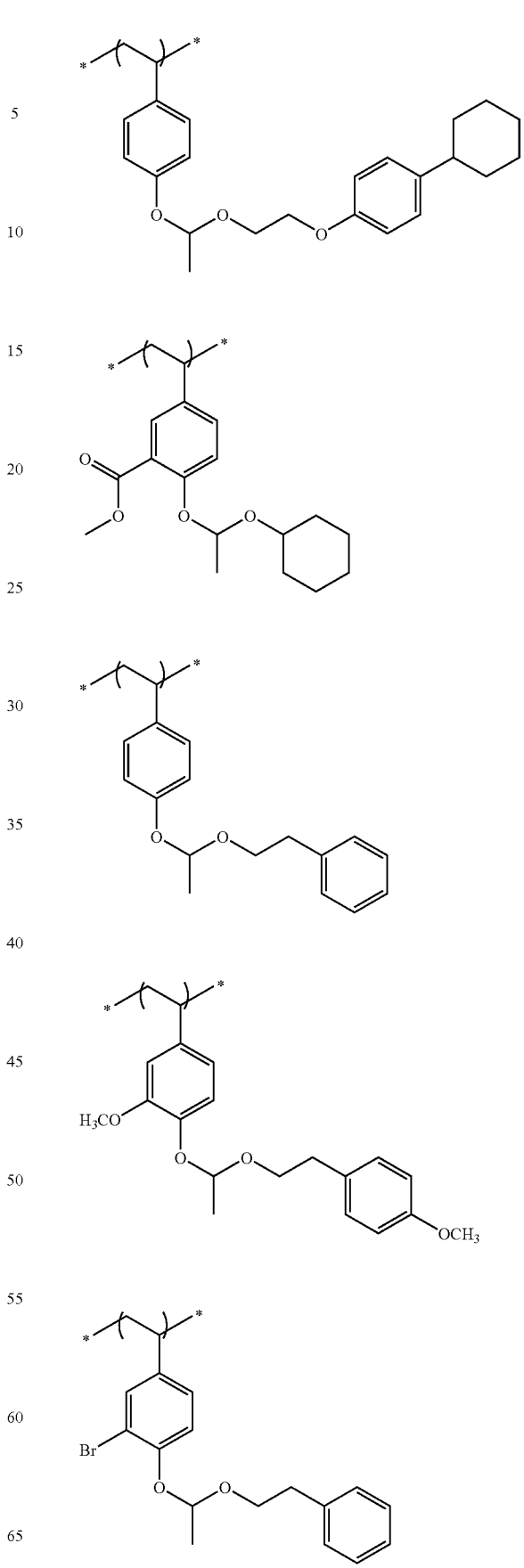

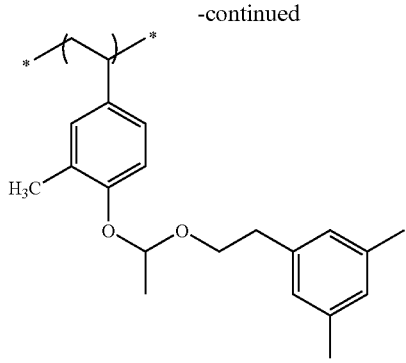
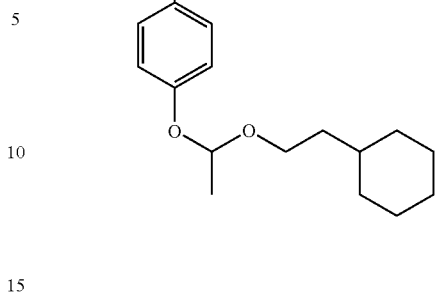
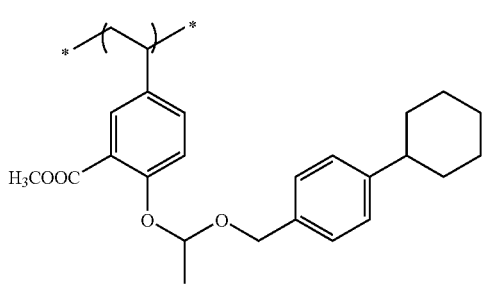
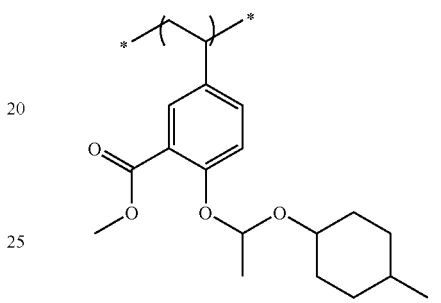
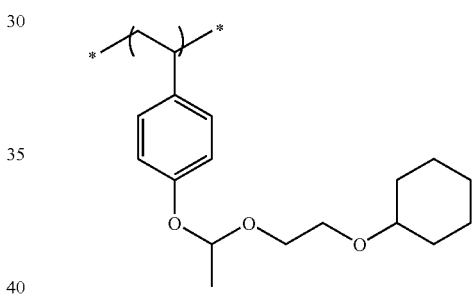
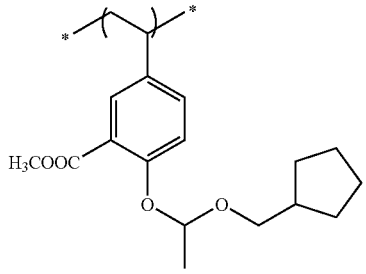
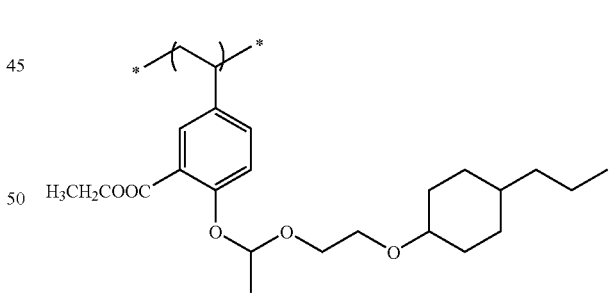
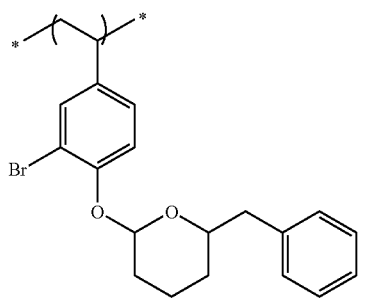
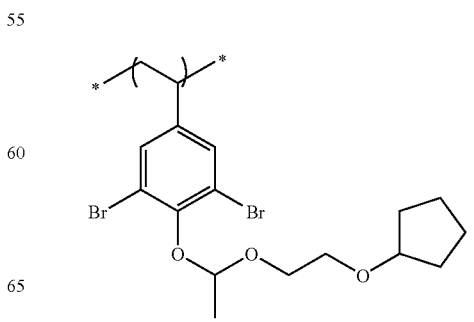

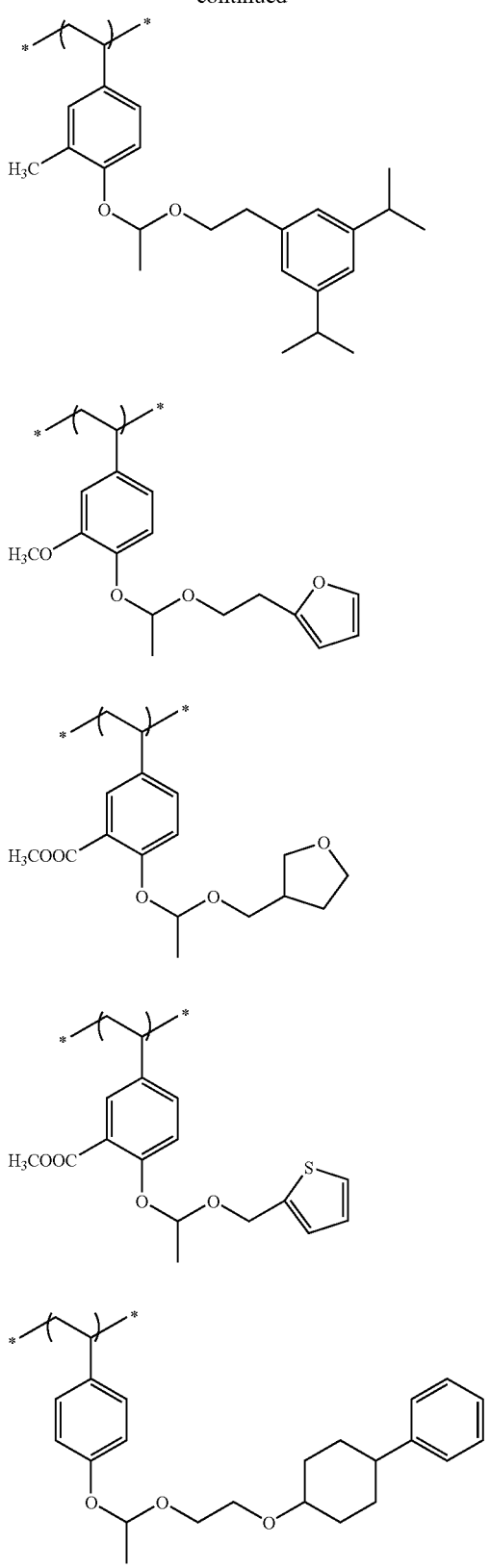

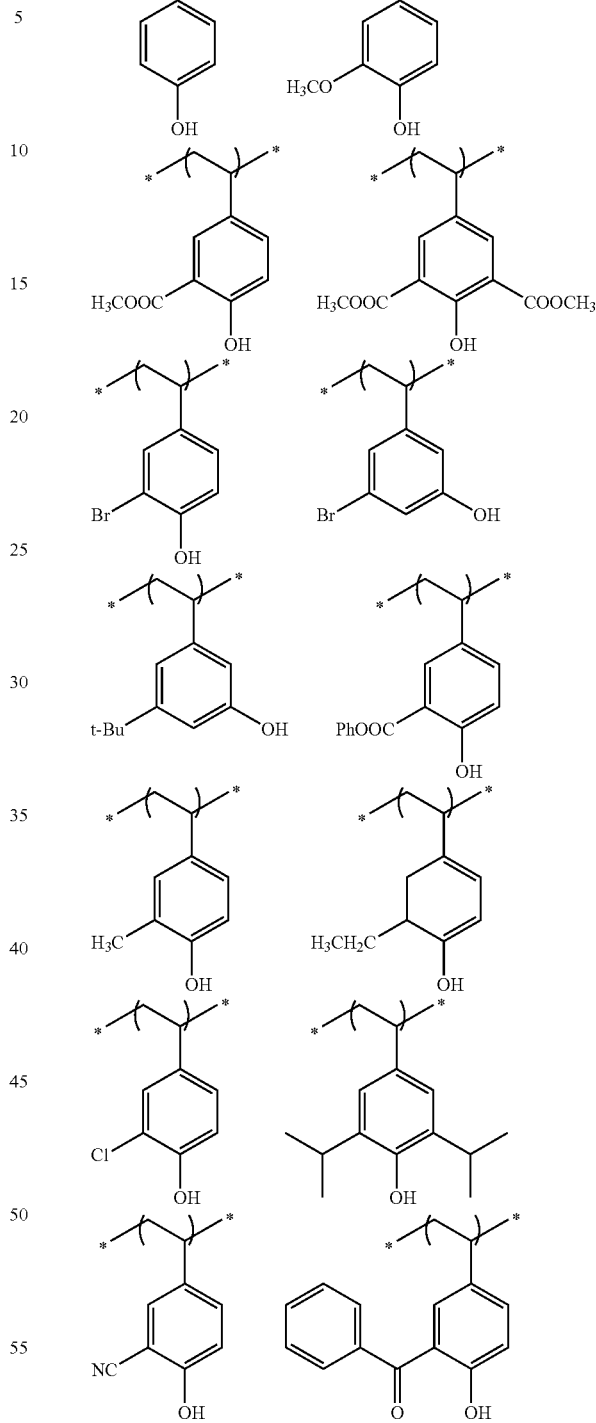

Specific examples of the repeating unit represented by formula (III) are set forth below, but the present invention is not limited thereto.

Each $R_{01}$ in formula (IV) independently represents a hydrogen atom, an alkyl group, a cycloalkyl group, a halogen atom, a cyano group or an alkoxycarbonyl group and preferably has a carbon number of 20 or less, and examples thereof are the same as those of $R_{01}$ in formula (II) or (III).

The acyl group, alkyl group, alkoxy group, acyloxy group and alkoxycarbonyl group as B in formula (IV) are the same as respective groups of A in formula (II). B is preferably an acyloxy group or an alkoxycarbonyl group, more preferably an acyloxy group. Among acyloxy groups (represented by the formula: —O—CO—RA, wherein RA is an alkyl group), an acyloxy group with RA having a carbon number of 1 to 6 is preferred, an acyloxy group with RA having a carbon number of 1 to 3 is more preferred, and an acyloxy group with RA having a carbon number of 1 (that is, an acetoxy group) is still more preferred.

p represents an integer of 0 to 5 and is preferably an integer of 0 to 2, more preferably 1 or 2, still more preferably 1.

These groups each may have a substituent, and preferred examples of the substituent include a hydroxyl group, a carboxyl group, a cyano group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

Specific examples of the repeating unit represented by formula (IV) are set forth below, but the present invention is not limited thereto.

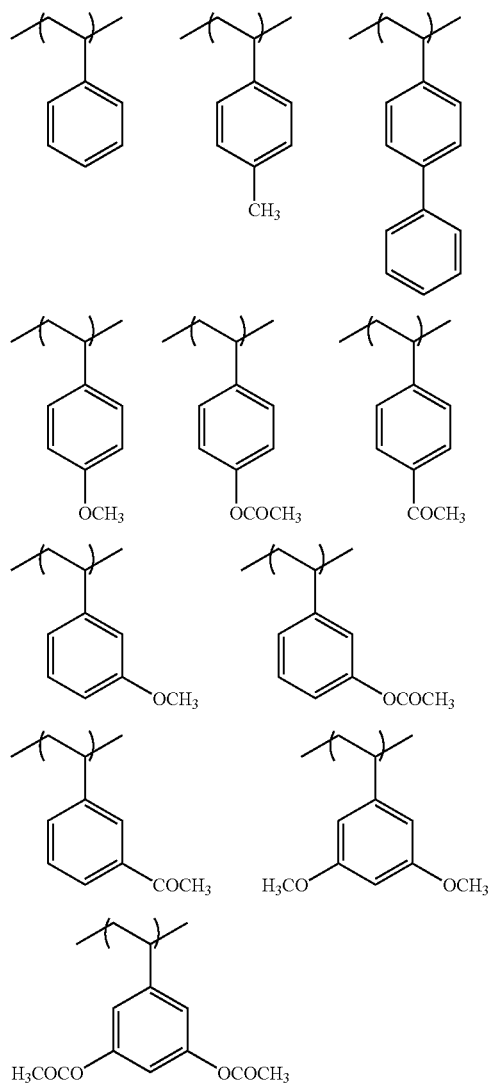

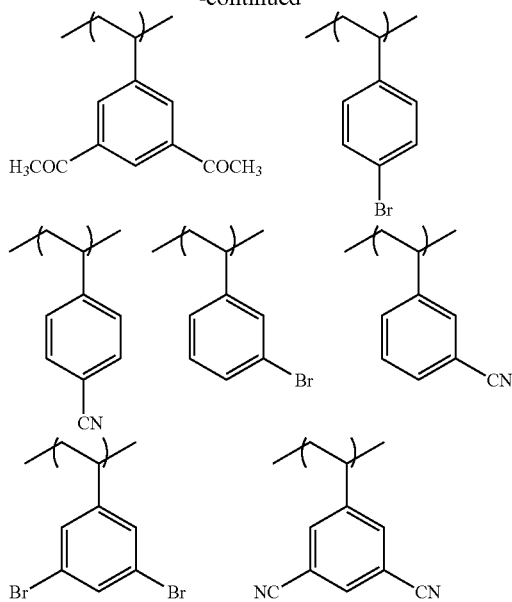

It is also one preferred embodiment that the resin (A1) contains a repeating unit represented by the following formula (V):

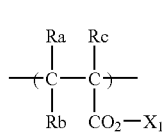

(V)

In formula (V), each of Ra to Rc independently represents a hydrogen atom, a fluorine atom, a chlorine atom, a cyano group or an alkyl group.

$X_1$ represents a hydrogen atom or an organic group.

The alkyl group as Ra to Rc in formula (V) is preferably an alkyl group having a carbon number of 1 to 5, and examples thereof include a methyl group, an ethyl group and a propyl group.

The organic group as $X_1$ preferably has a carbon number of 1 to 40 and may be an acid-decomposable group or a non-acid-decomposable group.

Examples of the organic group as a non-acid-decomposable group include an alkyl group, a cycloalkyl group, an alkenyl group, an aryl group, an alkyloxy group (excluding an —O-tertiary alkyl), an acyl group, a cycloalkyloxy group, an alkenyloxy group, an aryloxy group, an alkylcarbonyloxy group, an alkylamidomethyloxy group, an alkylamide group, an arylamidomethyl group and an arylamide group.

The non-acid-decomposable group is preferably an acyl group, an alkylcarbonyloxy group, an alkyloxy group, a cycloalkyloxy group, an aryloxy group, an alkylamideoxy group or an alkylamide group, more preferably an acyl group, an alkylcarbonyloxy group, an alkyloxy group, a cycloalkyloxy group or an aryloxy group.

In the non-acid-decomposable group, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; the aryl group is preferably an aryl group having a carbon number of 6 to 14, such as phenyl group, xylyl group, toluyl group, cumenyl group, naphthyl group and anthracenyl group; and the alkoxy group is preferably an alkoxy group having a carbon number of 1 to 4, such as methoxy group, ethoxy group, hydroxyethoxy group, propoxy group, hydroxypropoxy group, n-butoxy group, isobutoxy group and sec-butoxy group.

Examples of the organic group of $X_1$ as an acid-decomposable group include $-C(R_{11a})(R_{12a})(R_{13a})$, $-C(R_{14a})(R_{15a})(OR_{16a})$ and $-CO-OC(R_{11a})(R_{12a})(R_{13a})$.

Each of $R_{11a}$ to $R_{13a}$ independently represents an alkyl group, a cycloalkyl group, an alkenyl group, an aralkyl group or an aryl group. Each of $R_{14a}$ and $R_{15a}$ independently represents a hydrogen atom or an alkyl group. $R_{16a}$ represents an alkyl group, a cycloalkyl group, an alkenyl group, an aralkyl group or an aryl group. Two members out of $R_{11a}$, $R_{12a}$ and $R_{13a}$, or two members out of $R_{14a}$, $R_{15a}$ and $R_{16a}$ may combine to form a ring.

Incidentally, a group having an acid-decomposable group may be introduced into $X_1$ by modification. $X_1$ having introduced thereinto an acid-decomposable group is, for example, represented by the following formula:

$-[C(R_{17a})(R_{18a})]_p-CO-OC(R_{11a})(R_{12a})(R_{13a})$ wherein each of $R_{17a}$ and $R_{18a}$ independently represents a hydrogen atom or an alkyl group, and p represents an integer of 1 to 4.

The organic group of $X_1$ is preferably an acid-decomposable group having at least one cyclic structure selected from an alicyclic structure, an aromatic cyclic structure and a crosslinked alicyclic structure, and the structure is preferably a structure containing an aromatic group (particularly a phenyl group) or a structure containing an alicyclic or crosslinked alicyclic structure represented by the following formulae (pI) to (pVI). Above all, a structure containing a crosslinked alicyclic structure is preferred in view of dry etching resistance and the like.

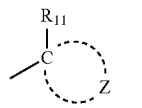

(pI)

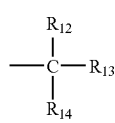

(pII)

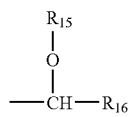

(pIII)

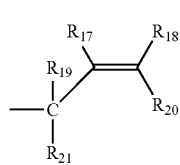

(pIV)

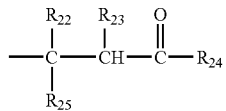

(pV)

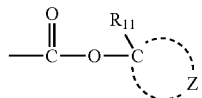

(pVI)

In formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

Each of $R_{12}$ to $R_{16}$ independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

Each of $R_{17}$ to $R_{21}$ independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

Each of $R_{22}$ to $R_{25}$ independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group, and $R_{23}$ and $R_{24}$ may combine together to form a ring.

In formulae (pI) to (pVI), the alkyl group of $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group above may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

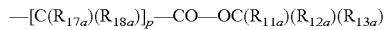

(1)

(2)

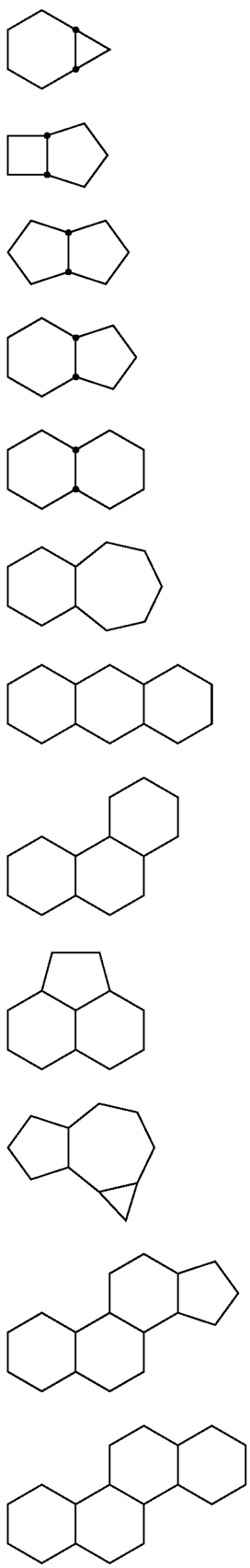
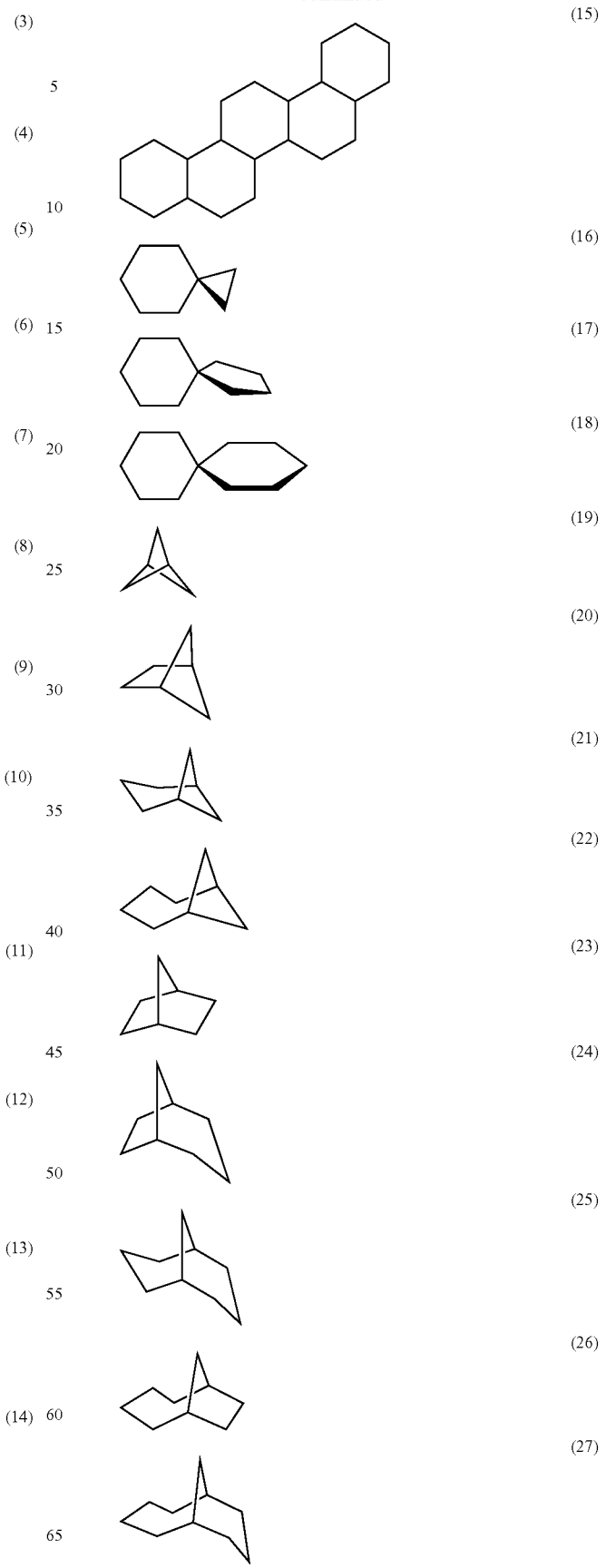

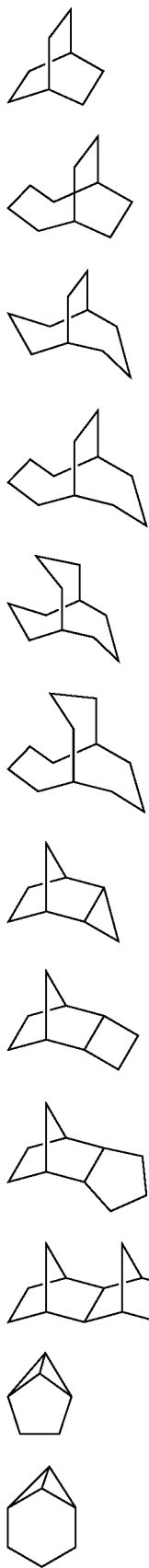
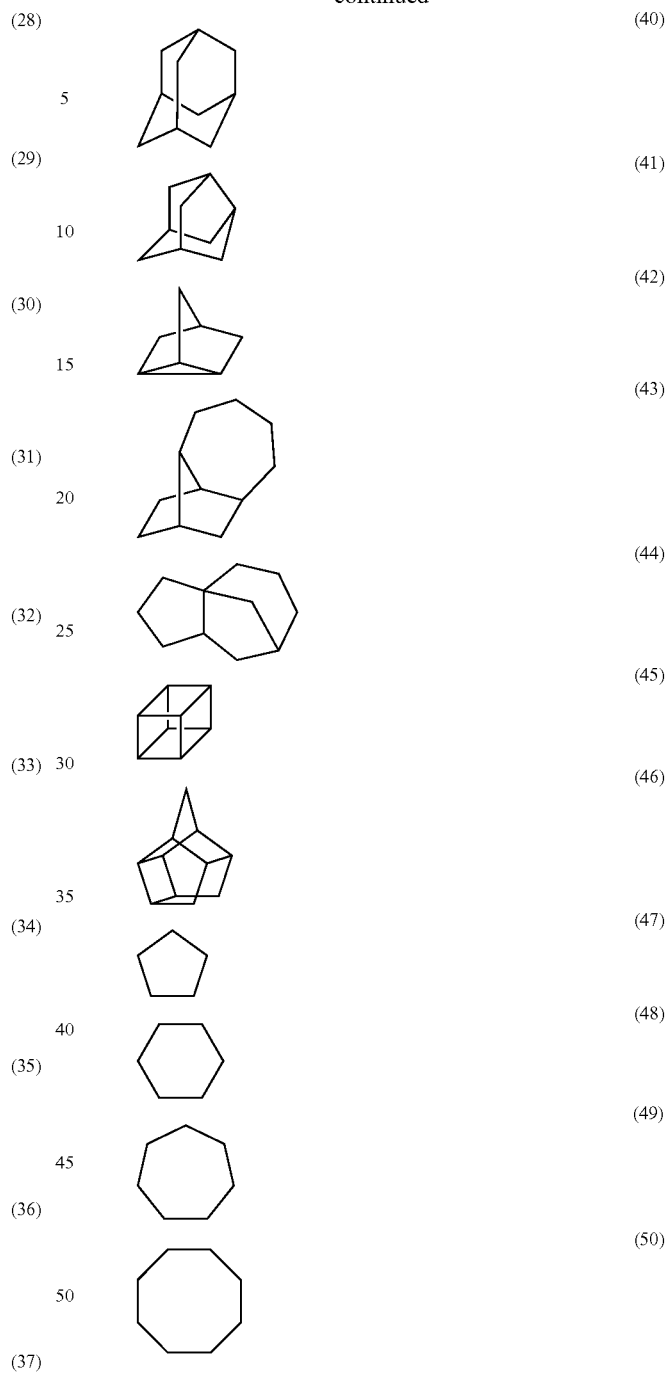

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having a carbon number of 1 to 4, such as methoxy group, ethoxy group, propoxy group and butoxy group.

The alkyl group, alkoxy group and alkoxycarbonyl group each may further have a substituent, and examples of the substituent include an alkoxy group having a carbon number of 1 to 4 (e.g., methoxy, ethoxy, butoxy), a hydroxy group, an oxo group, an alkylcarbonyl group (preferably having a carbon number of 2 to 5), an alkylcarbonyloxy group (preferably having a carbon number of 2 to 5), an alkyloxycarbonyl group (preferably having a carbon number of 2 to 5) and a halogen atom (e.g., chlorine, bromine, fluorine).

In the resin (A1), for maintaining good developability with an alkali developer, another appropriate polymerizable monomer may be copolymerized so that an alkali-soluble group such as phenolic hydroxyl group, carboxyl group, sulfonic acid group and hexafluoroisopropanol group (—C(CF$_3$)$_2$OH) can be introduced, or for enhancing the film quality, another hydrophobic polymerizable monomer such as alkyl acrylate and alkyl methacrylate may be copolymerized.

The content of the repeating unit represented by formula (II) is preferably from 5 to 60 mol %, more preferably from 10 to 50 mol %, still more preferably from 10 to 40 mol %, based on all repeating units constituting the resin.

The content of the repeating unit represented by formula (III) is preferably from 40 to 90 mol %, more preferably from 45 to 80 mol %, still more preferably from 50 to 75 mol %, based on all repeating units constituting the resin.

The content of the repeating unit represented by formula (IV) is preferably from 5 to 60 mol %, more preferably from 10 to 55 mol %, still more preferably from 10 to 50 mol %, based on all repeating units constituting the resin.

When the resin includes the repeating unit represented by formula (V), the content thereof is preferably from 10 to 80 mol %, more preferably from 15 to 70 mol %, still more preferably from 20 to 60 mol %, based on all repeating units constituting the resin.

The content of the repeating unit having an alkali-soluble group except for a hydroxyl group, such as carboxy group and sulfonic acid group, is preferably from 0 to 10 mol %, more preferably from 1 to 8 mol %, still more preferably from 2 to 6 mol %, based on all repeating units constituting the resin.

The content of the repeating unit having an acid-decomposable group is preferably from 5 to 60 mol %, more preferably from 10 to 55 mol %, still more preferably from 10 to 50 mol %, based on all repeating units constituting the resin (A1).

The resin (A1) may be synthesized by a known synthesis method described in European Patent 254853, JP-A-2-258500, JP-A-3-223860 and JP-A-4-251259, for example, a method of reacting a precursor of a group capable of decomposing by the action of an acid with an alkali-soluble resin or a method of copolymerizing a monomer having a group capable of decomposing by the action of an acid with various monomers.

The weight average molecular weight of the resin (A1) is, as a polystyrene-reduced value by the GPC method, preferably from 1,500 to 5,000, more preferably from 1,500 to 4,000, still more preferably from 1,500 to 3,000.

The polydispersity (Mw/Mn) of the resin (A1) is preferably from 1.0 to 3.0, more preferably from 1.05 to 2.0, still more preferably from 1.1 to 1.7.

As for the resin (A1), two or more kinds of resins may be used in combination.

Specific examples of the resin (A) are set forth below, but the present invention is not limited thereto.

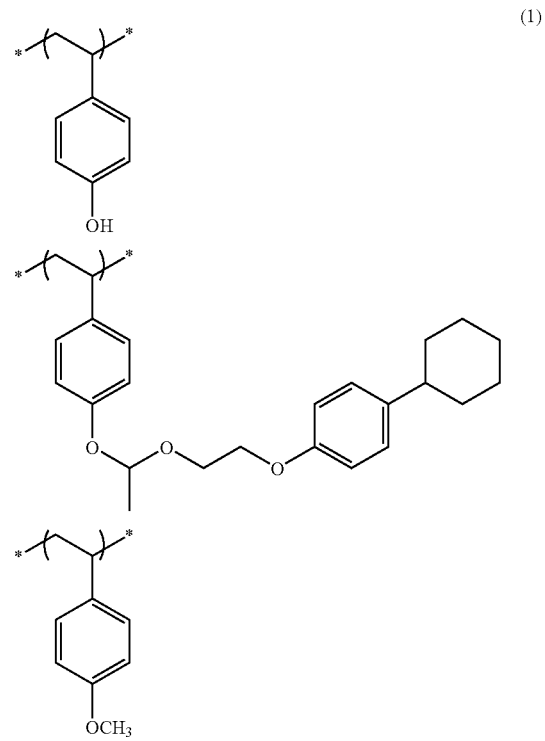

(1)

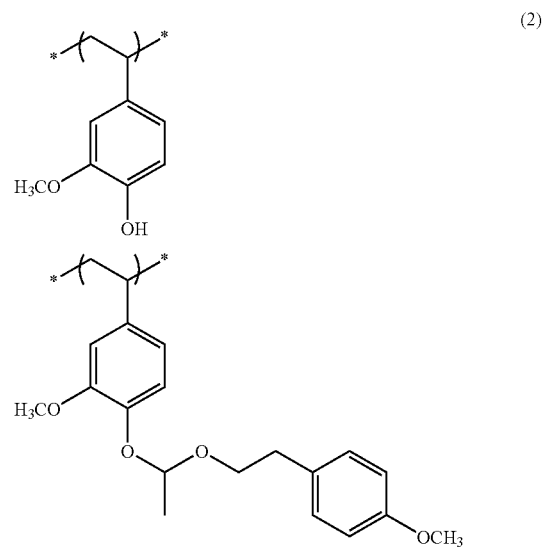

(2)

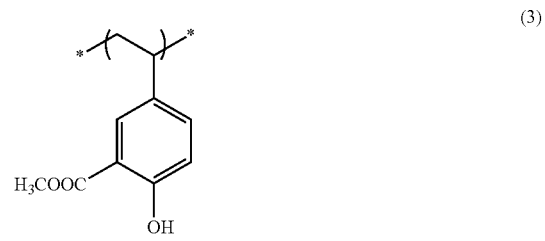

(3)

(4)

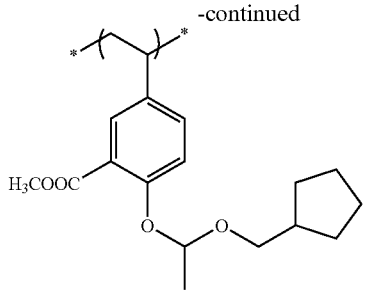

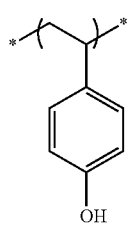

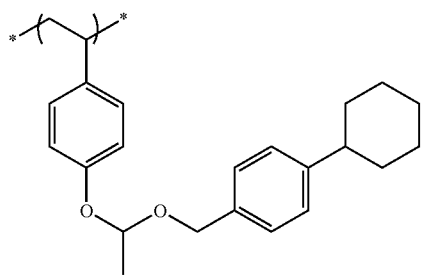

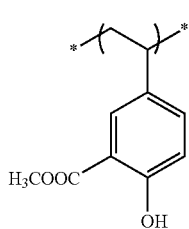

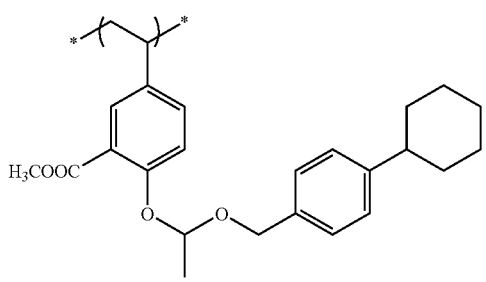

(5)

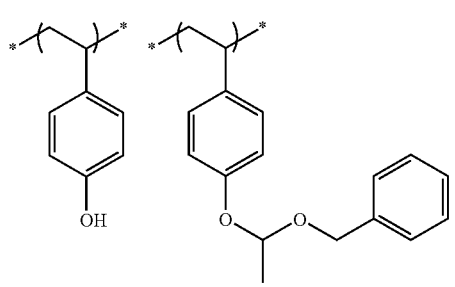

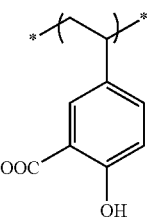

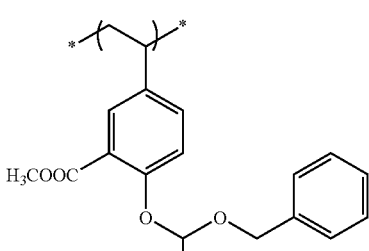 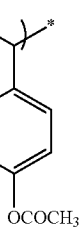

(6)

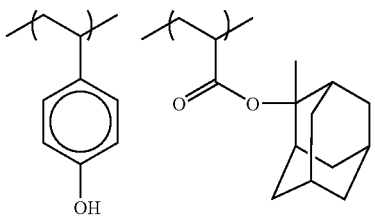

(7)

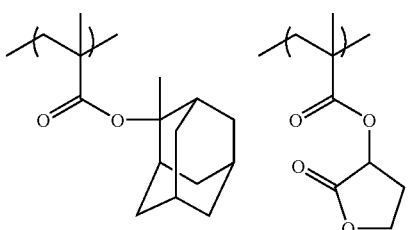

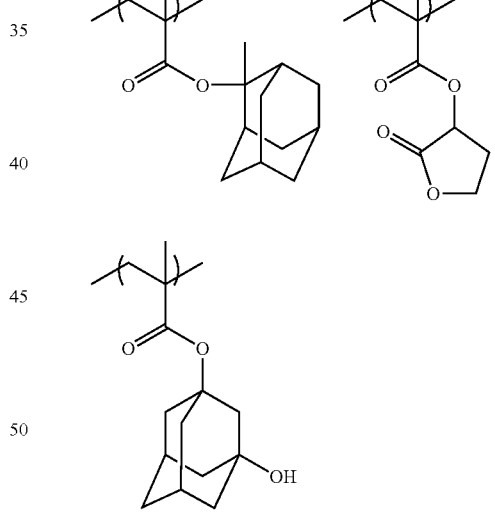

In the positive resist composition of the present invention, the blending amount of the acid-decomposable group in the composition is preferably from 35 to 88 mass %, more preferably from 55 to 85 mass %, still more preferably from 60 to 80 mass %, based on the entire solid content of the composition.

[2] (B) Compound Capable of Generating an Acid Upon Irradiation with an Actinic Ray or Radiation, Represented by Formula (ZI) or (ZII)

The positive resist composition of the present invention contains at least either one compound represented by formula (ZI) or (ZII) as the compound capable of generating an acid upon irradiation with an actinic ray or radiation.

(ZI)

(ZII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond, a carbonyl group or a —$SO_2$— structure. The group formed by combining two members out of $R_{201}$ to $R_{203}$ includes an alkylene group (e.g., butylene, pentylene).

In formula (ZII), each of $R_{204}$ and $R_{205}$ independently represents an aryl group, an alkyl group or a cycloalkyl group.

$Z^-$ is represented by the following formula (Za) or (Zb):

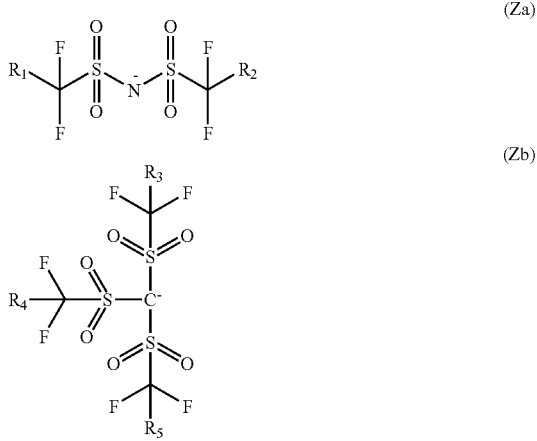

In formula (Za), each of $R_1$ and $R_2$ independently represents a fluorine atom or an alkyl group, and $R_1$ and $R_2$ may combine together to form a ring.

In formula (Zb), each of $R_3$ to $R_5$ independently represents a fluorine atom or an alkyl group, and any two members out of $R_3$ to $R_5$ may combine together to form a ring.

The alkyl group of $R_1$ and $R_2$ in formula (Za) or (Zb) is preferably an alkyl group having a carbon number of 1 to 5.

The alkyl group of $R_1$ and $R_2$ may be further substituted, for example, by a fluorine atom, a cycloalkyl group-arylene group-O—$SO_2$— group or a halogen atom-$SO_2$— group.

In the case where $R_1$ and $R_2$ combine together to form a ring, the group formed by combining $R_1$ and $R_2$ together is preferably an alkylene group having a carbon number of 1 to 5 and may be substituted by a fluorine atom or the like.

The alkyl group of $R_3$ to $R_5$ is preferably an alkyl group having a carbon number of 1 to 5.

The alkyl group of $R_3$ to $R_5$ may be further substituted, for example, by a fluorine atom, a cycloalkyl group-arylene group-O—$SO_2$— group or a halogen atom-$SO_2$— group.

In the case where any members out of $R_3$ to $R_5$ combine together to form a ring, the group formed by combining any members out of $R_3$ to $R_5$ together is preferably an alkylene group having a carbon number of 1 to 5 and may be substituted by a fluorine atom or the like.

Examples of the organic group of $R_{201}$, $R_{202}$ and $R_{203}$ in formula (ZI) include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole, a furan, a thiophene, an indole, a benzofuran and a benzothiophene. In the case where the arylsulfonium compound has two or more aryl groups, each of these two or more aryl groups may be the same as or different from every other aryl groups.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

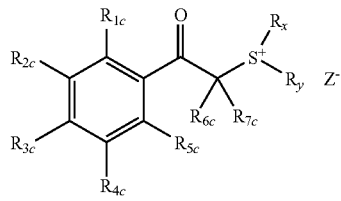

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Z^-$ represents an anion having the same definition as $Z^-$ in formula (ZI).

Specific preferred examples of the compound (ZI-3) include compounds set forth as formulae (I-1) to (I-70) in US2003/0224288A1, and compounds set forth as formulae (IA-1) to (IA-54) and formulae (IB-1) to (IB-24) in US2003/0077540A1.

As for the structure of the cation moiety in the compound of formula (ZI), the structure represented by formula (ZI-4) is also one preferred embodiment. When a compound represented by formula (ZI-4) is used as the structure of the cation moiety, this is effective in improving the problem of outgassing which is brought about particularly at the exposure under the vacuum conditions.

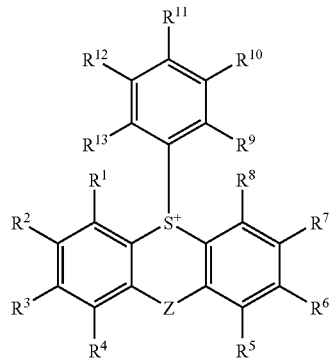

(ZI-4)

In formula (ZI-4), each of $R^1$ to $R^{13}$ independently represents a hydrogen atom or a substituent, and at least one of $R^1$ to $R^{13}$ is preferably a substituent containing an alcoholic hydroxyl group.

Z represents a single bond or a divalent linking group.

$X^-$ represents a counter anion.

The alcoholic hydroxyl group above indicates a hydroxyl group bonded to a carbon atom of an alkyl group.

In the case where $R^1$ to $R^{13}$ are a substituent containing an alcoholic hydroxyl group, each of $R^1$ to $R^{13}$ is represented by —W—Y, wherein Y is an alkyl group substituted by a hydroxyl group and W is a single bond or a divalent linking group.

Examples of the alkyl group of Y include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a boronyl group. Among these, preferred are an ethyl group, a propyl group, an isopropyl group, an n-butyl group, an isobutyl group and a sec-butyl group, and more preferred are an ethyl group, a propyl group and an isopropyl group. In particular, Y preferably has a structure of —$CH_2CH_2OH$.

The divalent linking group represented by W is not particularly limited and includes, for example, a divalent group obtained by substituting a single bond for an arbitrary hydrogen atom of a monovalent group such as alkoxyl group, acyloxy group, carbamoyloxy group, alkoxycarbonyloxy group, aryloxycarbonyloxy group, acylamino group, aminocarbonylamino group, alkoxycarbonylamino group, aryloxycarbonylamino group, sulfamoylamino group, alkylsulfonylamino group, arylsulfonylamino group, alkylthio group, arylthio group, sulfamoyl group, alkylsulfinyl group, arylsulfinyl group, alkylsulfonyl group, arylsulfonyl group, acyl group, aryloxycarbonyl group, alkoxycarbonyl group and carbamoyl group.

W is preferably a single bond or a divalent group obtained by substituting a single bond for an arbitrary hydrogen atom of an alkoxyl group, an acyloxy group, an acylamino group, an alkylsulfonylamino group, an arylsulfonylamino group, an alkylthio group, an alkylsulfonyl group, an acyl group, an alkoxycarbonyl group or a carbamoyl group, more preferably a single bond or a divalent group obtained by substituting a single bond for an arbitrary hydrogen atom of an acyloxy group, an alkylsulfonyl group, an acyl group or an alkoxycarbonyl group.

In the case where each of $R^1$ to $R^{13}$ is a substituent containing an alcoholic hydroxyl group, the number of carbon atoms contained is preferably from 2 to 10, more preferably from 2 to 6, still more preferably from 2 to 4.

The substituent as $R^1$ to $R^{13}$ containing an alcoholic hydroxyl group may have two or more alcoholic hydroxyl groups. The number of alcoholic hydroxyl groups in the substituent as $R^1$ to $R^{13}$ containing an alcoholic hydroxyl group is from 1 to 6, preferably from 1 to 3, more preferably 1.

The number of alcoholic hydroxyl groups in the compound represented by formula (ZI-4) is preferably from 1 to 6, more preferably from 1 to 3.

In the case where $R^1$ to $R^{13}$ are a substituent not containing an alcoholic hydroxyl group, each of $R^1$ to $R^{13}$ is independently a hydrogen atom or a substituent, and the substituent may be any substituent and is not particularly limited, but examples thereof include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be called a hetero ring group), a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other known substituents.

Two adjacent members out of $R^1$ to $R^{13}$ may combine together to form a ring (an aromatic or non-aromatic hydrocarbon ring or a heterocyclic ring, which may be further combined to form a polycyclic condensed ring; such as benzene ring, naphthalene ring, anthracene ring, phenanthrene ring, fluorene ring, triphenylene ring, naphthacene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring).

In the case where $R^1$ to $R^{13}$ are a substituting not containing an alcoholic hydroxyl group, each of $R^1$ to $R^{13}$ is preferably a hydrogen atom, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfamoyl group, an alkylsulfonyl group, an arylsulfonyl group, an aryloxycarbonyl group, an alkoxycarbonyl group, a carbamoyl group, an imido group, a silyl group, or a ureido group.

In the case where $R^1$ to $R^{13}$ are a substituent not containing an alcoholic hydroxyl group, each of $R^1$ to $R^{13}$ is more preferably a hydrogen atom, a halogen atom, an alkyl group (including a cycloalkyl group, a bicycloalkyl group and a tricycloalkyl group), a cyano group, an alkoxy group, an acyloxy group, an acylamino group, an aminocarbonylamino group, an alkoxycarbonylamino group, an alkylsulfonylamino group, an arylsulfonylamino group, an alkylthio group, a sulfamoyl group, an alkylsulfonyl group, an arylsulfonyl group, an alkoxycarbonyl group, or a carbamoyl group.

In the case where $R^1$ to $R^{13}$ are free of an alcoholic hydroxyl group, each of $R^1$ to $R^{13}$ is still more preferably a hydrogen atom, an alkyl group (including a cycloalkyl group, a bicycloalkyl group and a tricycloalkyl group), a halogen atom, or an alkoxy group.

In formula (ZI-4), at least one of $R^1$ to $R^{13}$ contains an alcoholic hydroxyl group, and preferably, at least one of $R^9$ to $R^{13}$ contains an alcoholic hydroxyl group.

Z represents a single bond or a divalent linking group, and examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, —C≡C—, an aminocarbonylamino group, and an aminosulfonylamino group, which groups each may have a substituent. Examples of the substituent therefor are the same as those of the substituent described for $R^1$ to $R^{13}$. Z is preferably a single bond or a non-electron-withdrawing substituent such as alkylene group, arylene group, ether group, thioether group, amino group, —CH=CH—, —C≡C—, aminocarbonylamino group and aminosulfonylamino group, more preferably a single bond, an ether group or a thioether group, still more preferably a single bond.

The compound having a cation represented by formula (ZI-4) can be synthesized, for example, by a method of condensing a cyclic sulfoxide compound to a benzene derivative containing, as the substituent, a hydroxyl group protected by a protective group, thereby forming a sulfonium salt, and deprotecting the protective group of the hydroxyl group.

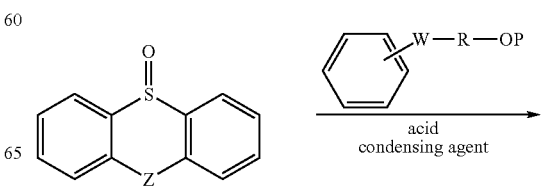

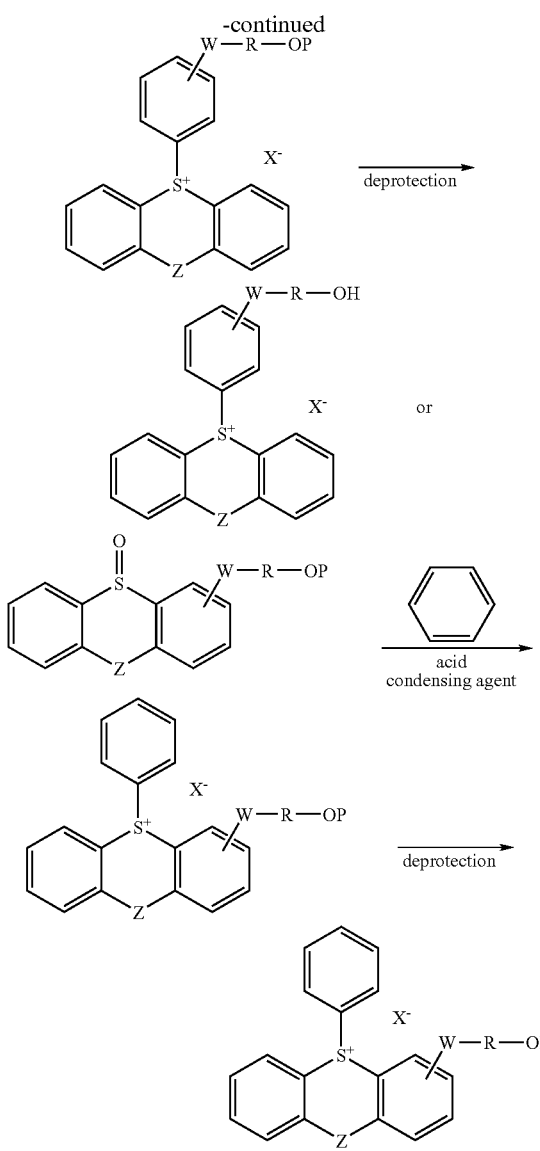

(wherein W is a divalent linking group, R is an alkylene group, and P is a protective group.) Examples of the acid used for the reaction of sulfonium formation include a methanesulfonic acid, an ethanesulfonic acid, a propanesulfonic acid, a butanesulfonic acid, a pentanesulfonic acid, a trifluoromethanesulfonic acid, a benzenesulfonic acid, a p-toluenesulfonic acid, a p-ethylbenzenesulfonic acid and a nonafluorobutanesulfonic acid, and the conjugate base of the acid used becomes the anion of sulfonium. The condensing agent for use in the reaction of sulfonium formation includes, for example, an acid anhydride, and examples thereof include an anhydride of strong acid, such as trifluoroacetic anhydride, polyphosphoric anhydride, methanesulfonic anhydride, trifluoromethanesulfonic anhydride, p-toluenesulfonic anhydride, nonafluorobutane-sulfonic anhydride, tetrafluorosuccinic anhydride, hexafluoroglutaric anhydride, chlorodifluoroacetic anhydride, pentafluoropropionic anhydride and heptafluorobutanoic anhydride.

The protective group P of the hydroxyl group includes an ether, an ester and the like, and examples thereof include a methyl ether, an aryl ether, a benzyl ether, an acetic acid ester, a benzoic acid ester and a carbonic acid ester.

The counter anion $X^-$ can be converted into a desired anion by adding a conjugate acid of the objective anion through an ion exchange resin.

In formula (ZII), each of $R_{204}$ and $R_{205}$ independently represents an aryl group, an alkyl group or a cycloalkyl group.

The aryl group of $R_{204}$ and $R_{205}$ is preferably a phenyl group or a naphthyl group, more preferably a phenyl group. The aryl group of $R_{204}$ and $R_{205}$ may be an aryl group having a heterocyclic structure containing an oxygen atom, a nitrogen atom, a sulfur atom or the like. Examples of the heterocyclic structure include a pyrrole, a furan, a thiophene, an indole, a benzofuran and a benzothiophene.

The alkyl group and cycloalkyl group in $R_{204}$ and $R_{205}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ and $R_{205}$ each may have a substituent. Examples of the substituent which the aryl group, alkyl group and cycloalkyl group of $R_{204}$ and $R_{205}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

Specific examples of the compound represented by formula (ZI) or (ZII) are set forth below, but the present invention is not limited thereto.

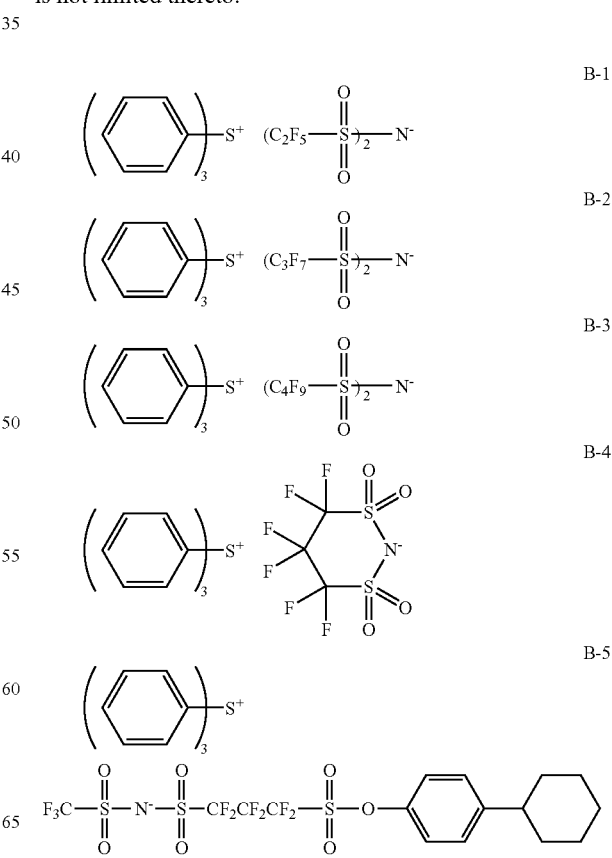

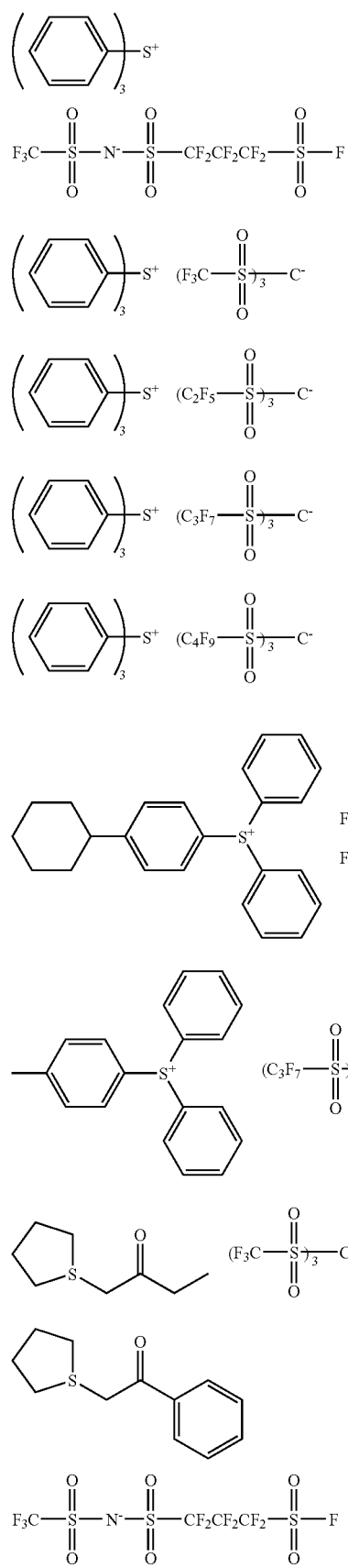
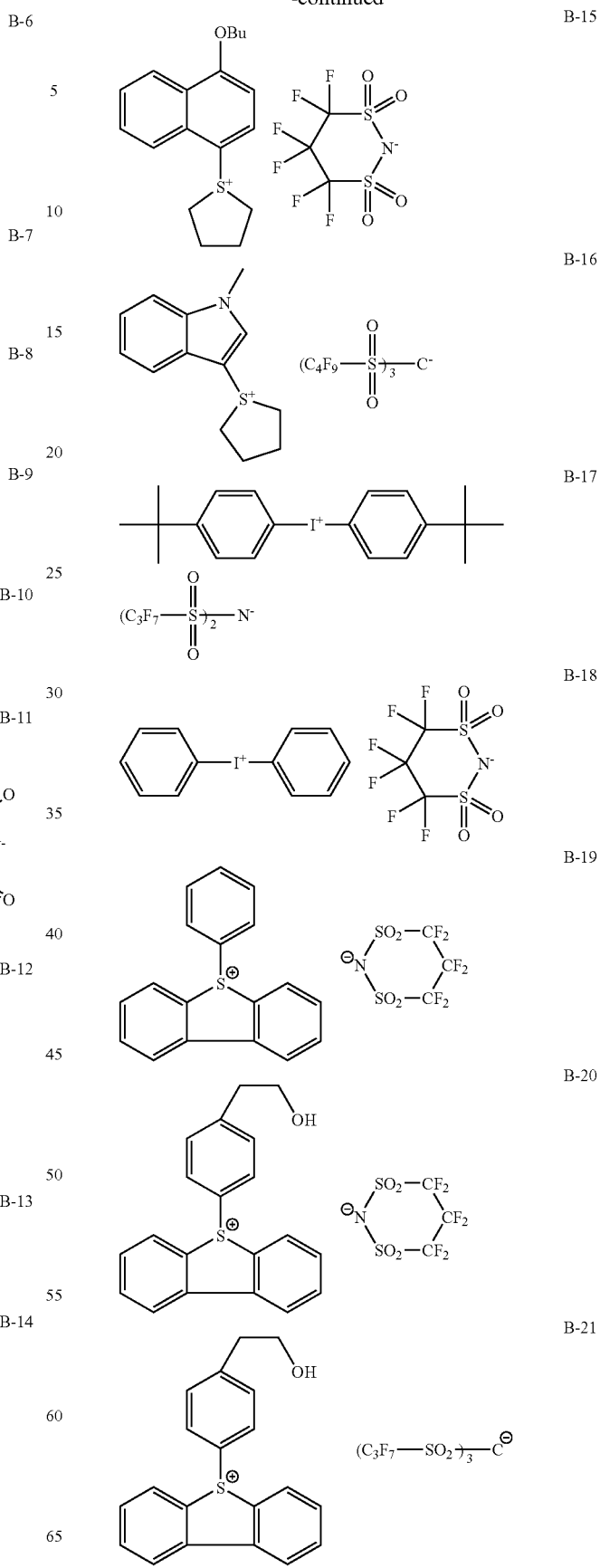

-continued

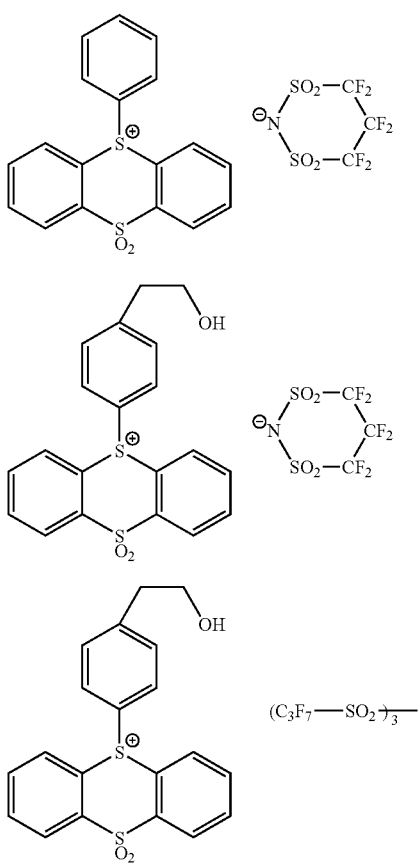

As for the compound represented by formula (ZI) or (ZII), a commercially available product may be used or a compound synthesized by a known method may be used. The compound can be synthesized according to the synthesis method described, for example, in JP-T-11-501909 (the term "JP-T" as used herein means a "published Japanese translation of a PCT patent application").

The total amount of the compound represented by formula (ZI) or (ZII) in the resist composition is 12 mass % or more, preferably from 12 to 50 mass %, more preferably from 20 to 50 mass %, based on the entire solid content of the resist composition.

Incidentally, a known compound other than the compound represented by formula (ZI) or (ZII) may be appropriately selected, used in combination and mixed as a compound capable of generating an acid upon irradiation with an actinic ray or radiation.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

In the case where a compound capable of generating an acid upon irradiation with an actinic ray or radiation other than the compound represented by formula (ZI) or (ZII) is used in combination (combined photo-acid generator), the amount added of the combined photo-acid generator is preferably 50 mass % or less, more preferably 30 mass % or less, based on the total amount of the compound represented by formula (ZI) or (ZII).

Such an acid generator may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

In the case where the compound capable of generating an acid upon irradiation with an actinic ray or radiation, which may be used in combination with the compound represented by formula (ZI) or (ZII), is an ionic compound, examples of the structure of the cation moiety thereof are the same as those described for the compound represented by formula (ZI) or (ZII).

The structure of the anion moiety thereof includes organic anions represented by the following formulae (AN1) and (AN2):

$$Rc_1\text{-}SO_3^\ominus \qquad \text{AN1}$$

$$Rc_1\text{-}CO_2^\ominus \qquad \text{AN2}$$

In formulae (AN1) and (AN2), $Rc_1$ represents an organic group.

The organic group in $Rc_1$ includes an organic group having a carbon number of 1 to 30 and is preferably an alkyl or aryl group which may be substituted, or a group where a plurality of such groups are connected through a linking group such as single bond, —O—, —CO$_2$—, —S—, —SO$_3$— or —SO$_2$N(Rd$_1$)—.

$Rd_1$ represents a hydrogen atom or an alkyl group and may form a ring structure together with the alkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably in a form where a part of hydrogen atoms remain instead of replacing all hydrogen atoms by a fluorine atom, and it is more preferred that the number of hydrogen atoms is larger than the number of fluorine atoms. The absence of a perfluoroalkyl group having a carbon number of 5 or more enables reduction in the toxicity to ecology.

A most preferred embodiment of $Rc_1$ is a group represented by the following formula.

$$Rc_7\text{-Ax-}RC_6$$

In the formula, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a linking group (preferably a single bond, —O—, —CO$_2$—, —S—, —SO$_3$— or —SO$_2$N(Rd$_1$)—). $Rd_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group which may be substituted each preferably contains no fluorine atom as the substituent.

Out of the compounds capable of generating an acid upon irradiation with an actinic ray or radiation, which may be used in combination with the compound represented by formula (ZI) or (ZII), the nonionic compounds represented by the following formulae (ZIV), (ZV) and (ZVI) are also preferred.

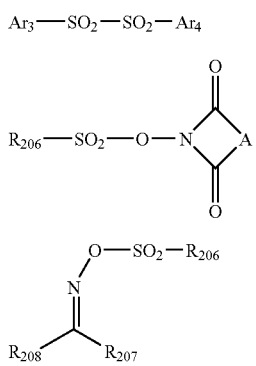

(ZIV)
(ZV)
(ZVI)

In formulae (ZIV) to (ZVI), each of $Ar_3$ and $Ar_4$ independently represents an aryl group.

$R_{206}$ represents an alkyl group, a cycloalkyl group or an aryl group.

Each of $R_{207}$ and $R_{208}$ represents an alkyl group, a cycloalkyl group, an aryl group or an electron-withdrawing group. $R_{207}$ is preferably an aryl group, and $R_{208}$ is preferably an electron-withdrawing group, more preferably a cyano group or a fluoroalkyl group.

A represents an alkylene group, an alkenylene group or an arylene group.

These groups each may have a substituent, and examples of the substituent are the same as those of the substituent which each of $R_{204}$ to $R_{207}$ may have.

Specific examples of the compound capable of generating an acid upon irradiation with an actinic ray or radiation, which may be used in combination with the compound represented by formula (ZI) or (ZII), are set forth below, but the present invention is not limited thereto.

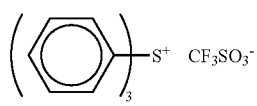 (z1)

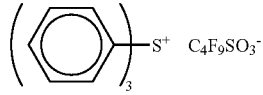 (z2)

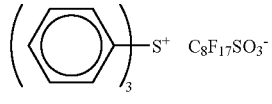 (z3)

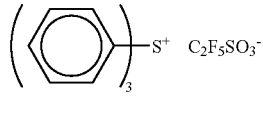 (z4)

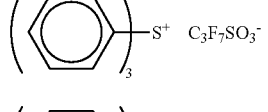 (z5)

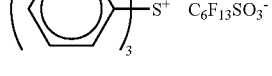 (z6)

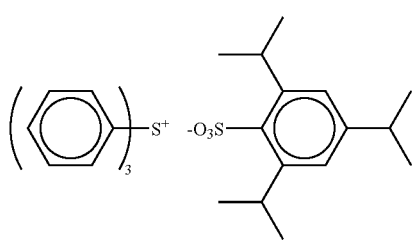 (z7)

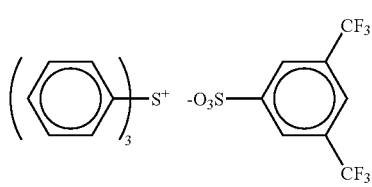 (z8)

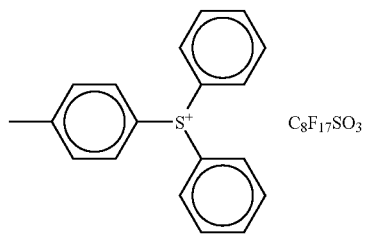 (z9)

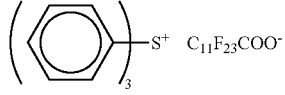 (z10)

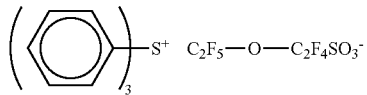 (z11)

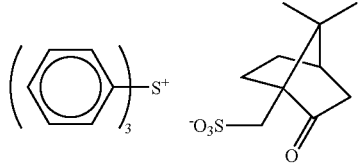 (z12)

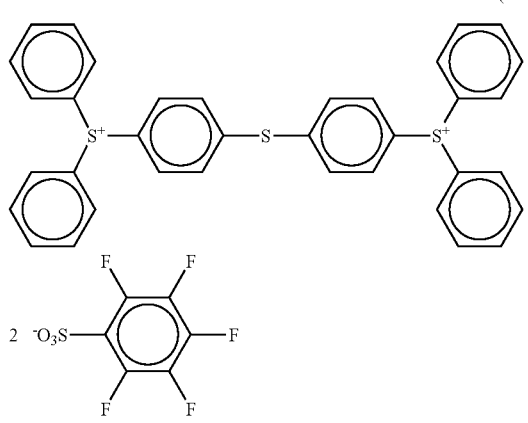 (z13)

(z14) 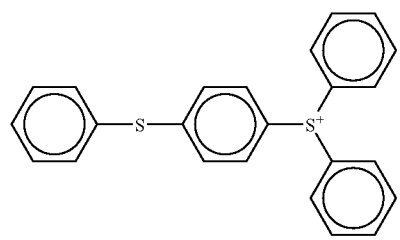
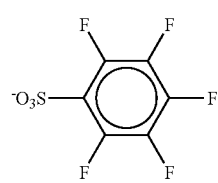
(z15) 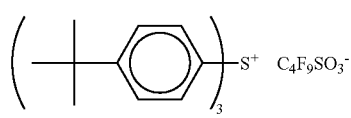
(z16) 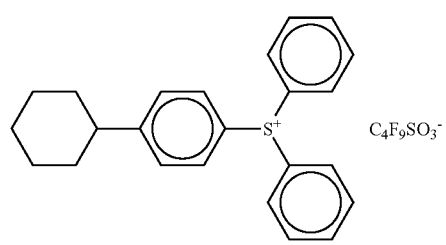
(z17) 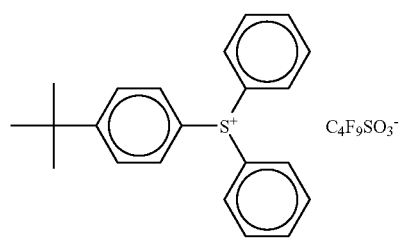
(z18) 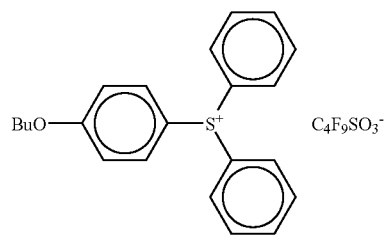
(z19) 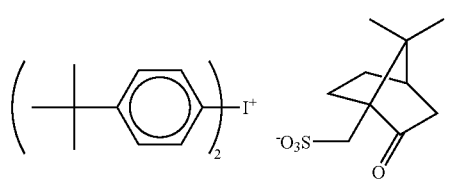
(z20) 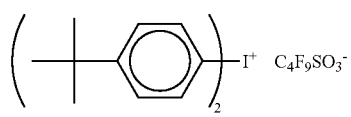
(z21) 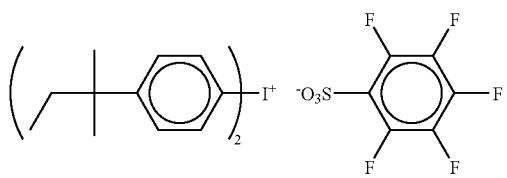
(z22) 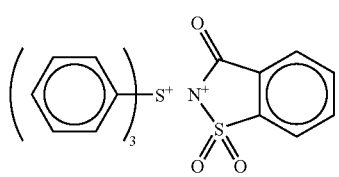
(z23) 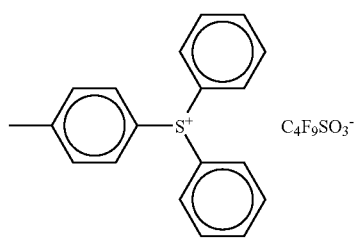
(z24) 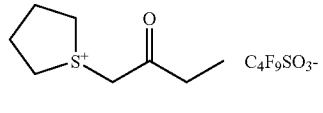
(z25) 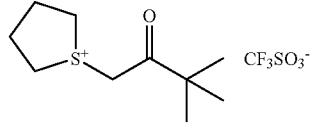
(z26) 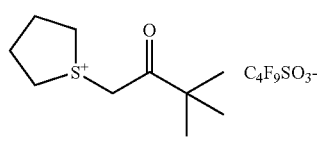
(z27) 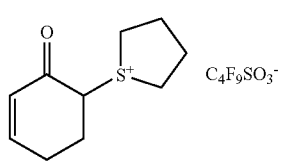
(z28) 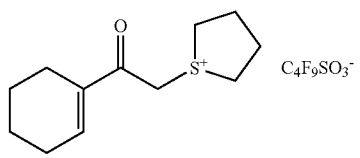
(z29) 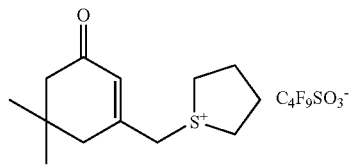

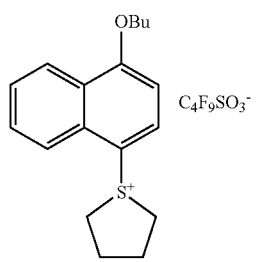 (z30)
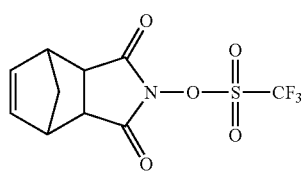 (z31)
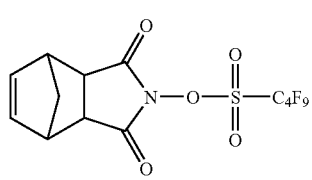 (z32)
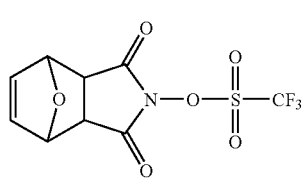 (z33)
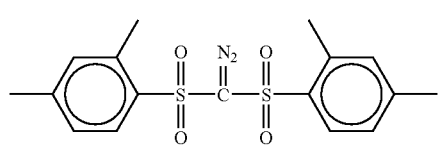 (z34)
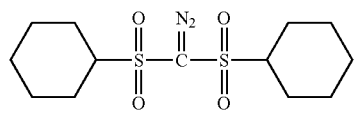 (z35)
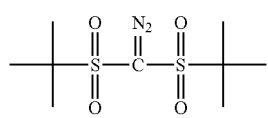 (z36)
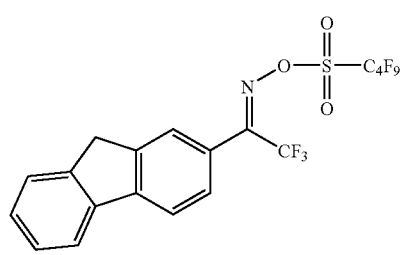 (z37)
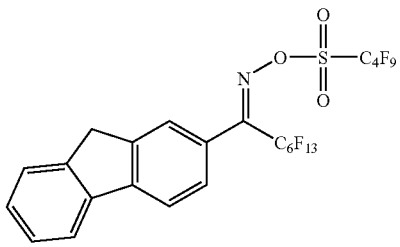 (z38)
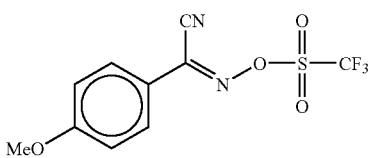 (z39)
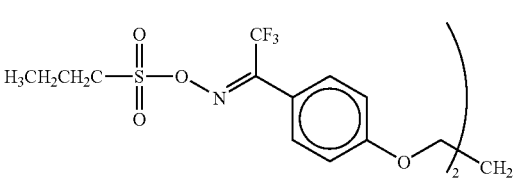 (z40)
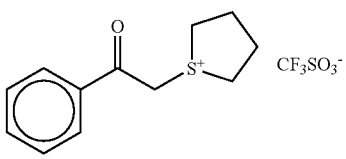 (z41)
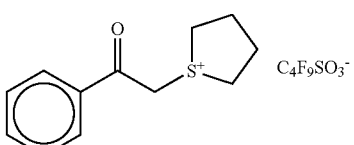 (z42)
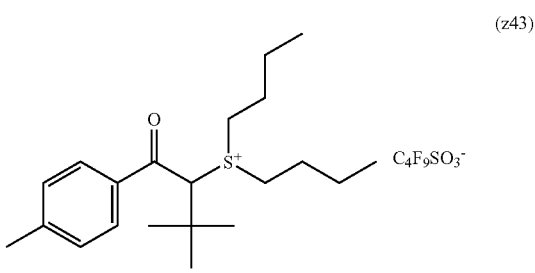 (z43)
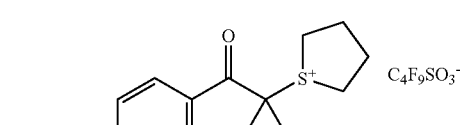 (z44)
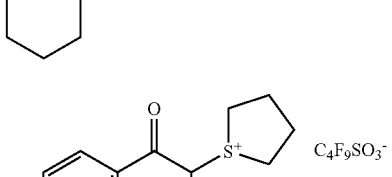 (Z45)

-continued
(z46)
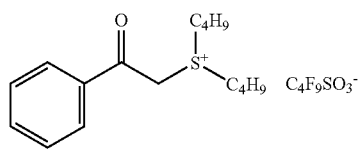
(z47)
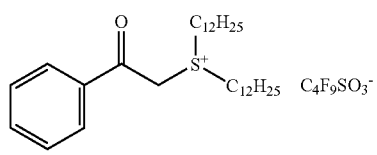
(z48)
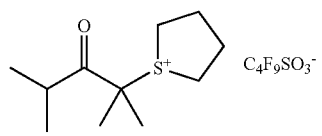
(z49)
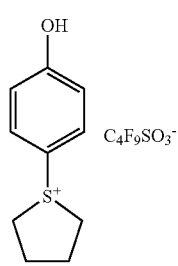
(z75)
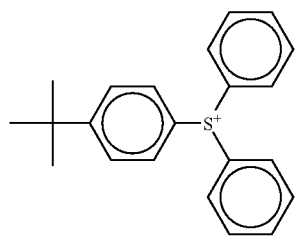
(z76)
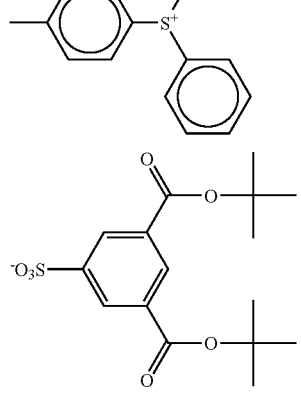
-continued
(z77)
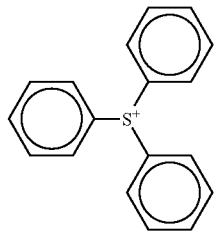
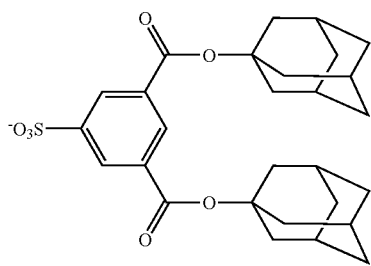
(z78)
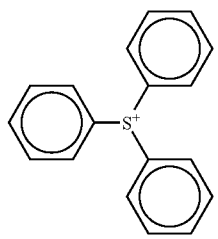
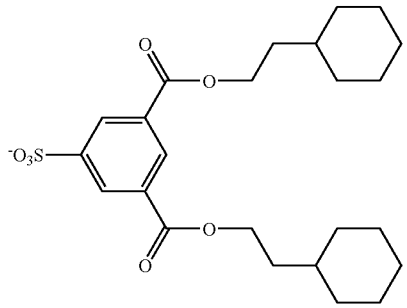
(z79)
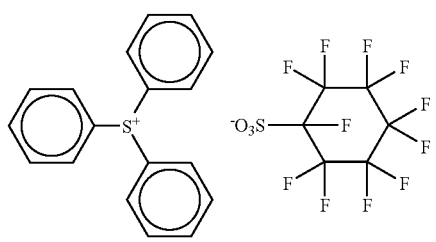
(z80)
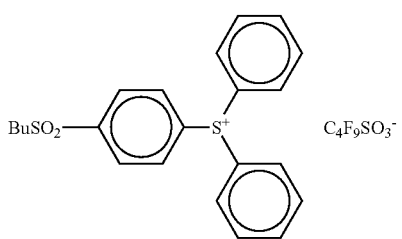

-continued

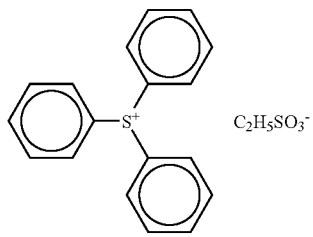
(z81) C₂H₅SO₃⁻

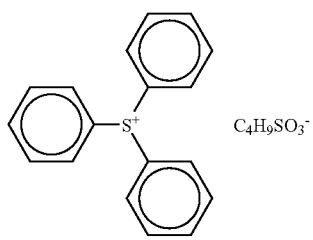
(z82) C₄H₉SO₃⁻

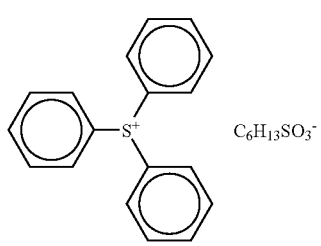
(z83) C₆H₁₃SO₃⁻

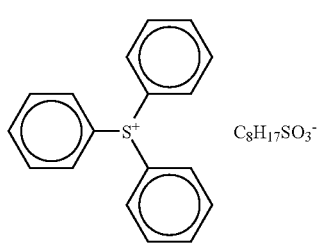
(z84) C₈H₁₇SO₃⁻

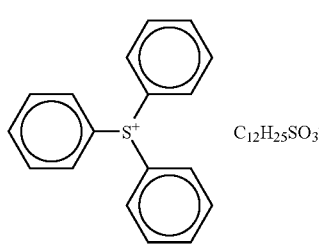
(z85) C₁₂H₂₅SO₃⁻

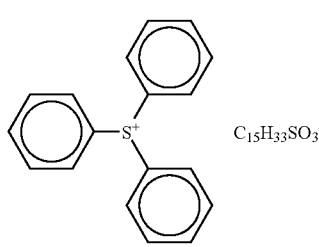
(z86) C₁₅H₃₃SO₃⁻

-continued

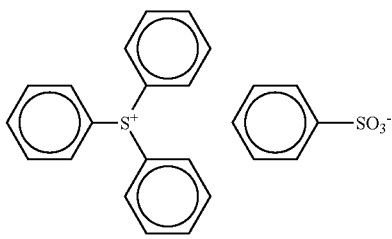
(z87)

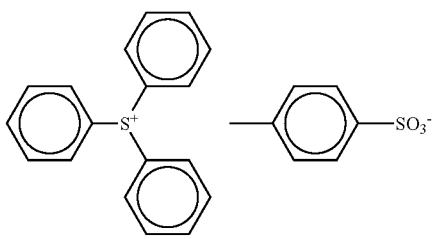
(z88)

[3] Compound Having a Proton Acceptor Functional Group and Undergoing Decomposition Upon Irradiation with an Actinic Ray or Radiation to Generate a Compound Reduced in or Deprived of the Proton Acceptor Property or Changed to be Acidic from being Proton Acceptor-Functioning In view of sensitivity, resolution and line edge roughness, the positive resist composition of the present invention preferably contains a compound having a proton acceptor functional group and undergoing decomposition upon irradiation with an actinic ray or radiation to generate a compound reduced in or deprived of the proton acceptor property or changed to be acidic from being proton acceptor-functioning (hereinafter sometimes referred to as a "compound (PA)").

The compound reduced in or deprived of the proton acceptor property or changed to be acidic from being proton acceptor-functioning, which is generated resulting from decomposition of the compound (PA) upon irradiation with an actinic ray or radiation, includes a compound represented by the following formula (PA-I):

$$Q\text{-}A\text{-}(X)_n\text{—}B\text{—}R \qquad (PA\text{-}I)$$

In formula (PA-I), A represents a divalent linking group.

Q represents a sulfo group (—SO₃H) or a carboxyl group (—CO₂H).

X represents —SO₂— or —CO—.

n represents 0 or 1.

B represents a single bond, an oxygen atom or —N(Rx)—.

Rx represents a hydrogen atom or a monovalent organic group.

R represents a monovalent organic group having a proton acceptor functional group, or a monovalent organic group having an ammonium group.

The divalent linking group of A is preferably a divalent linking group having a carbon number of 2 to 12, such as alkylene group or phenylene group, more preferably an alkylene group having at least one fluorine atom, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group of Rx is preferably a monovalent organic group having a carbon number of 4 to 30, and examples thereof include an alkyl group, a cycloalkyl group, an aryl group, an aralkyl group and an alkenyl group.

The alkyl group of Rx, which may have a substituent, is preferably a linear or branched alkyl group having a carbon number of 1 to 20 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent includes, particularly, a group where a cycloalkyl group is substituted to a linear or branched alkyl group, such as adarnantylmethyl group, adamantylethyl group, cyclohexylethyl group and camphor residue.

The cycloalkyl group of Rx, which may have a substituent, is preferably a cycloalkyl group having a carbon number of 3 to 20 and may contain an oxygen atom in the ring. Specific examples thereof include a cyclopropyl group, a cyclopentyl group, a cyclohexyl group, a norbornyl group and an adamantyl group.

The aryl group of Rx, which may have a substituent, is preferably an aryl group having a carbon number of 6 to 14, and examples thereof include a phenyl group and a naphthyl group.

The aralkyl group of Rx, which may have a substituent, is preferably an aralkyl group having a carbon number of 7 to 20, and examples thereof include a benzyl group, a phenethyl group, a naphthylmethyl group and a naphthylethyl group.

The alkenyl group of Rx, which may have a substituent, includes, for example, a group having a double bond at an arbitrary position of the alkyl group described as Rx.

The proton acceptor functional group of R is a functional group having a group or electron capable of electrostatically interacting with a proton and indicates, for example, a functional group having a macrocyclic structure such as cyclic polyether, or a functional group containing a nitrogen atom having a lone electron pair not contributing to π-conjugation. The nitrogen atom having a lone electron pair not contributing to π-conjugation is, for example, a nitrogen atom having a partial structure represented by either one of the following formulae:

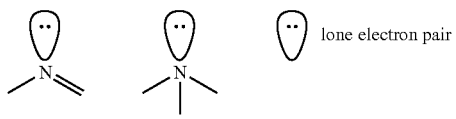

Preferred examples of the partial structure of the proton acceptor functional group include a crown ether structure, an aza-crown ether structure, a tertiary amine structure, a secondary amine structure, a primary amine structure, a pyridine structure, an imidazole structure and a pyrazine structure.

Preferred examples of the partial structure of the ammonium group include a tertiary ammonium structure, a secondary ammonium structure, a primary ammonium structure, a pyridinium structure, an imidazolinium structure and a pyrazinium structure.

The group containing such a structure preferably has a carbon number of 4 to 30, and examples thereof include an alkyl group, a cycloalkyl group, an aryl group, an aralkyl group and an alkenyl group.

The alkyl group, cycloalkyl group, aryl group, aralkyl group and alkenyl group in the alkyl group, cycloalkyl group, aryl group, aralkyl group or alkenyl group as R containing a proton acceptor functional group or an ammonium group are the same as the alkyl group, cycloalkyl group, aryl group, aralkyl group and alkenyl group described for Rx.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)—, R and Rx preferably combine to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or three or more monocyclic structures. The monocyclic structure and polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Specific examples of the compound represented by formula (PA-I) are set forth below, but the present invention is not limited thereto.

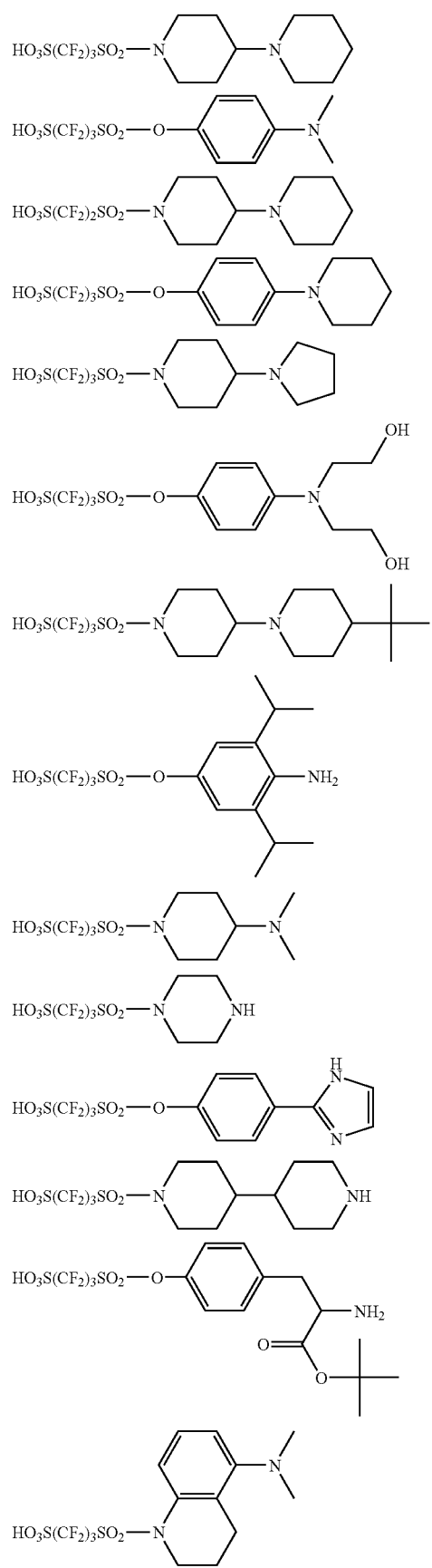
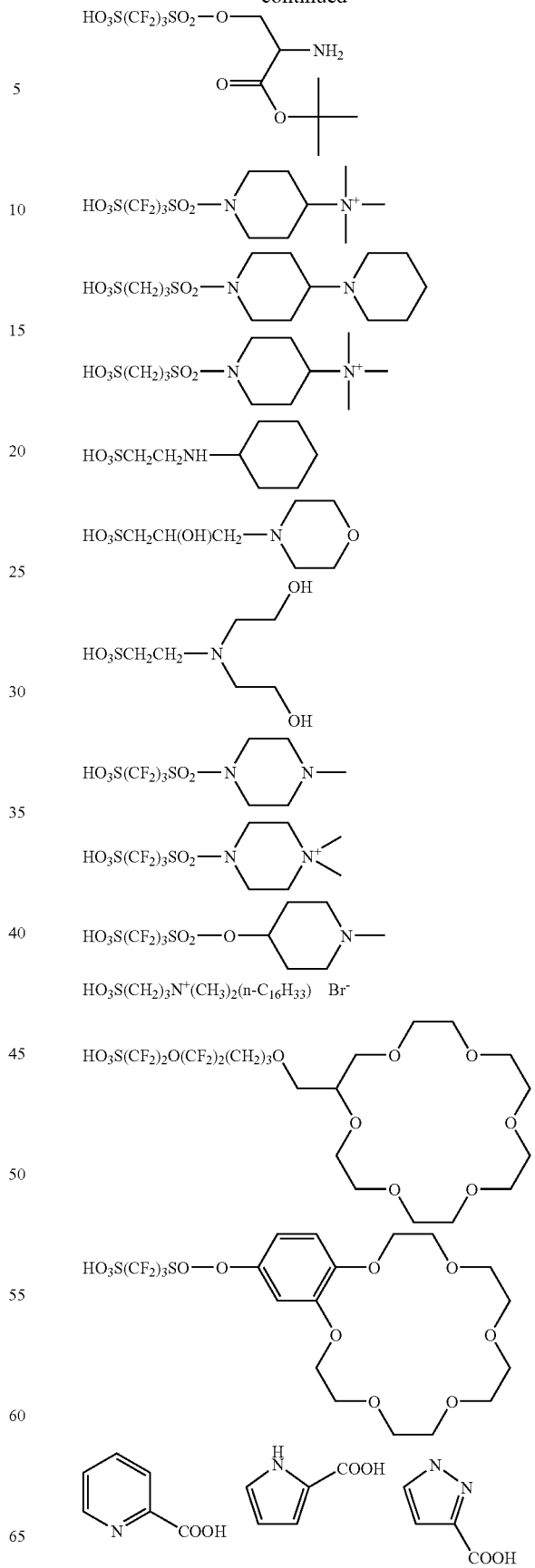

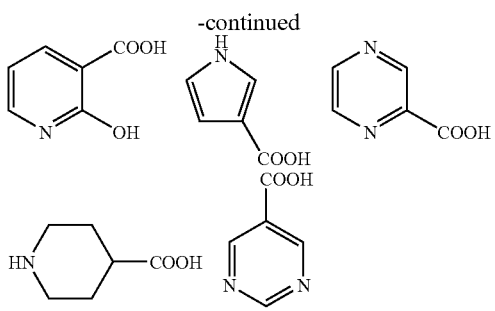

The compound reduced in or deprived of the proton acceptor property or changed to be acidic from being proton acceptor-functioning, which is generated resulting from decomposition of the compound (PA) upon irradiation with an actinic ray or radiation, also includes a compound represented by the following formula (PA-II):

$Q_1$-$X_1$—NH—$X_2$-$Q_2$ (PA-II)

In formula (PA-II), each of $Q_1$ and $Q_2$ independently represents a monovalent organic group, provided that either one of $Q_1$ and $Q_2$ has a proton acceptor functional group. $Q_1$ and $Q_2$ may combine to form a ring and the ring formed may have a proton acceptor functional group.

Each of $X_1$ and $X_2$ independently represents —CO— or —$SO_2$—.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group and an alkenyl group.

The alkyl group of $Q_1$ and $Q_2$, which may have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group of $Q_1$ and $Q_2$, which may have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group of $Q_1$ and $Q_2$, which may have a substituent, is preferably an aryl group having a carbon number of 6 to 14, and examples thereof include a phenyl group and a naphthyl group.

The aralkyl group of $Q_1$ and $Q_2$, which may have a substituent, is preferably an aralkyl group having a carbon number of 7 to 20, and examples thereof include a benzyl group, a phenethyl group, a naphthylmethyl group and a naphthylethyl group.

The alkenyl group of $Q_1$ and $Q_2$, which may have a substituent, includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group $Q_1$ or $Q_2$ has a proton acceptor functional group.

The proton acceptor functional group is a functional group having a group or lone electron pair capable of electrostatically interacting with a proton and includes, for example, a functional group having a macrocyclic structure such as cyclic polyether, and a functional group containing a nitrogen atom having a lone electron pair less contributing to π-conjugation. The nitrogen atom having a lone electron pair less contributing to π-conjugation includes, for example, a nitrogen atom having a partial structure represented by either one of the following formulae:

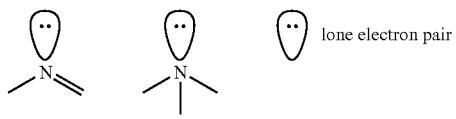

Preferred examples of the partial structure of the proton acceptor functional group include a crown ether structure, an aza-crown ether structure, a tertiary amine structure, a secondary amine structure, a primary amine structure, a pyridine structure, an imidazole structure, a pyrazine structure and an aniline structure. The group containing such a structure preferably has a carbon number of 4 to 30, and examples thereof include an alkyl group, a cycloalkyl group, an aryl group, an aralkyl group and an alkenyl group. The alkyl group, cycloalkyl group, aryl group, aralkyl group and alkenyl group are the same as those described above.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include an alkyl group (preferably having a carbon number of 1 to 20).

The proton acceptor functional group may be substituted by an organic group having a bond that is breakable by an acid. Examples of the organic group having a bond breakable by an acid include an amide group, an ester group (preferably a tertiary alkyloxycarbonyl group), an acetal group (preferably a 1-alkyloxy-alkyloxy group), a carbamoyl group and a carbonate group.

When $Q_1$ and $Q_2$ combine to form a ring and the ring formed has a proton acceptor functional group, examples of the structure thereof include a structure where the organic group of $Q_1$ or $Q_2$ is further bonded by an alkylene group, an oxy group, an imino group or the like.

In formula (PA-II), at least either one of $X_1$ and $X_2$ is preferably —$SO_2$—.

The compound represented by formula (PA-II) is preferably a compound represented by the following formula (PA-III):

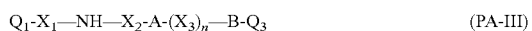

(PA-III)

In formula (PA-III), each of $Q_1$ and $Q_3$ independently represents a monovalent organic group, provided that either one of $Q_1$ and $Q_3$ has a proton acceptor functional group. $Q_1$ and $Q_3$ may combine to form a ring and the ring formed may have a proton acceptor functional group.

Each of $X_1$, $X_2$ and $X_3$ independently represents —CO— or —$SO_2$—.

A represents a divalent linking group.

B represents a single bond, an oxygen atom or —N(Qx)—.

Qx represents a hydrogen atom or a monovalent organic group.

When B is —N(Qx)—, $Q_3$ and Qx may combine to form a ring.

n represents 0 or 1.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group of A is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group, a perfluoropropylene group, or a perfluorobutylene group.

The monovalent organic group of Qx is preferably an organic group having a carbon number of 4 to 30, and examples thereof include an alkyl group, a cycloalkyl group, an aryl group, an aralkyl group and an alkenyl group. The alkyl group, cycloalkyl group, aryl group, aralkyl group and alkenyl group are the same as those described above.

In formula (PA-III), each of $X_1$, $X_2$ and $X_3$ is preferably —$SO_2$—.

Specific examples of the compound represented by formula (PA-II) are set forth below, but the present invention is not limited thereto.

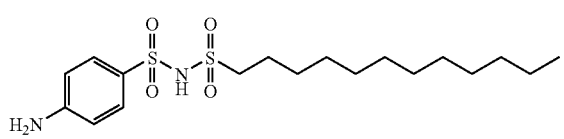

-continued

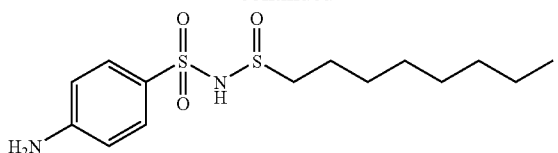

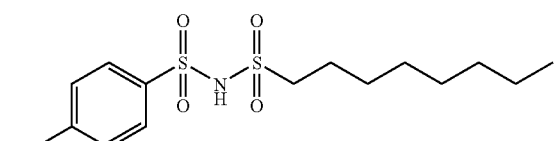

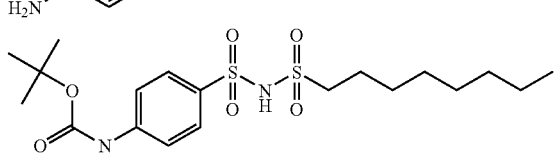

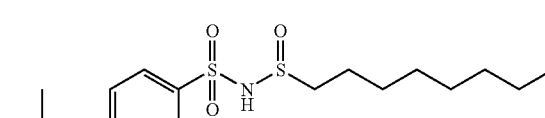

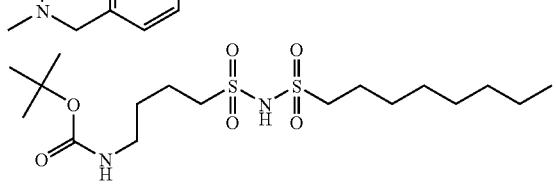

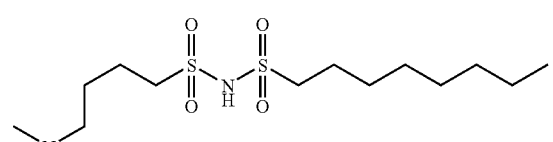

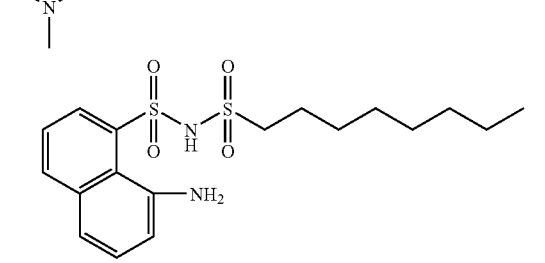

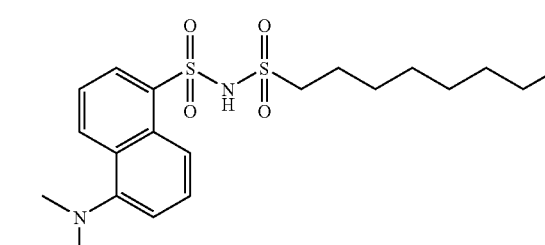

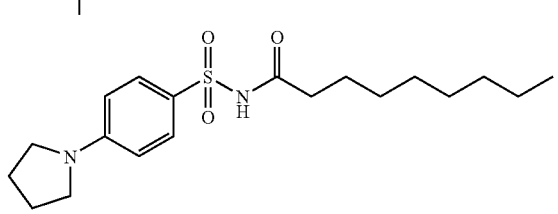

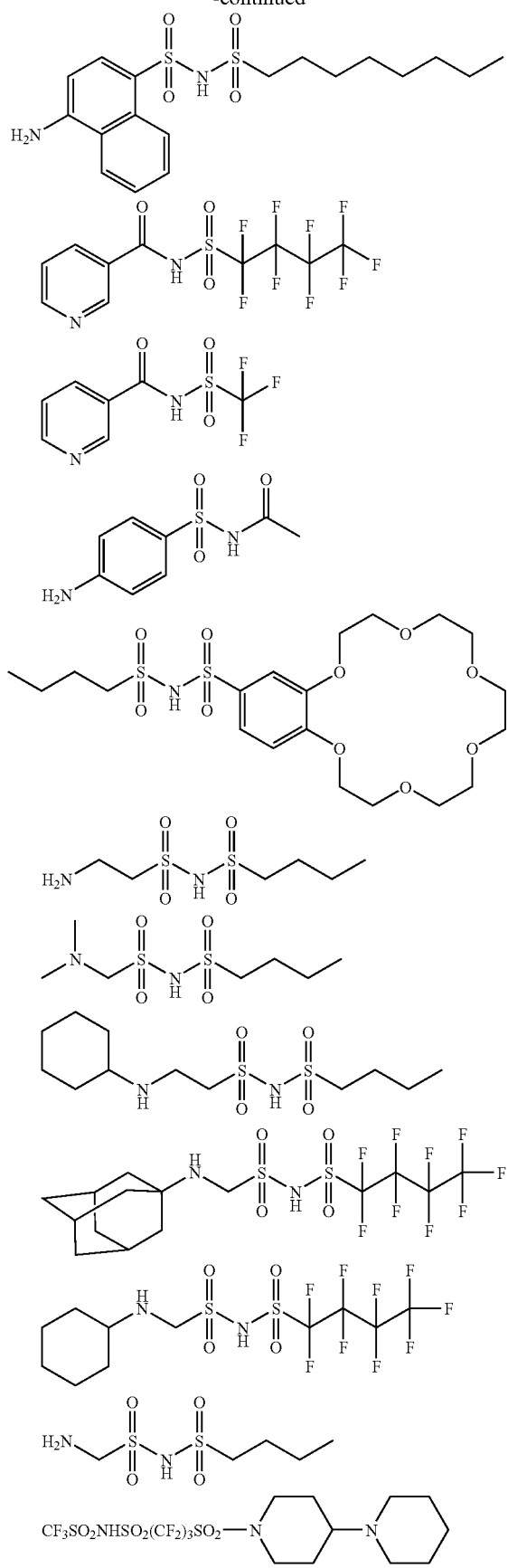
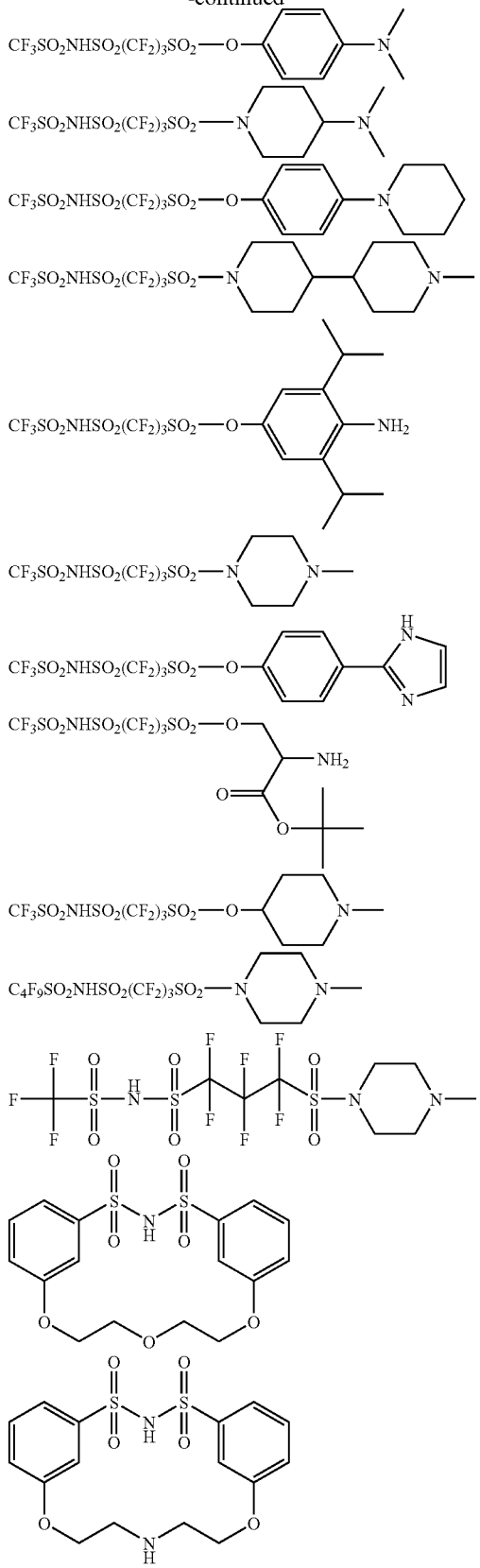
The compound (PA) is preferably a sulfonium salt compound of the compound represented by formula (PA-I), (PA- II) or (PA-III), or an iodonium salt compound of the compound represented by formula (PA-I), (PA-II) or (PA-III), more preferably a compound represented by the following formula (PA1) or (PA2):

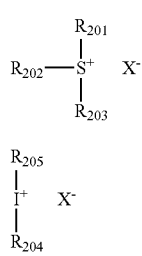

In formula (PA1), each of $R_{201}$, $R_{202}$ and $R_{203}$ independently represents an organic group.

Specific examples of the organic group of $R_{201}$, $R_{202}$ and $R_{203}$ and preferred structures thereof are the same as those of the organic group of $R_{201}$, $R_{202}$ and $R_{203}$ in formula (ZI).

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

The aryl group of $R_{204}$ and $R_{205}$ is preferably a phenyl group or a naphthyl group, more preferably a phenyl group.

The alkyl group of $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group of $R_{204}$ and $R_{205}$ is preferably a cycloalkyl group having a carbon number of 3 to 10 (e.g., cyclopentyl, cyclohexyl, norbornyl).

Each of $R_{204}$ and $R_{205}$ may have a substituent, and examples of the substituent which each of $R_{204}$ and $R_{205}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

The compound (PA) decomposes upon irradiation with an actinic ray or radiation to generate, for example, a compound represented by formula (PA-1) or (PA-2).

The compound represented by formula (PA-1) is a compound having a sulfo or carboxyl group together with a proton acceptor functional group and thereby being reduced in or deprived of the proton acceptor property or changed to be acidic from being proton acceptor-functioning, as compared with the compound (PA).

The compound represented by formula (PA-2) is a compound having an organic sulfonylimino or organic carbonylimino group together with a proton acceptor functional group and thereby being reduced in or deprived of the proton acceptor property or changed to be acidic from being proton acceptor-functioning, as compared with the compound (PA).

In the present invention, the expression "reduced in the acceptor property" means that when a noncovalent bond complex as a proton adduct is produced from a proton acceptor functional group-containing compound and a proton, the equilibrium constant at the chemical equilibrium decreases.

The proton acceptor property can be confirmed by measuring the pH.

Specific examples of the compound (PA) capable of generating a compound represented by formula (PA-I) upon irradiation with an actinic ray or radiation are set forth below, but the present invention is not limited thereto.

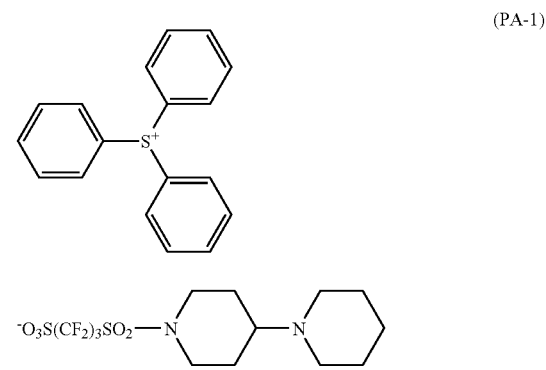

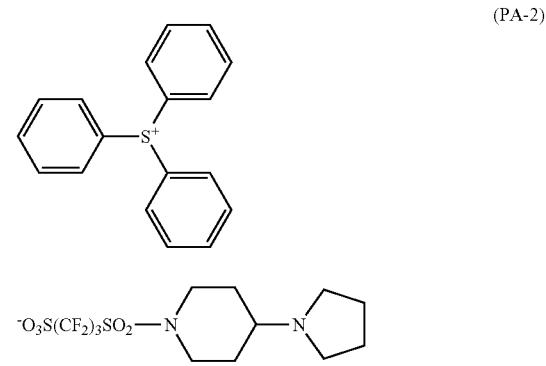

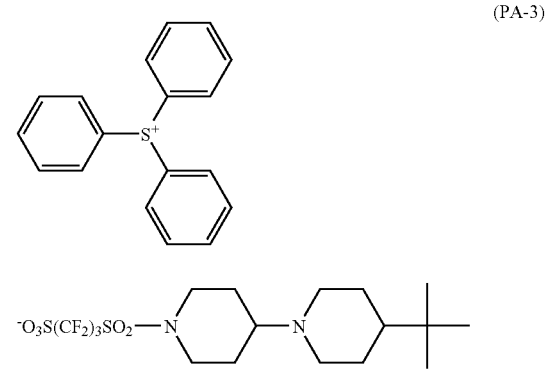

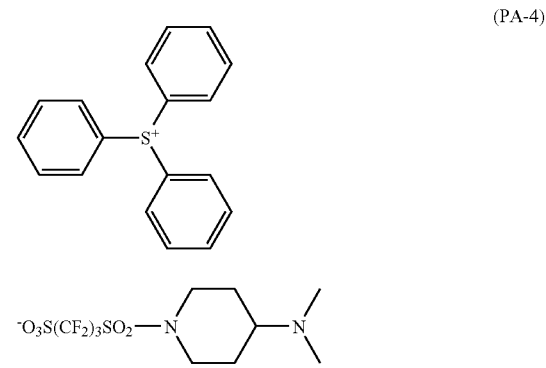

(PA-5)
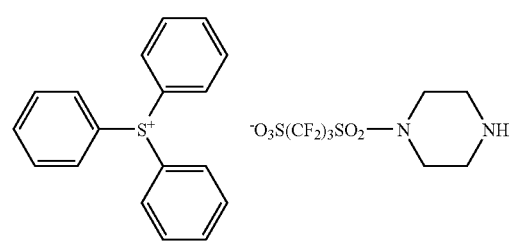
(PA-6)
(PA-7)
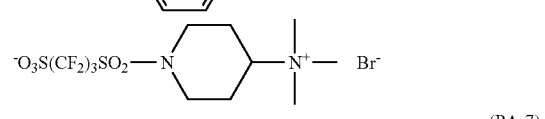
(PA-8)
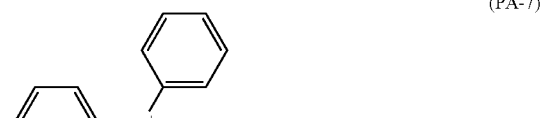
(PA-9)
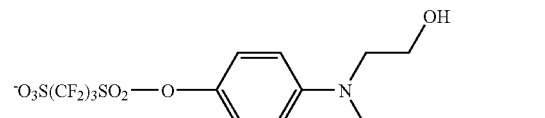
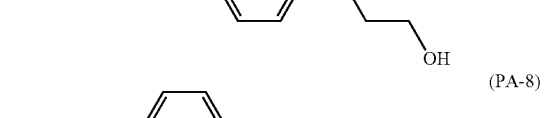
(PA-10)
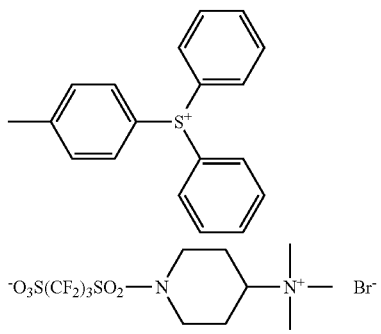
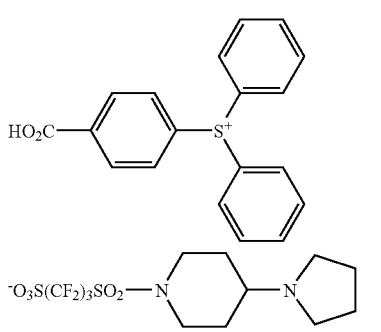
(PA-11)
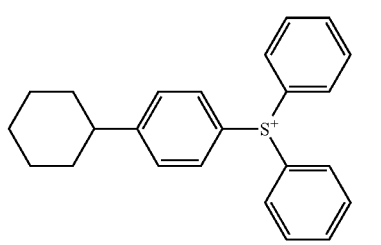
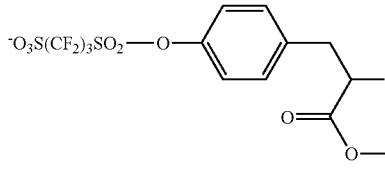
(PA-12)
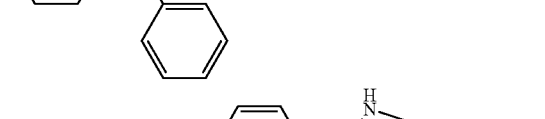
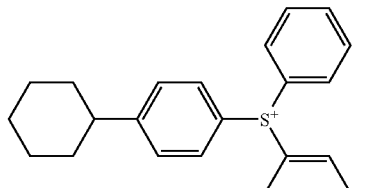
(PA-13)
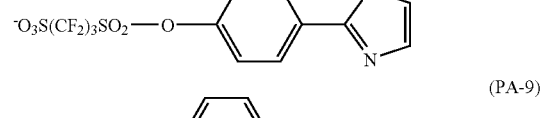
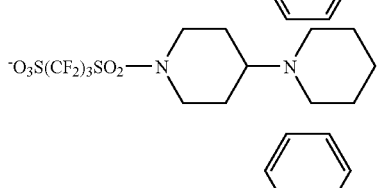
(PA-14)
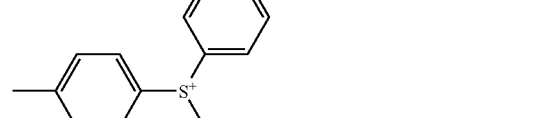
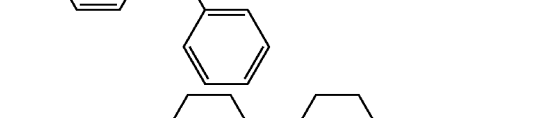
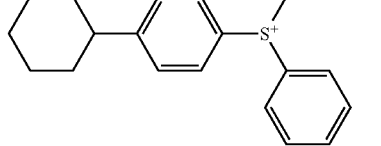

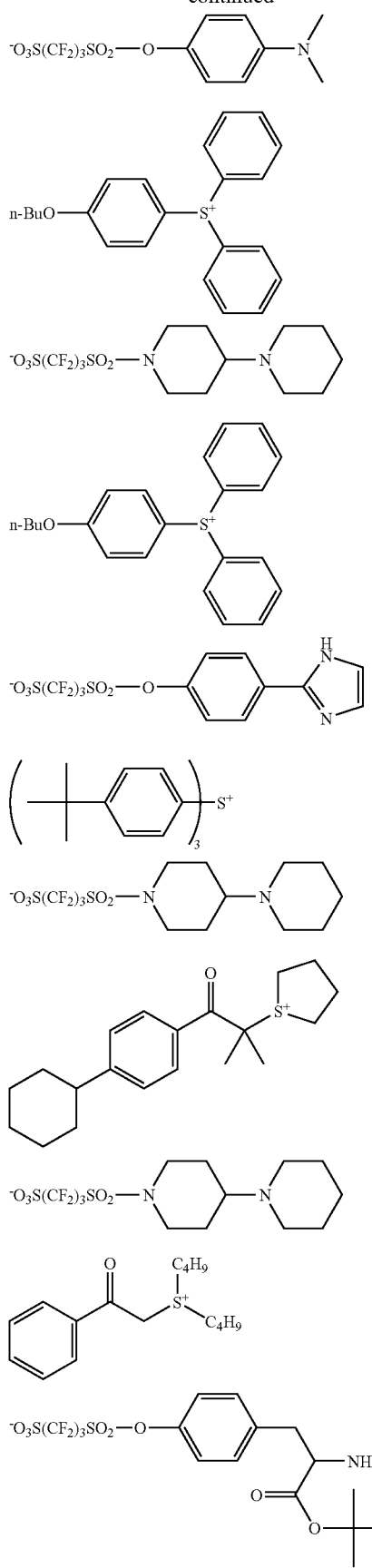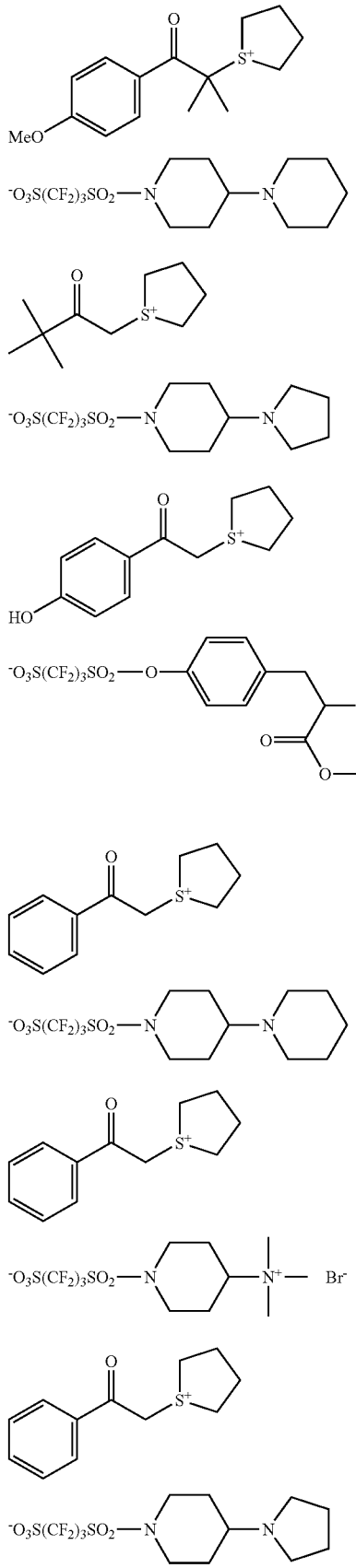

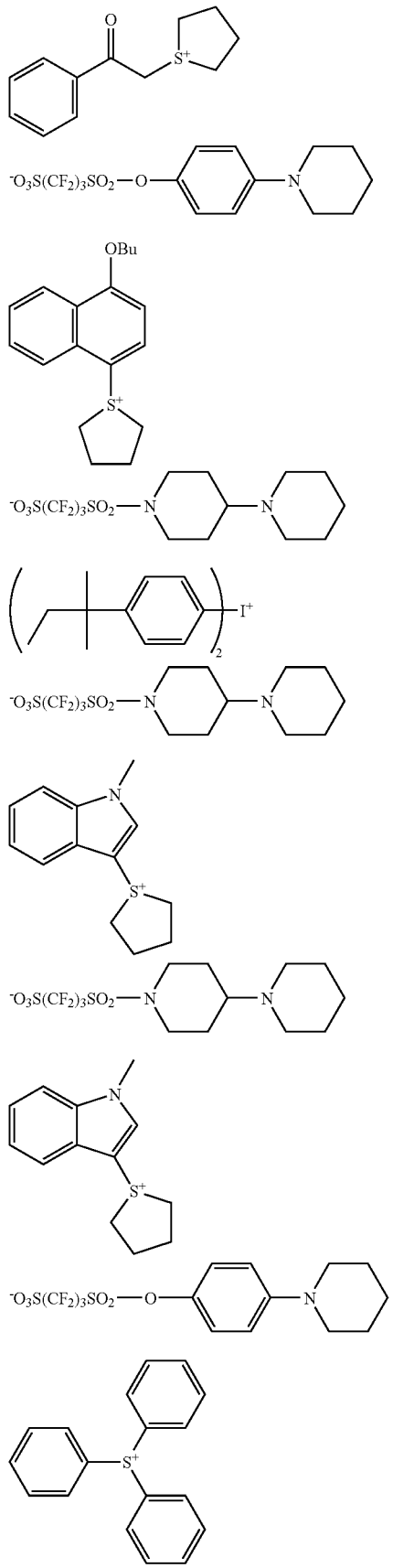

-continued
(PA-37)
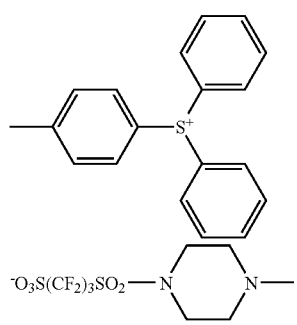
(PA-38)
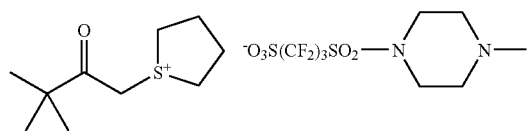
(PA-39)
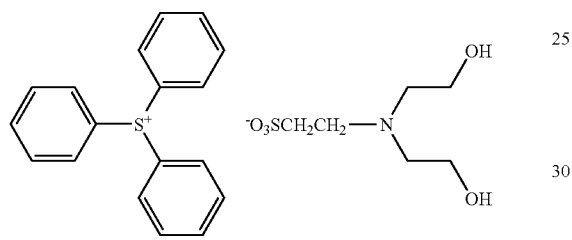
(PA-40)
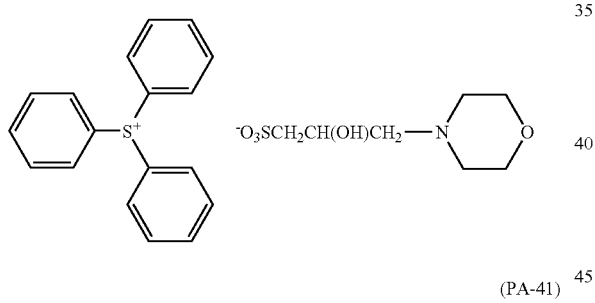
(PA-41)
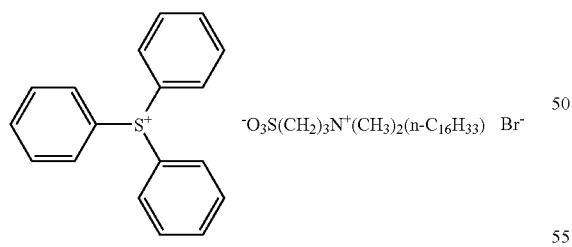
(PA-42)
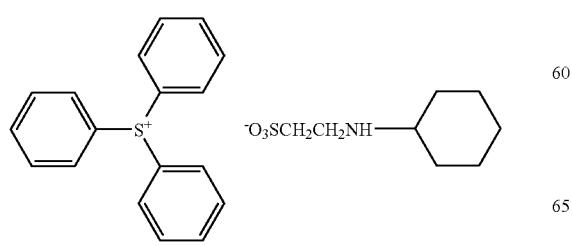
-continued
(PA-43)
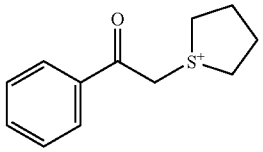
$^-O_3S(CH_2)_3N^+(CH_3)_2(n\text{-}C_{16}H_{33})$   Br$^-$
(PA-44)
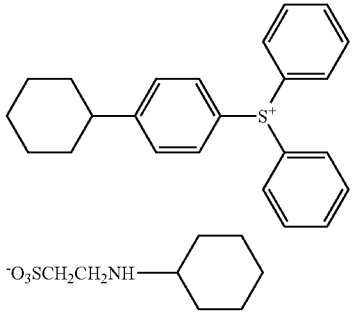
(PA-45)
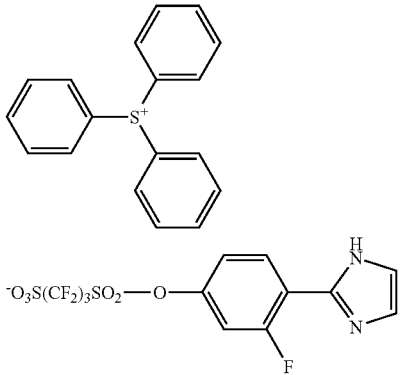
(PA-46)
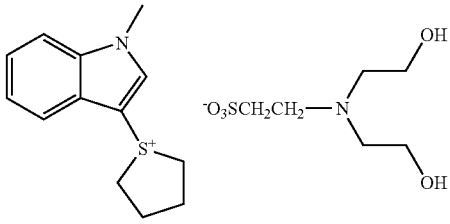
(PA-47)
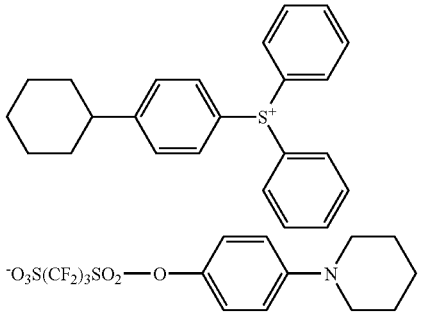
(PA-48)
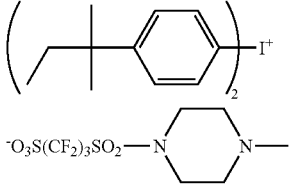

(PA-49)

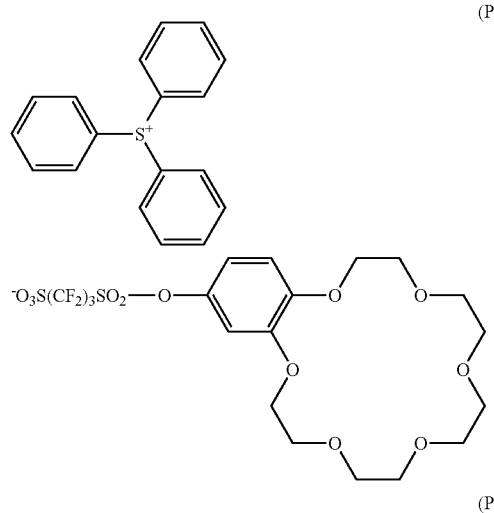

(PA-50)

(PA-51)

(PA-52)

(PA-53)

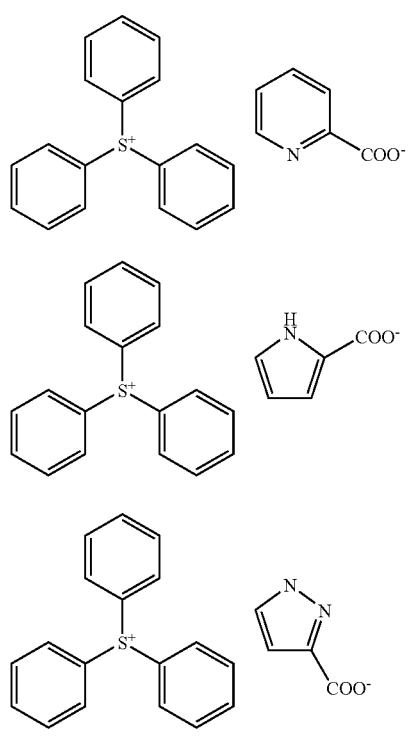

(PA-54)

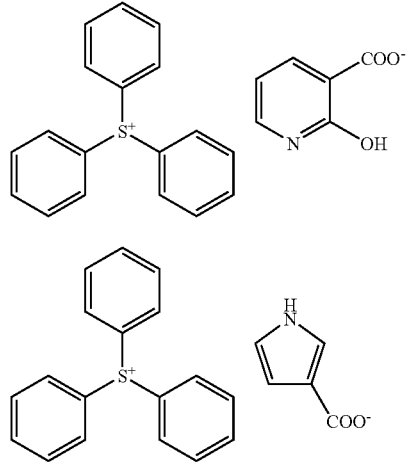

(PA-55)

(PA-56)

(PA-57)

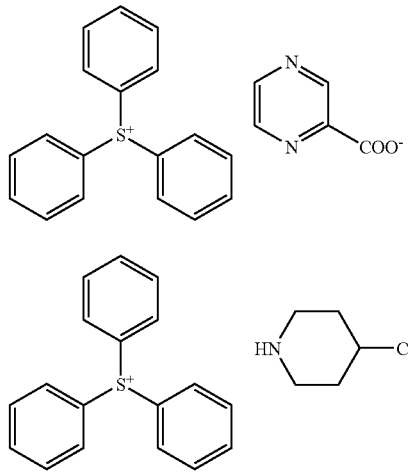

(PA-58)

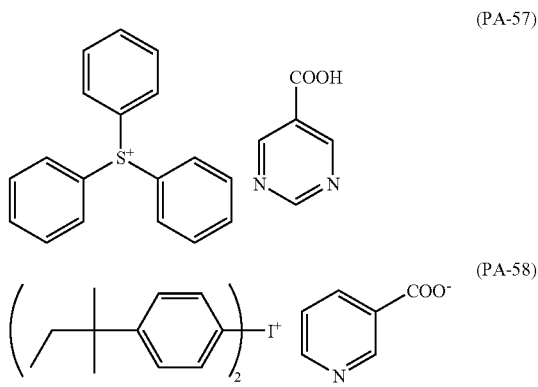

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 or JP-A-2003-246786.

Specific examples of the compound (PA) capable of generating a compound represented by formula (PA-II) upon irradiation with actinic rays or radiation are set forth below, but the present invention is not limited thereto.

(PA-59)

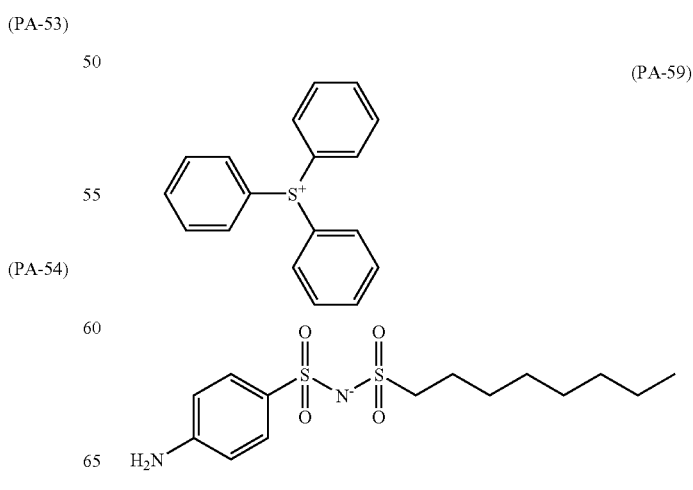

(PA-60)
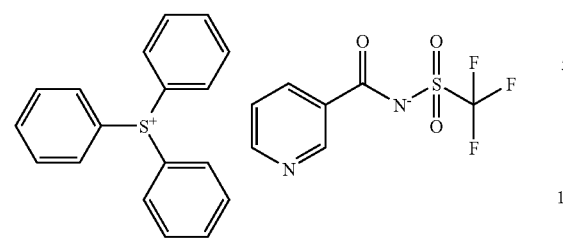
(PA-61)
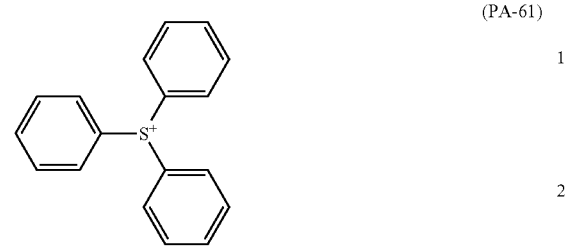
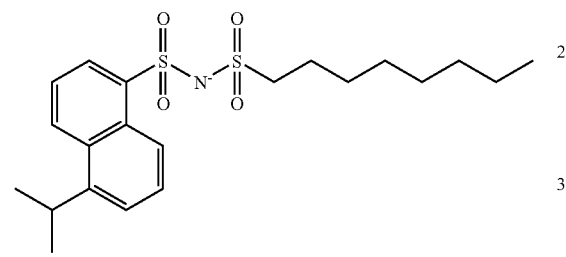
(PA-62)
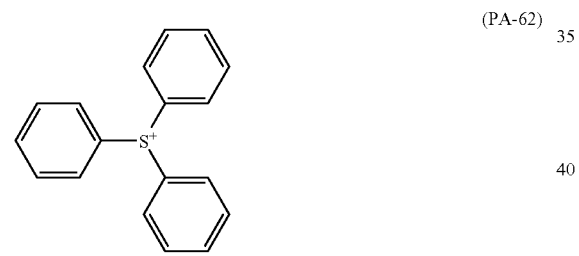
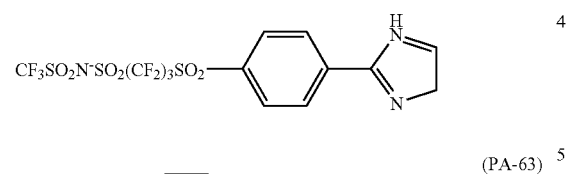
(PA-63)
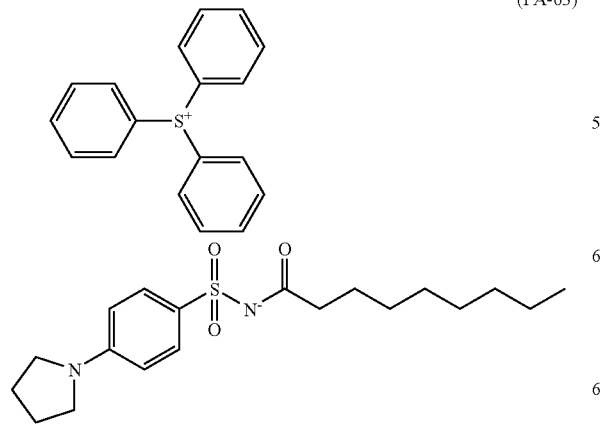
(PA-64)
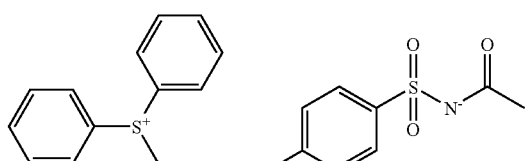
(PA-65)
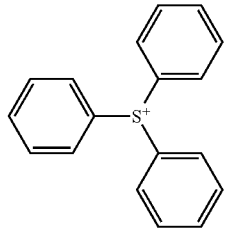
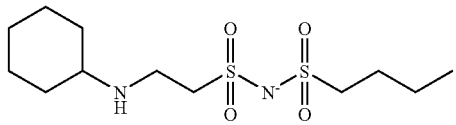
(PA-66)
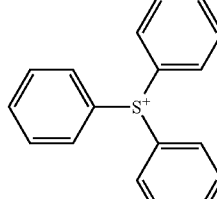
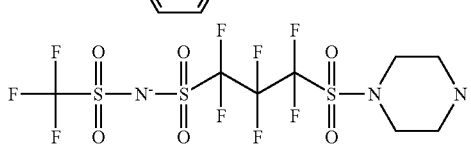
(PA-67)
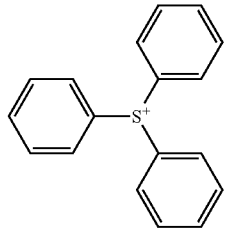
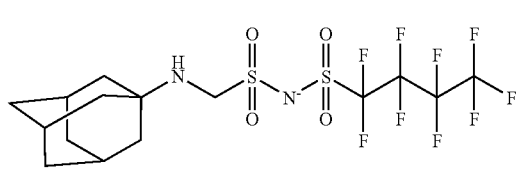
(PA-68)
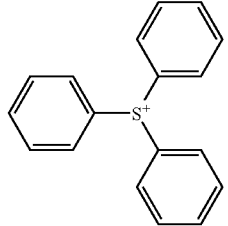

-continued
(PA-69)
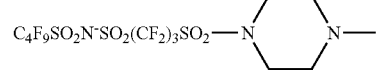
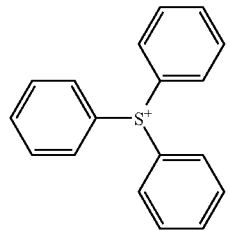
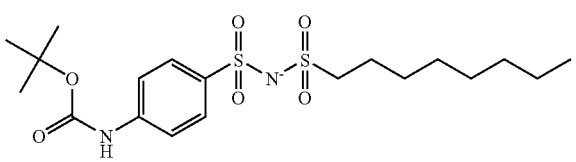
(PA-70)
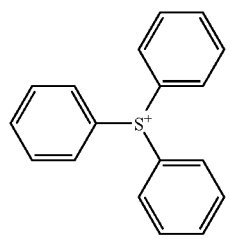
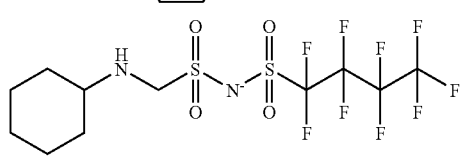
(PA-71)
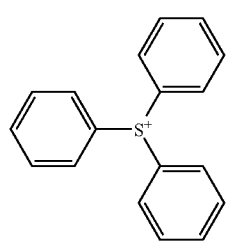
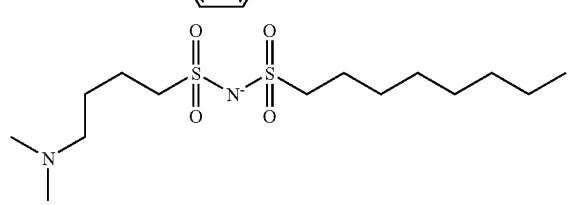
(PA-72)
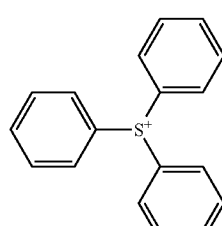
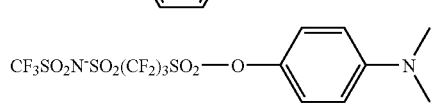
-continued
(PA-73)
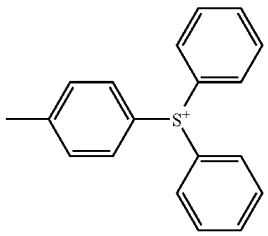
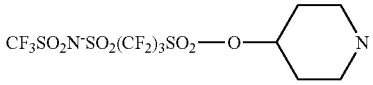
(PA-74)
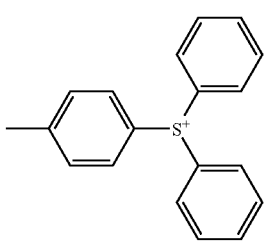
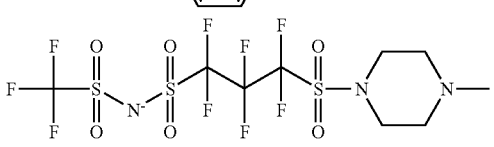
(PA-75)
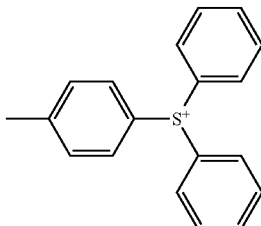
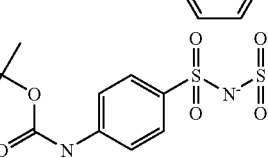
(PA-76)
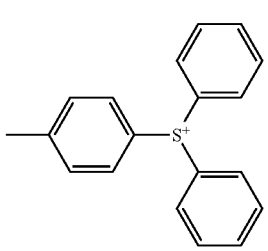
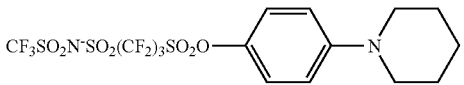
(PA-77)
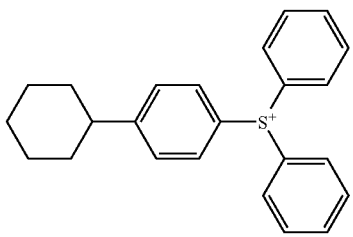

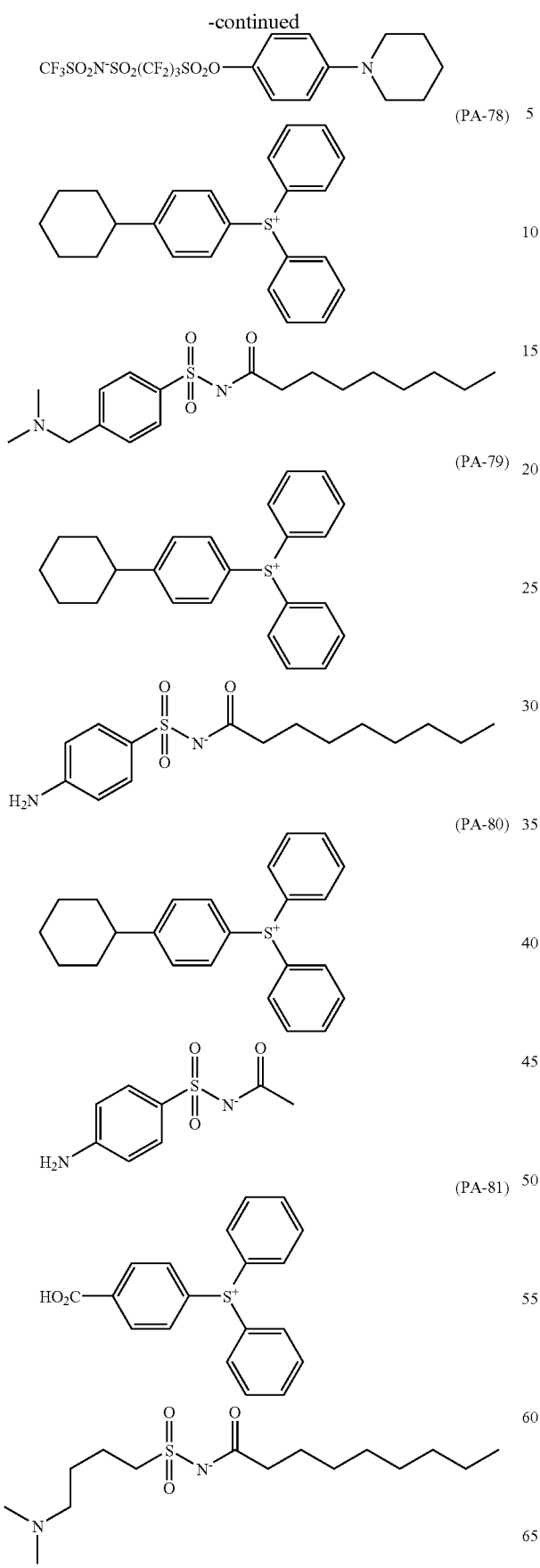
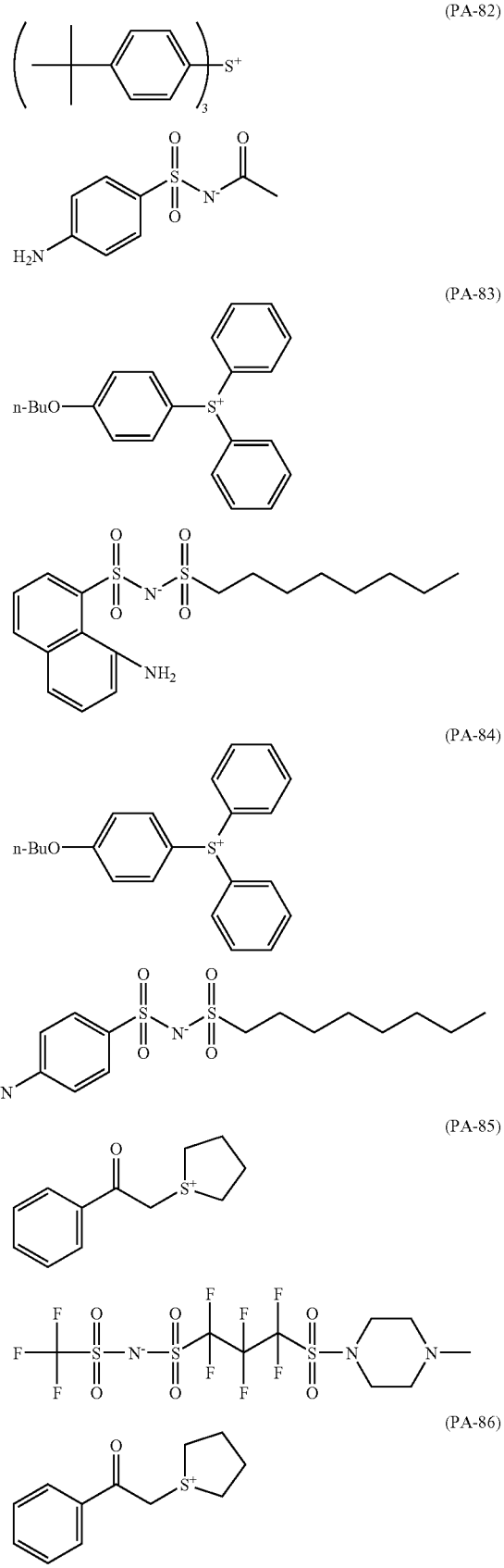

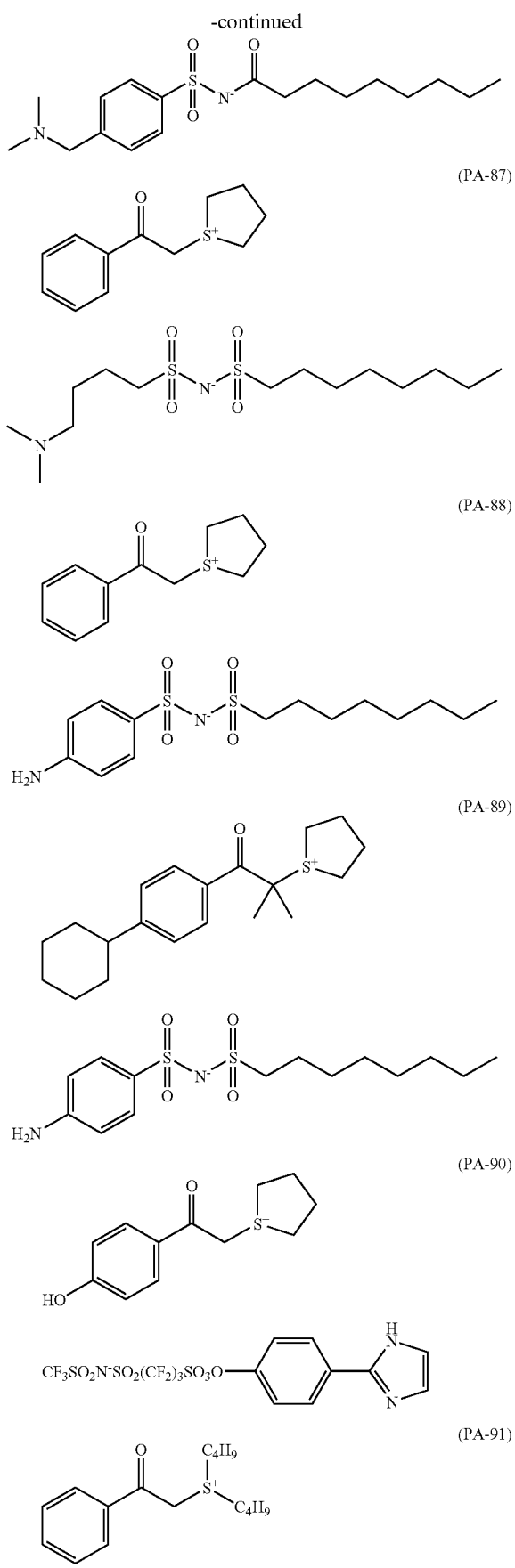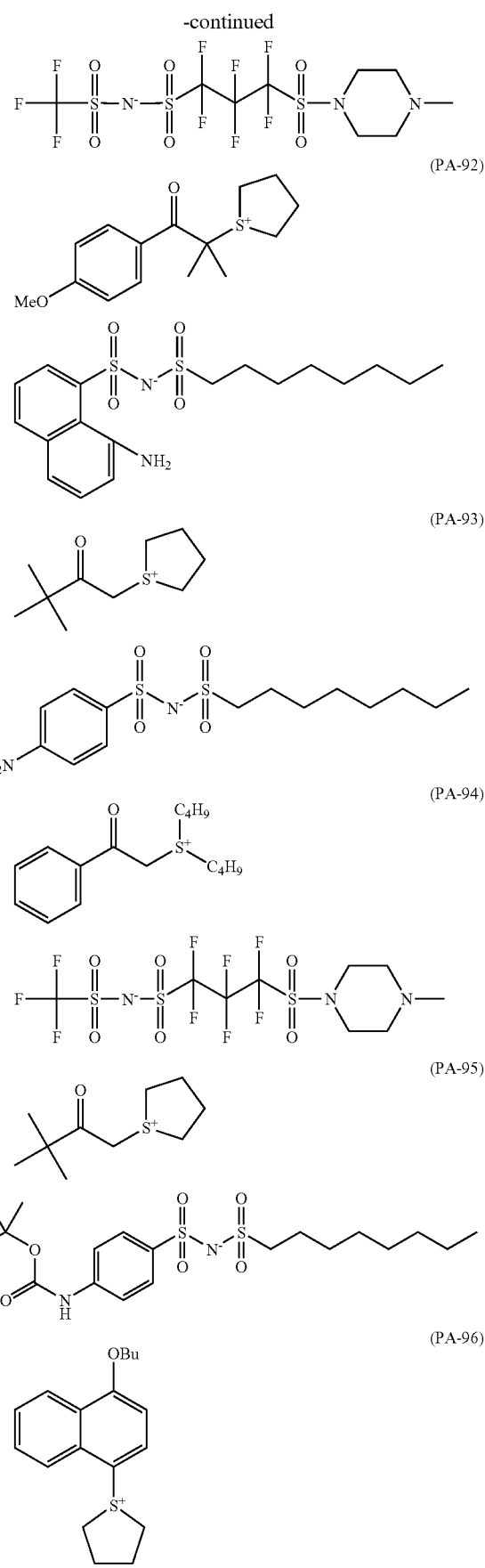

-continued

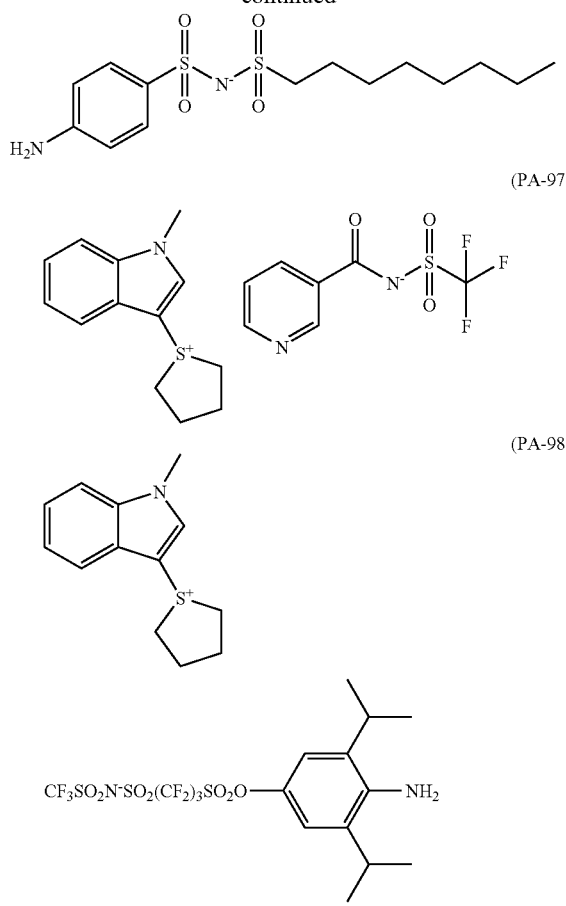

(PA-97)
(PA-98)
(PA-99)
(PA-100)

-continued

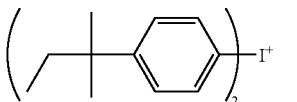
(PA-101)

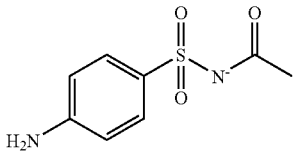

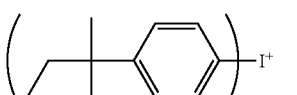
(PA-102)

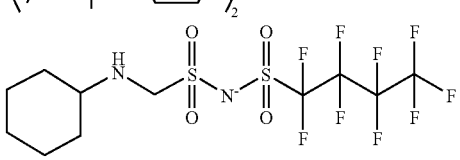

These compounds can be easily synthesized using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) can be synthesized by reacting an amine or alcohol with an anhydride (e.g., (R'O$_2$C)$_2$O, R'O$_2$CCl) or an acid chloride compound under basic conditions.

The content of the compound (PA) in the positive resist composition of the present invention is preferably from 0.1 to 20 mass %, more preferably from 0.1 to 10 mass %, based on the solid content of the composition.

[4] Organic Basic Compound

The organic basic compound contained in the resist composition of the present invention is a compound having basicity stronger than that of phenol. The molecular weight of the organic basic compound is usually from 200 to 1000, preferably from 200 to 800, more preferably from 200 to 700. In particular, a nitrogen-containing basic compound is preferred.

Preferred organic basic compounds are, in terms of preferred chemical environment, compounds having a structure of the following formulae (A) to (E). The structure of formulae (B) to (E) may be a part of a ring structure.

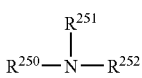
(A)

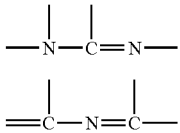
(B)

(C)

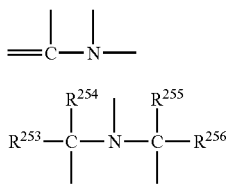

(E)

In the formulae above, each of $R^{250}$, $R^{251}$ and $R^{252}$, which may be the same or different, represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{251}$ and $R^{252}$ may combine together to form a ring.

The alkyl group above may be unsubstituted or may have a substituent, and the alkyl group having a substituent is preferably an aminoalkyl group having a carbon number of 1 to 6 or a hydroxyalkyl group having a carbon number of 1 to 6.

Each of $R^{253}$, $R^{254}$, $R^{255}$ and $R^{256}$, which may be the same or different, represents an alkyl group having a carbon number of 1 to 6.

The compound is preferably a nitrogen-containing basic compound having two or more nitrogen atoms differing in the chemical environment within one molecule, more preferably a compound having both a substituted or unsubstituted amino group and a ring structure containing a nitrogen atom, or a compound having an alkylamino group.

Furthermore, the compound includes at least one nitrogen-containing compound selected from an amine compound having a phenoxy group, an ammonium salt compound having a phenoxy group, an amine compound having a sulfonic acid ester group, and an ammonium salt compound having a sulfonic acid ester group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are an amine compound or ammonium salt compound having a phenoxy group at the terminal opposite the nitrogen atom of the alkyl group. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

Specific preferred examples of the organic basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. These compounds each may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen-containing basic compound can also be used. Among these compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred. One of these nitrogen-containing basic compounds is used alone, or two or more thereof are used in combination.

As for the ratio between the amount of the acid generator (when two or more kinds of acid generators are used in combination, the total amount thereof) and the amount of the organic basic compound used in the composition, the ratio of organic basic compound/acid generator (by mol) is preferably from 0.1 to 0.5. That is, the molar ratio is preferably 0.5 or less in view of sensitivity and resolution and is preferably 0.1 or more from the standpoint of suppressing reduction in the resolution due to thickening of the resist pattern with aging after exposure until heat treatment. The ratio of organic basic compound/acid generator (by mol) is more preferably from 0.15 to 0.4, still more preferably from 0.2 to 0.3.

[5] Surfactant

The resist composition of the present invention preferably further contains any one of fluorine-containing and/or silicon-containing surfactants (a fluorine-containing surfactant, a silicon-containing surfactant, and a surfactant containing both a fluorine atom and a silicon atom), or two or more thereof.

By incorporating a fluorine- and/or silicon-containing surfactant into the resist composition of the present invention, a resist pattern with good sensitivity, resolution and adherence as well as less development defects can be obtained when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples thereof include, as the commercially available surfactant, Megaface F178, F-470, F-473, F-475, F-476 and F-472 (produced by Dainippon Ink & Chemicals, Inc.) and further include a copolymer of a C$_6$F$_{13}$ group-containing acrylate (or methacrylate) with a (poly(oxyalkylene))acrylate (or methacrylate), a copolymer of a C$_6$F$_{13}$ group-containing acrylate (or methacrylate) with a (poly(oxyethylene))acrylate (or methacrylate) and a (poly(oxypropylene))acrylate (or methacrylate), a copolymer of a C$_8$F$_{17}$ group-containing acrylate (or methacrylate) with a (poly(oxyalkylene))acrylate (or methacrylate), and a copolymer of a C$_8$F$_{17}$ group-containing acrylate (or methacrylate) with a (poly(oxyethylene))acrylate (or methacrylate) and a (poly(oxypropylene))acrylate (or methacrylate).

The preferred surfactant includes a surfactant represented by the following formula (Da):

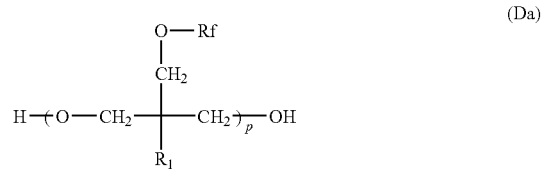

In formula (Da), Rf represents a fluoroalkyl group.

R$_1$ represents a hydrogen atom or an alkyl group.

p represents an integer of 1 to 30.

In formula (Da), the fluoroalkyl group of Rf is preferably a fluoroalkyl group having a carbon number of 1 to 10. In the fluoroalkyl group, all hydrogen atoms may be substituted by a fluorine atom, or a part of hydrogen atoms may be substituted by a fluorine atom. The fluoroalkyl group may have an oxy group midway in the alkyl group. Examples of the fluoroalkyl group of Rf include —CF$_3$, —C$_2$F$_5$, —C$_3$F$_7$, —C$_4$F$_9$, —CH$_2$CF$_3$, —CH$_2$C$_2$F$_5$, —CH$_2$C$_3$F$_7$, —CH$_2$C$_4$F$_9$, —CH$_2$C$_6$F$_{13}$, —C$_2$H$_4$CF$_3$, —C$_2$H$_4$C$_2$F$_5$, —C$_2$H$_4$C$_4$F$_9$, —$C_2H_4C_6F_{13}$,  —$C_2H_4C_8F_{17}$,  —$CH_2CH(CH_3)CF_3$, —$CH_2CH(CF_3)_2$,  —$CH_2CF(CF_3)_2$,  —$CH_2CH(CF_3)_2$, —$CF_2CF(CF_3)OCF_3$,  —$CF_2CF(CF_3)OC_3F_7$, —$C_2H_4OCF_2CF(CF_3)OCF_3$, —$C_2H_4OCF_2CF(CF_3)OC_3F_7$ and —$C(CF_3)=C(CF(CF_3)_2)_2$.

The alkyl group of $R_1$ is preferably a linear alkyl group having a carbon number of 1 to 5.

Specific examples of the surfactant represented by formula (Da) are set forth below, but the present invention is not limited thereto.

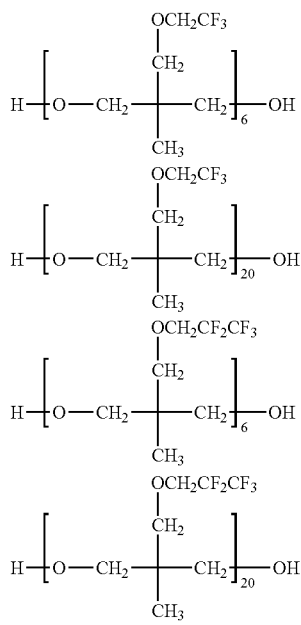

The amount added of the surfactant is preferably from 0.0001 to 2 mass %, more preferably from 0.001 to 1 mass %, based on the entire amount (excluding the solvent) of the resist composition.

[6] Antioxidant:

The resist composition of the present invention preferably contains an antioxidant.

The antioxidant is added for preventing the organic material from being oxidized in the presence of oxygen.

The antioxidant is not particularly limited as long as it is an antioxidant used in general and has an effect of preventing oxidation of a plastic and the like, and examples thereof include a phenol-based antioxidant, an antioxidant composed of an organic acid derivative, a sulfur-containing antioxidant, a phosphorus-based antioxidant, an amine-based antioxidant, an antioxidant composed of an amine-aldehyde condensate, and an antioxidant composed of an amine-ketone condensate. Out of these antioxidants, in order to bring out the effects of the present invention without reducing the functions of the resist, the antioxidant is preferably a phenol-based antioxidant or an antioxidant composed of an organic acid derivative.

Specific preferred examples of the antioxidant for use in the present invention include 2,6-di-tert-butyl-4-methylphenol, 4-hydroxymethyl-2,6-di-tert-butylphenol, 2,2'-methylenebis(4-methyl-6-tert-butylphenol), butylhydroxyanisole, tert-butyl hydroquinone, 2,4,5-trihydroxybutyrophenone, nordihydroguajaretic acid, propyl gallate, octyl gallate, lauryl gallate and isopropyl citrate. Among these, 2,6-di-tert-butyl-4-methylphenol, 4-hydroxymethyl-2,6-di-tert-butylphenol, butylhydroxyanisole and tert-butyl hydroquinone are preferred, and 2,6-di-tert-butyl-4-methylphenol and 4-hydroxymethyl-2,6-di-tert-butylphenol are more preferred.

The content of the antioxidant in the chemical amplification resist composition is preferably 1 ppm or more, more preferably 5 ppm or more, still more preferably 10 ppm or more, yet still more preferably 50 ppm or more, even yet still more preferably 100 ppm or more, and still more preferably from 100 to 10,000 ppm. A plurality of antioxidants may be mixed and used.

[7] Solid Content Concentration and (D) Solvent

The resist composition of the present invention is prepared by dissolving the above-described components in a solvent.

The resist composition is stored, for example, in a refrigerated state or at room temperature and preferably causes no change in the performance during the storage period, but there is a problem that the sensitivity fluctuates after storage.

In the construction of the present invention, the entire solid content concentration in the resist composition is adjusted to be from 1.0 to 4.5 mass %.

The entire solid content concentration in the resist composition is preferably from 1.5 to 3.5 mass %.

The entire solid content corresponds to the content after removing the solvent from the composition and corresponds to the mass of the coating film after drying.

The solvent for the preparation of the resist composition is preferably an organic solvent such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran, more preferably cyclohexanone, γ-butyrolactone, propylene glycol monomethyl ether, propylene glycol monomethyl ether acetate or ethyl lactate, still more preferably propylene glycol monomethyl ether.

The solvent may be one kind of a solvent alone or may be a mixed solvent obtained by mixing two or more kinds of solvents.

Out of the entire solvent amount, propylene glycol monomethyl ether is preferably contained in a ratio of 50 mass % or more, most preferably from 60 to 80 mass %.

[8] Other Components

The resist composition of the present invention may further contain a dye, a photo-base generator and the like, if desired.

[9] Pattern Forming Method

The resist composition of the present invention is coated on a substrate to form a thin film. The thickness of this coating film may be appropriately changed according to the purpose, but particularly in the case of forming a micropattern, the thickness of the coating film is preferably from 30 to 120 nm, more preferably from 40 to 100 nm, still more preferably from 50 to 90 nm. The method for coating the resist composition on a substrate is preferably spin coating, and the rotation number thereof is preferably from 1,000 to 3,000 rpm.

In the present invention, a commercially available inorganic or organic antireflection film may be used, if desired. Furthermore, the antireflection film may be used by coating it as an overlayer or underlayer of the resist.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV30 Series and DUV-40 Series produced by Brewer Science, Inc., or AR-2, AR-3 and AR-5 produced by Shipley Co., Ltd.

In regard to the organic antireflection film as an overlayer of the resist, an organic antireflection film such as AQUATAR-II, AQUATAR-III and AQUATAR-VII produced by AZ Electronic Materials may be used.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon an actinic ray or radiation such as electron beam, EUV light or X-ray, and then subjecting the resist film to heating, development, rinsing and drying, whereby a good resist pattern can be formed.

The alkali developer which can be used in the development is an aqueous solution of alkalis (usually from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis may also be used after adding thereto an appropriate amount of alcohols such as isopropyl alcohol or a surfactant such as nonionic surfactant.

Among these developers, a quaternary anunonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Examples 1-1 to 1-40 and Comparative Examples 1-41 to 1-43

<Preparation of Resist>

The components shown in Table 1 below are dissolved in a mixed solvent shown in Table 1, and the obtained solution is filtered through a polytetrafluoro-ethylene filter having a pore size of 0.1 µm to prepare a positive resist solution having an entire solid content concentration shown in Table 1. This resist solution is evaluated as follows.

The "%" for each component shown in Table 1 is mass % on the basis of entire solid content.

The solid content concentration of the resin is an amount obtained by removing the photo-acid generator, basic compound and surfactant from the amount of all solid contents in the resist composition.

<Evaluation of Resist>

The positive resist solution prepared is uniformly coated on a hexamethyldisilazane-treated silicon substrate by using a spin coater and dried under heating at 120° C. for 60 seconds on a hot plate to form a 80 nm-thick resist film.

[Sensitivity]

The resist film is irradiated using an electron beam projection lithography apparatus (accelerating voltage: 100 keV) manufactured by Nikon Corp., then subjected to surface exposure by changing the exposure amount in steps of 1 $\mu C/cm^2$ in a range from 0 to 30 $\mu C/cm^2$, further baked at 110° C. for 90 seconds and thereafter, developed with an aqueous 2.38 mass % tetramethylammonium hydroxide (TMAH) solution. The exposure amount ($\mu C/cm^2$) giving a film thickness of 0 is determined.

[Exposure Latitude (EL)]

EL is expressed by the rate of change of exposure amount required for the line width to change by 10% based on a line width of 150 nm in the exposure of a 1/1 line-and-space pattern. That is, the exposure amount variation for the 10% change of the line width of 150 nm is divided by the exposure amount for reproducing 150 nm and the value obtained is multiplied by 100%. Here, in this evaluation, the process after exposure is performed in the same manner as in [Sensitivity] above.

[EL/Sensitivity]

As for the "EL/sensitivity" value shown in Table 1, higher EL and smaller sensitivity are preferred, and a larger "EL/sensitivity" value indicates that both EL and sensitivity are satisfied.

[Change of Thickness of Coating Film]

The thickness of the coating film coated at a spin rotation number necessary for forming a 80 nm-thick film immediately after the preparation of the resist film is measured after storing the resist solution at 23° C. for 2 months, and the difference from 80 nm is examined. That is, the film thickness difference is divided by 80 nm and the value obtained is multiplied by 100%. This change indicates the change of viscosity of the resist solution and is indicative of the change with aging of the resist composition.

Resins used in Examples are synthesized by the following methods.

Synthesis Example 1

Synthesis of Resin (RB-19)

p-Acetoxystyrene and (4'-hydroxyphenyl)methacrylate are charged at a ratio of 60/40 (mol fraction) and dissolved in tetrahydrofuran to prepare 100 mL of a solution having a solid content concentration of 20 mass %. To this solution, 3 mol % of methyl mercaptopropionate and 4 mol % of a polymerization initiator, V-65, produced by Wako Pure Chemical Industries, Ltd. are added, and the resulting solution is added dropwise to 10 mL of tetrahydrofuran heated to 60° C., over 4 hours in a nitrogen atmosphere. After the completion of dropwise addition, the reaction solution is heated for 4 hours, and 1 mol % of V-65 is again added, followed by stirring for 4 hours. When the reaction is completed, the reaction solution is cooled to room temperature and after crystallization in 3 L of hexane, the precipitated white powder is collected by filtration.

The compositional ratio of the polymer determined from $C^{13}$NMR is 58/42. Also, the weight average molecular weight determined by GPC is 2,200 in terms of standard polystyrene, and the polydispersity (Mw/Mn) is 1.30.

The resin obtained is vacuum-dried and then dissolved in 100 ml of dehydrated THF (tetrahydrofuran), and 10 ml of cyclohexyl vinyl ether is added thereto. While stirring the resulting solution, 100 mg of p-toluenesulfonic acid is added, and the reaction is allowed to proceed for 3 hours. The reaction solution is neutralized by adding 1 ml of triethylamine, and then, liquid separation and washing are repeated three times by adding 200 ml of ethyl acetate and further adding 500 ml of distilled water. The ethyl acetate layer is reprecipitated from hexane to obtain the objective resin RB-19 (compositional molar ratio: 43/15/32/10, weight average molecular weight: 2,500, polydispersity: 1.30). The glass transition temperature of the resin is measured by DSC and found to be 110° C.

Other resins are synthesized by the same method.

[Acid-Decomposable Resin]

The structure, molecular weight and polydispersity of acid-decomposable resins used in Examples are shown below.

(RB-1)

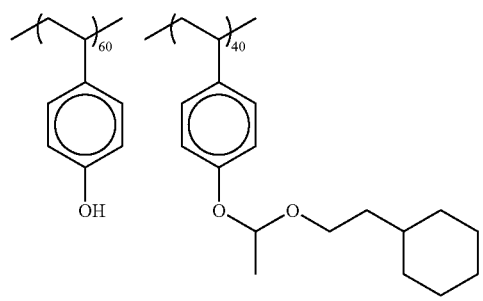

Mw 10000
Mw/Mn 1.4

(RB-2)

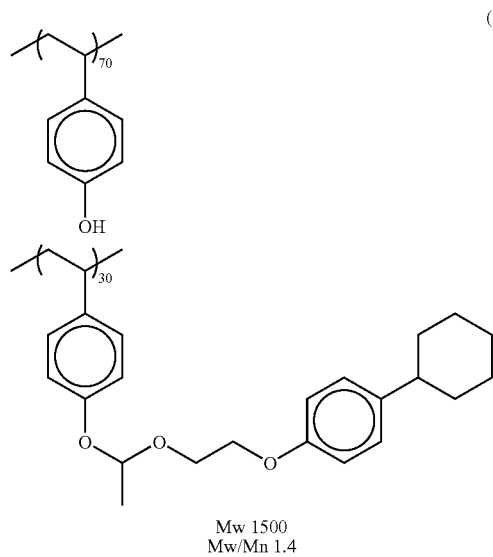

Mw 1500
Mw/Mn 1.4

(RB-3)

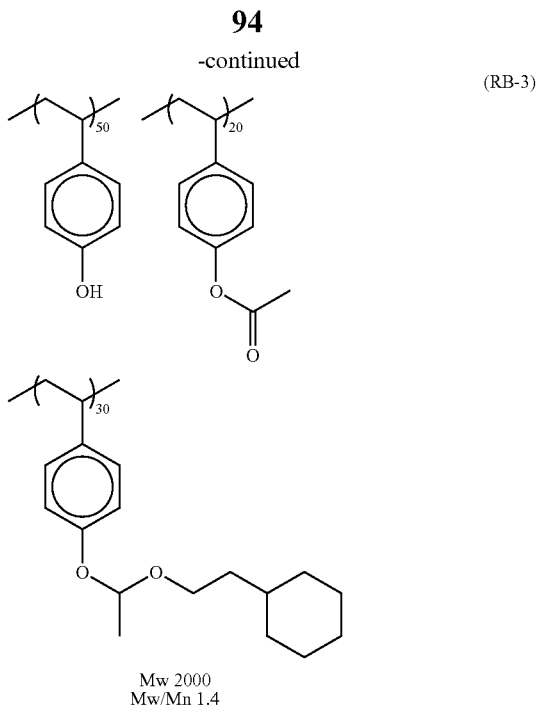

Mw 2000
Mw/Mn 1.4

(RB-4)

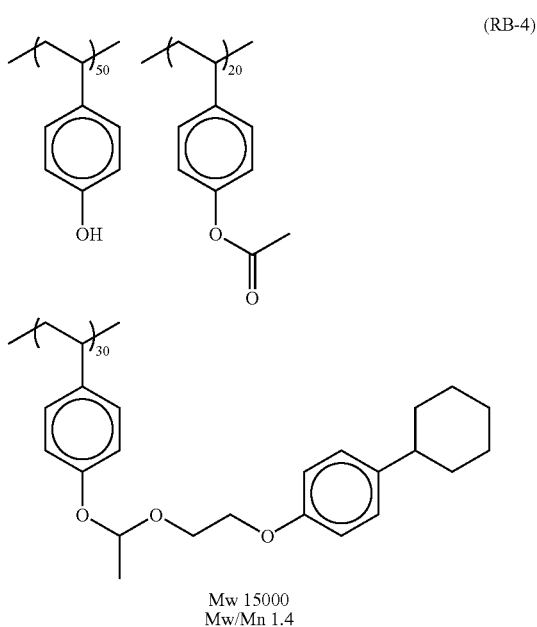

Mw 15000
Mw/Mn 1.4

(RB-5)

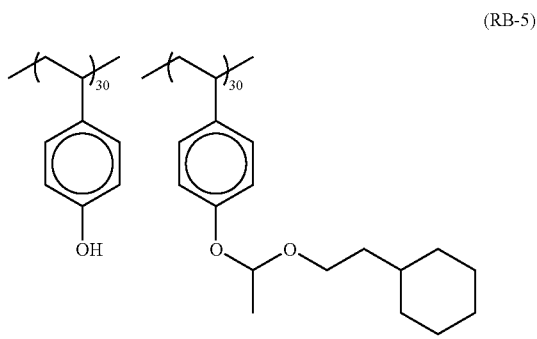

-continued
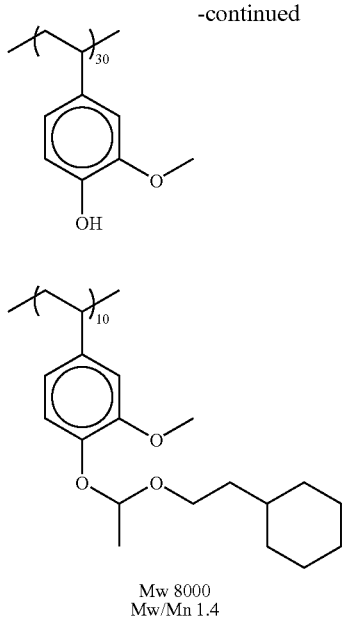
Mw 8000
Mw/Mn 1.4
(RB-6)
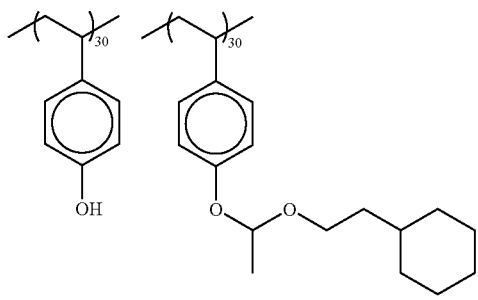
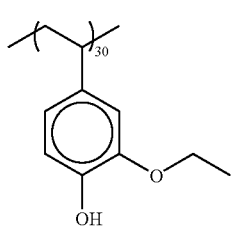
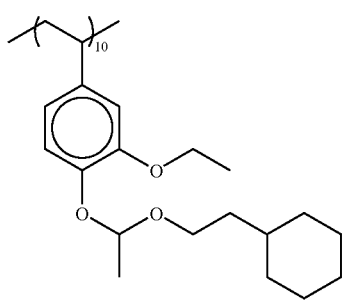
Mw 15000
Mw/Mn 1.4
-continued
(RB-7)
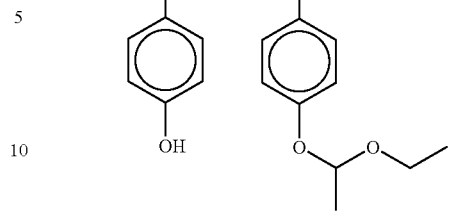
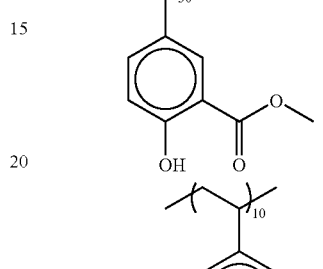
Mw 2500
Mw/Mn 1.4
(RB-8)
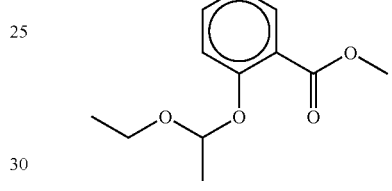
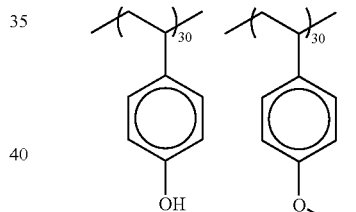
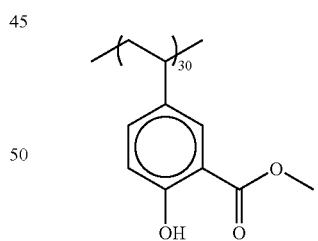
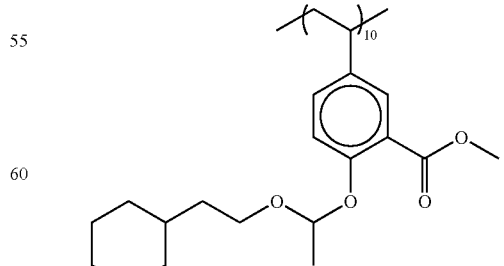
Mw 2500
Mw/Mn 1.4

-continued
(RB-9)
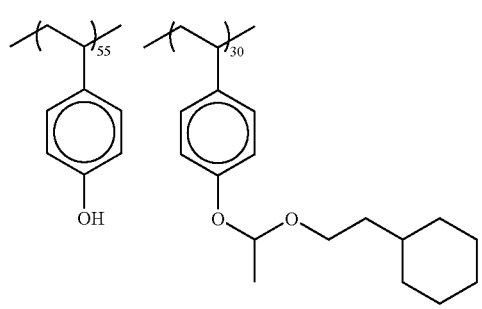
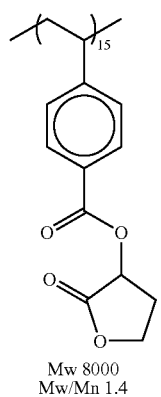
Mw 8000
Mw/Mn 1.4
(RB-10)
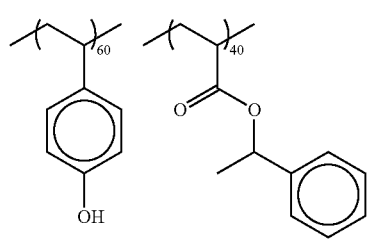
Mw 8000
Mw/Mn 1.4
(RB-11)
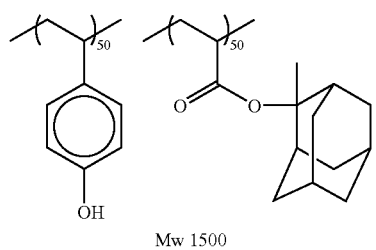
Mw 1500
Mw/Mn 1.4
(RB-12)
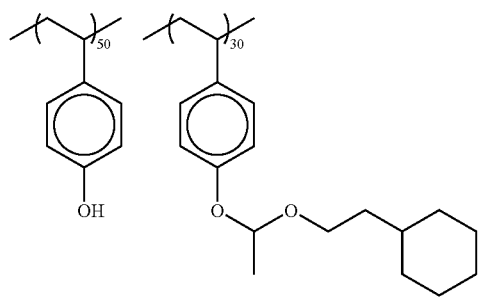
-continued
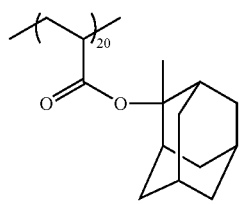
Mw 8000
Mw/Mn 1.4
(RB-13)
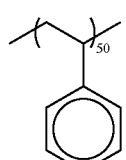
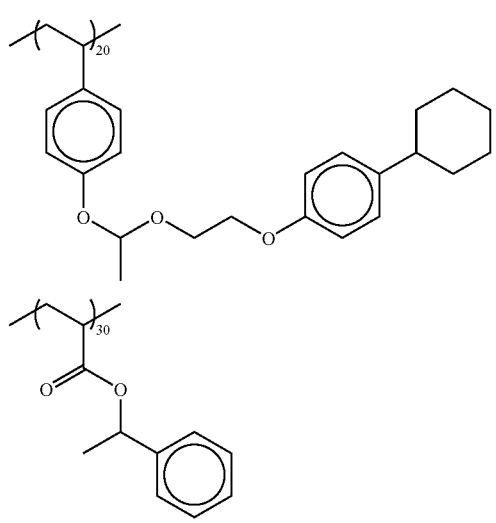
Mw 8000
Mw/Mn 1.4
(RB-14)
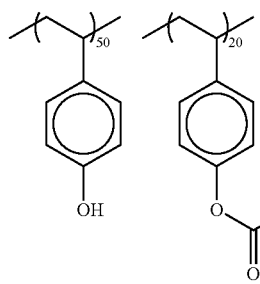
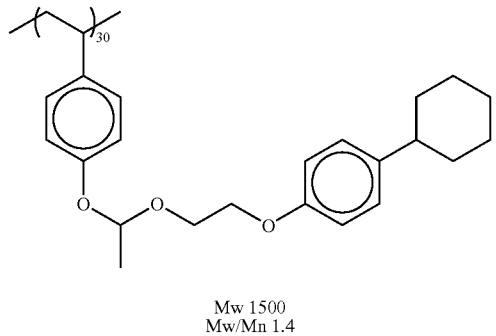
Mw 1500
Mw/Mn 1.4

(RB-15)
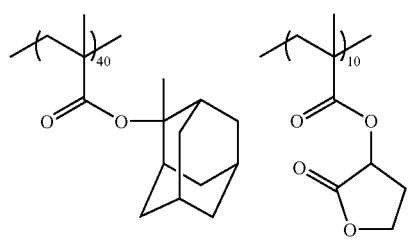
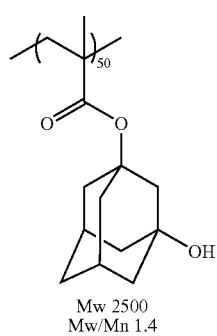
Mw 2500
Mw/Mn 1.4
(RB-16)
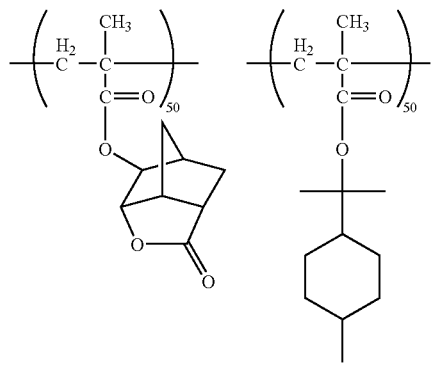
Mw 8000
Mw/Mn 1.4
(RB-17)
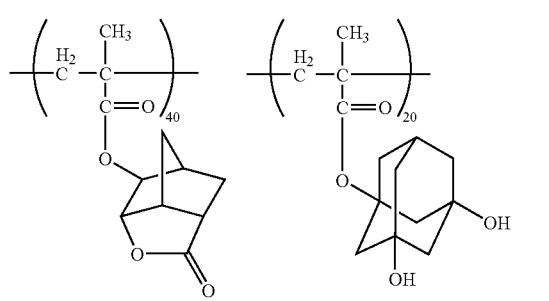
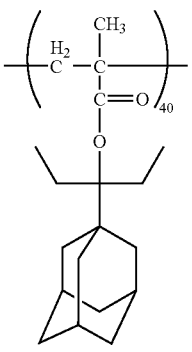
Mw 2500
Mw/Mn 1.4
(RB-18)
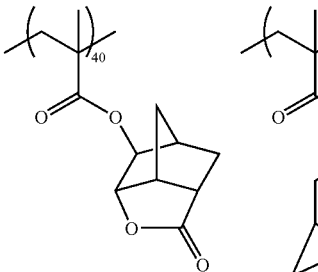
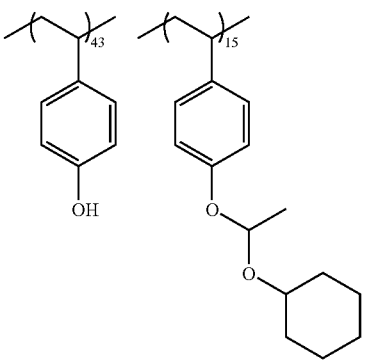
Mw 2500
Mw/Mn 1.4
(RB-19)

-continued
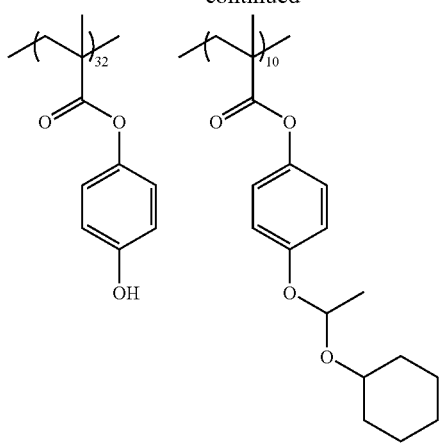
Mw: 2500
Mw/Mn: 1.30
(RB-20)
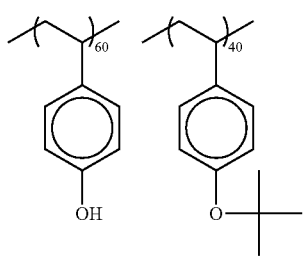
Mw: 10,000
Mw/Mn: 1.4
(RB-21)
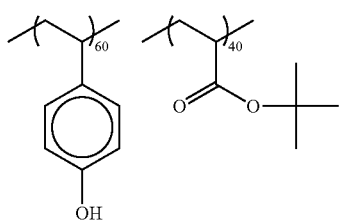
Mw: 1,500
Mw/Mn: 1.4
(RB-22)
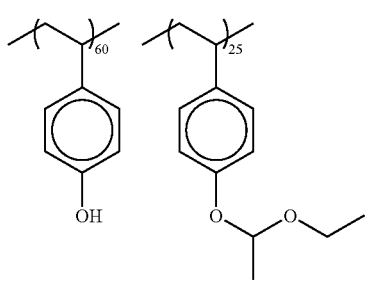
Mw: 2,000
Mw/Mn: 1.4
[Acid Generator]
The acid generators shown in Table 1 correspond to those illustrated above except for BC-1 to BC-4 which are shown below.
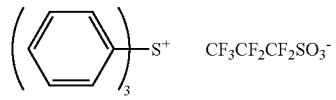
BC-1
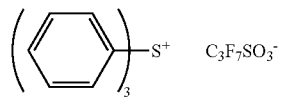
BC-2
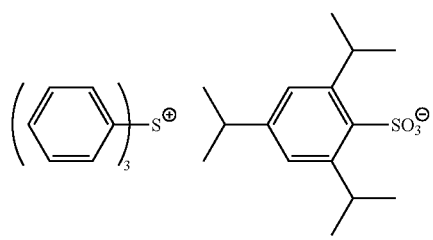
BC-3
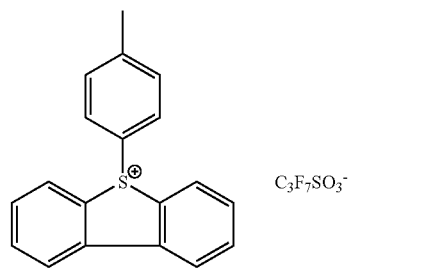
BC-4
[Basic Compound]
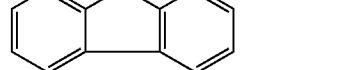
A-1
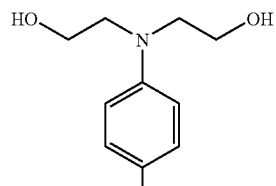
Mw: 195
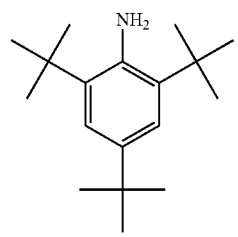
A-2
Mw: 261

-continued

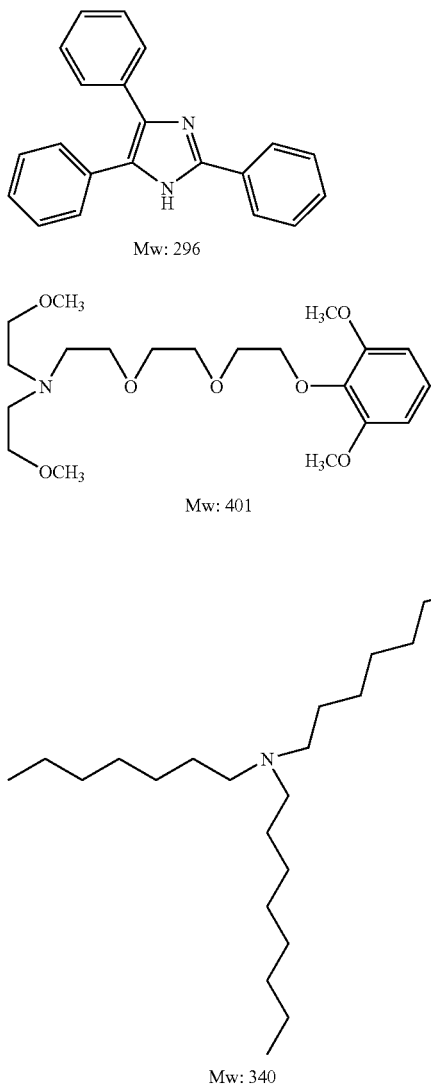

A-3, Mw: 296
A-4, Mw: 401
A-5, Mw: 340

-continued

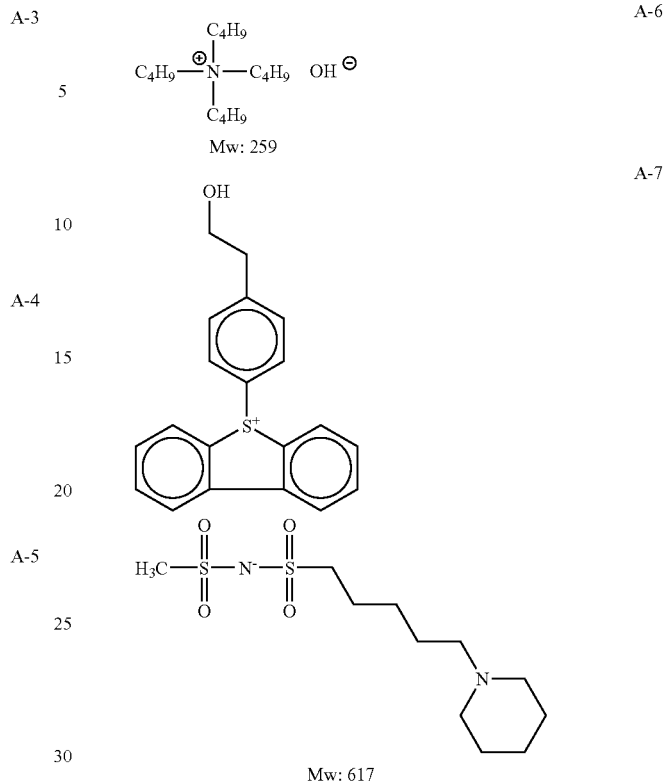

A-6, Mw: 259
A-7, Mw: 617

[Surfactant]
W-1: Megaface F-176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)

[Solvent]
A: propylene glycol monomethyl ether acetate/propylene glycol monomethyl ether=4/6 (by mass)
B: ethyl lactate/propylene glycol monomethyl ether=5/5 (by mass)

TABLE 1

|  | Resin | Acid Generator (mass %) | Basic Compound (molar number based on (B)) | Surfactant (0.01 mass %) | Solvent | Entire Solid Content Concentration (mass %) | Sensitivity | EL | EL/Sensitivity | Change of Thickness of Coating Film with Aging of 2 Months at Room Temperature |
|---|---|---|---|---|---|---|---|---|---|---|
| 1-1 | RB-11 | B-4 (13) | A-4 (0.24) | W-1 | A | 2.5 | 10.6 | 15.8 | 1.49 | 0.8 |
| 1-2 | RB-11 | B-4 (19) | A-4 (0.24) | W-1 | A | 2.5 | 8.9 | 13.6 | 1.53 | 0.4 |
| 1-3 | RB-11 | B-4 (22) | A-4 (0.24) | W-1 | A | 2.5 | 8.4 | 13.3 | 1.58 | 0.7 |
| 1-4 | RB-11 | B-4 (29) | A-4 (0.24) | W-1 | A | 2.5 | 7.4 | 11.8 | 1.60 | 0.5 |
| 1-5 | RB-11 | B-4 (32) | A-4 (0.24) | W-1 | A | 2.5 | 7.0 | 11.2 | 1.60 | 0.5 |
| 1-6 | RB-11 | B-4 (38) | A-4 (0.24) | W-1 | A | 2.5 | 6.6 | 10.4 | 1.57 | 1.2 |
| 1-7 | RB-11 | B-4 (45) | A-4 (0.24) | W-1 | A | 2.5 | 6.2 | 9.5 | 1.54 | 1.4 |
| 1-8 | RB-11 | B-4 (29) | A-4 (0.24) | W-1 | A | 1.4 | 7.6 | 11.0 | 1.45 | 0.8 |
| 1-9 | RB-11 | B-4 (29) | A-4 (0.24) | W-1 | A | 1.9 | 7.5 | 11.1 | 1.48 | 0.6 |
| 1-10 | RB-11 | B-4 (29) | A-4 (0.24) | W-1 | A | 3.2 | 7.5 | 11.1 | 1.48 | 0.7 |
| 1-11 | RB-11 | B-4 (29) | A-4 (0.24) | W-1 | A | 4.2 | 7.5 | 10.6 | 1.41 | 1.0 |
| 1-12 | RB-11 | B-4 (13) | A-4 (0.24) | W-1 | A | 1.4 | 10.7 | 15.3 | 1.43 | 0.9 |
| 1-13 | RB-11 | B-4 (45) | A-4 (0.24) | W-1 | A | 1.4 | 6.3 | 9.4 | 1.49 | 0.9 |
| 1-14 | RB-11 | B-4 (13) | A-4 (0.24) | W-1 | A | 4.2 | 10.8 | 15.1 | 1.40 | 0.8 |
| 1-15 | RB-11 | B-4 (45) | A-4 (0.24) | W-1 | A | 4.2 | 6.8 | 9.6 | 1.41 | 1.2 |
| 1-16 | RB-11 | B-4 (25) | A-4 (0.15) | W-1 | A | 2.8 | 5.0 | 7.3 | 1.45 | 0.4 |

TABLE 1-continued

| | Resin | Acid Generator (mass %) | Basic Compound (molar number based on (B)) | Surfactant (0.01 mass %) | Solvent | Entire Solid Content Concentration (mass %) | Sensitivity | EL | EL/ Sensitivity | Change of Thickness of Coating Film with Aging of 2 Months at Room Temperature |
|---|---|---|---|---|---|---|---|---|---|---|
| 1-17 | RB-11 | B-4 (25) | A-4 (0.41) | W-1 | A | 2.8 | 13.8 | 20.3 | 1.47 | 0.6 |
| 1-18 | RB-11 | B-4 (25) | A-1 (0.24) | W-1 | A | 2.4 | 7.5 | 9.4 | 1.25 | 0.8 |
| 1-19 | RB-11 | B-4 (25) | A-2 (0.24) | W-1 | A | 2.4 | 7.5 | 10.4 | 1.38 | 0.5 |
| 1-20 | RB-11 | B-4 (25) | A-3 (0.24) | W-1 | A | 2.4 | 7.4 | 11.1 | 1.50 | 0.2 |
| 1-21 | RB-11 | B-4 (25) | A-5 (0.24) | W-1 | A | 2.4 | 7.8 | 11.9 | 1.52 | 0.4 |
| 1-22 | RB-11 | B-4 (25) | A-6 (0.24) | W-1 | A | 2.4 | 8.0 | 11.7 | 1.46 | 1.0 |
| 1-23 | RB-11 | B-4 (25) | A-7 (0.24) | W-1 | A | 2.4 | 7.3 | 12.0 | 1.65 | 0.1 |
| 1-24 | RB-21 | B-4 (25) | A-7 (0.24) | W-1 | A | 2.4 | 10.3 | 14.8 | 1.44 | 0.3 |
| 1-25 | RB-18 | B-4 (15) | A-3 (0.24) | W-2 | B | 2.4 | 18.3 | 28.7 | 1.57 | 0.3 |
| 1-26 | RB-10 | B-4 (15) | A-3 (0.24) | W-2 | B | 2.4 | 13.1 | 19.1 | 1.46 | 1.6 |
| 1-27 | RB-2 | B-4 (15) | A-3 (0.24) | W-2 | B | 2.4 | 10.1 | 14.0 | 1.39 | 1.8 |
| 1-28 | RB-1 | B-4 (15) | A-3 (0.24) | W-2 | B | 2.4 | 10.3 | 14.4 | 1.40 | 1.3 |
| 1-29 | RB-20 | B-4 (21) | A-2 (0.20) | W-3 | B | 3.0 | 13.5 | 19.6 | 1.45 | 0.4 |
| 1-30 | RB-20 | B-9 (21) | A-2 (0.20) | W-3 | B | 3.0 | 13.9 | 19.3 | 1.39 | 0.4 |
| 1-31 | RB-20 | B-16 (21) | A-2 (0.20) | W-3 | B | 3.0 | 12.1 | 16.7 | 1.38 | 0.5 |
| 1-32 | RB-20 | B-18 (21) | A-2 (0.20) | W-3 | B | 3.0 | 13.2 | 18.0 | 1.36 | 0.8 |
| 1-33 | RB-20 | B-9 (21) | A-2 (0.20) | W-3 | B | 4.2 | 14.3 | 19.9 | 1.39 | 0.9 |
| 1-34 | RB-20 | B-4 (60) | A-5 (0.20) | W-3 | B | 3.0 | 14.7 | 17.9 | 1.22 | 1.2 |
| 1-35 | RB-20 | B-19 (21) | A-5 (0.20) | W-3 | B | 3.0 | 14.2 | 22.2 | 1.56 | 0.2 |
| 1-36 | RB-20 | B-20 (21) | A-5 (0.20) | W-3 | B | 3.0 | 13.8 | 22.1 | 1.60 | 0.2 |
| 1-37 | RB-20 | B-21 (21) | A-5 (0.20) | W-3 | B | 3.0 | 14.8 | 22.6 | 1.53 | 0.4 |
| 1-38 | RB-3 | B-19 (21) BC-2 (7) | A-5 (0.20) | W-3 | B | 3.0 | 9.8 | 16.2 | 1.65 | 0.3 |
| 1-39 | RB-3 | B-19 (21) BC-3 (7) | A-5 (0.20) | W-3 | B | 3.0 | 10.5 | 16.9 | 1.61 | 0.2 |
| 1-40 | RB-3 | B-19 (21) BC-4 (7) | A-5 (0.20) | W-3 | B | 3.0 | 9.1 | 15.5 | 1.70 | 0.5 |
| Comparative Example | | | | | | | | | | |
| 1-41 | RB-20 | B-4 (9) | A-5 (0.20) | W-3 | B | 3.0 | 21.5 | 24.7 | 1.15 | 2.5 |
| 1-42 | RB-20 | B-4 (21) | A-5 (0.20) | W-3 | B | 5.0 | 13.9 | 14.6 | 1.05 | 3.6 |
| 1-43 | RB-20 | B-4 (21) | A-5 (0.20) | W-3 | B | 0.5 | 14.0 | 13.7 | 0.98 | 2.9 |

As seen from the results in Table 1, according to the present invention, a resist assured of high sensitivity and high EL and excellent in aging stability can be obtained.

The same effects are obtained also in EUV lithography and X-ray lithography.

According to the present invention, for solving the technical problem when microprocessing a semiconductor device by using an electron beam, an X-ray or EUV light, an effective positive resist composition with high sensitivity, wide exposure latitude (EL) and high aging stability and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition for an electron beam, an X-ray or EUV, comprising:
   (A) a resin capable of decomposing by the action of an acid to increase the dissolution rate in an aqueous alkali solution, said resin containing a hydroxystyrene repeating unit;
   (B) a compound capable of generating an acid upon irradiation with an actinic ray or radiation, represented by the following formula (ZI) or (ZII);
   (C) a basic compound; and
   (D) an organic solvent,
   wherein
   a concentration of all solid contents in said composition is from 1.0 to 4.5 mass %, and
   a total amount of the compound represented by formula (ZI) or (ZII) is 12 mass % or more based on all solid contents in said composition:

(ZI)

(ZII)

wherein
each of $R_{201}$, $R_{202}$ and $R_{203}$ independently represents an organic group,
any two members out of $R_{201}$ to $R_{203}$ may combine together to form a ring which may contain an oxygen atom, a sulfur atom, an ester bond, an amide bond, a carbonyl group or a $—SO_2—$ structure,
each of $R_{204}$ and $R_{205}$ independently represents an aryl group, an alkyl group or a cycloalkyl group, and
$Z^-$ represents an anion represented by the following formula (Za) or (Zb):

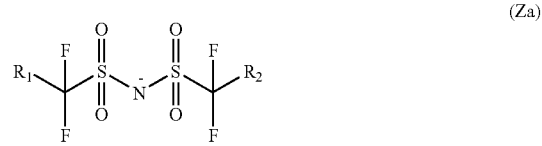

(Za)

-continued

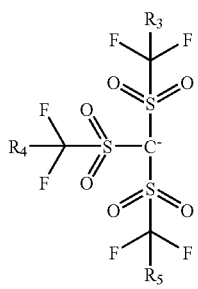
(Zb)

wherein
each of $R_1$ and $R_2$ independently represents a fluorine atom or an alkyl group, and $R_1$ and $R_2$ may combine together to form a ring; and
each of $R_3$ to $R_5$ independently represents a fluorine atom or an alkyl group, and any two members out of $R_3$ to $R_5$ may combine together to form a ring.

2. The positive resist composition for an electron beam, an X-ray or EUV as claimed in claim 1, wherein
the basic compound (C) has a molecular weight of from 200 to 1,000, and
a content of the (C) basic compound is from 0.1 to 0.5 times molar based on a molar number of a total amount of the compound capable of generating an acid upon irradiation with an actinic ray or radiation.

3. The positive resist composition for an electron beam, an X-ray or EUV as claimed in claim 1, wherein
the resin (A) has a weight average molecular weight of from 1,500 to 5,000.

4. The positive resist composition for an electron beam, an X-ray or EUV as claimed in claim 1, wherein
the resin (A) has at least one repeating unit represented by formula (V):

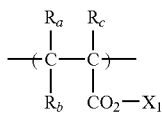
(V)

wherein
each of $R_a$ to $R_c$ independently represents a hydrogen atom, a fluorine atom, a chlorine atom, a cyano group or an alkyl group, and
$X_1$ represents a hydrogen atom or an organic group.

5. A pattern forming method comprising:
forming a resist film with the positive resist composition claimed in claim 1; and
exposing and developing the resist film.

6. The positive resist composition for an electron beam, an X-ray or EUV as claimed in claim 1, wherein
the content of the repeating unit of the resin containing a hydroxystyrene repeating unit is from 40 to 90 mol % based on all repeating units constituting the resin.

7. The positive resist composition for an electron beam, an X-ray or EUV as claimed in claim 1, wherein
the resin is a resin having a repeating unit represented by formula (II) and a repeating unit represented by formula (III);

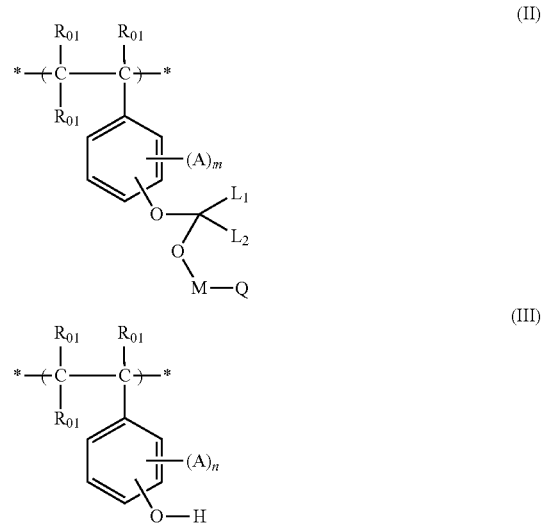

wherein each $R_{01}$ represents a hydrogen atom, an alkyl group, a cycloalkyl group, a halogen atom, a cyano group, or an alkoxycarbonyl group;
each $L_1$ and $L_2$, which may be the same or different, represents a hydrogen atom, an alkyl group, a cycloalkyl group or an aralkyl group;
M represents a single bond or a divalent linking group;
Q represents an alkyl group, a cycloalkyl group, an aryloxy group or an alicyclic or aromatic ring group which may contain a heteroatom;
at least two members of Q, M and $L_1$ may combine to form a 5- or 6-membered ring;
each A independently represents a halogen atom, a cyano group, an acyl group, an alkyl group, an alkoxy group, an acyloxy group or an alkoxycarbonyl group; and
each m and n independently represents an integer of 0 to 4.

* * * * *